(12) United States Patent
Anderson et al.

(10) Patent No.: US 7,720,116 B2
(45) Date of Patent: May 18, 2010

(54) TUNABLE LASER HAVING LIQUID CRYSTAL WAVEGUIDE

(75) Inventors: Michael H. Anderson, Lyons, CO (US); Scott R. Davis, Denver, CO (US); Scott D. Rommel, Lakewood, CO (US)

(73) Assignee: Vescent Photonics, Inc., Denver, CO (US)

( * ) Notice: Subject to any disclaimer, the term of this patent is extended or adjusted under 35 U.S.C. 154(b) by 345 days.

(21) Appl. No.: 11/040,549

(22) Filed: Jan. 21, 2005

(65) Prior Publication Data

US 2005/0265403 A1 Dec. 1, 2005

Related U.S. Application Data

(63) Continuation-in-part of application No. 10/963,946, filed on Oct. 12, 2004.

(60) Provisional application No. 60/539,030, filed on Jan. 22, 2004.

(51) Int. Cl.
    *H01S 3/10* (2006.01)
(52) U.S. Cl. .................................. 372/20
(58) Field of Classification Search ............ 372/20
    See application file for complete search history.

(56) References Cited

U.S. PATENT DOCUMENTS

| | | |
|---|---|---|
| 4,896,325 A | 1/1990 | Coldren |
| 5,301,201 A | 4/1994 | Dutta et al. |
| 5,317,446 A | 5/1994 | Mir et al. |
| 5,319,668 A | 6/1994 | Luecke |
| 5,347,377 A | 9/1994 | Revelli et al. |
| 5,499,256 A | 3/1996 | Bischel et al. |
| 5,504,772 A | 4/1996 | Deacon et al. |
| 5,513,196 A | 4/1996 | Bischel et al. |
| 5,596,671 A * | 1/1997 | Rockwell, III ............... 385/147 |
| 5,766,974 A | 6/1998 | Sardella et al. |
| 5,789,776 A | 8/1998 | Lancaster et al. |
| 5,837,613 A | 11/1998 | Kalnitsky et al. |
| 6,041,071 A * | 3/2000 | Tayebati ..................... 372/64 |
| 6,205,159 B1 | 3/2001 | Sesko et al. |
| 6,215,928 B1 | 4/2001 | Friesem et al. |
| 6,324,204 B1 | 11/2001 | Deacon |
| 6,330,388 B1 | 12/2001 | Bendett et al. |

(Continued)

OTHER PUBLICATIONS

Giallorenzi, et al.; "Light scattering from smectic liquid-crystal waveguides", Journal of Applied Physics, vol. 47, No. 5, May 1976, p. 1820-26.

(Continued)

*Primary Examiner*—Minsun Harvey
*Assistant Examiner*—Delma R Forde
(74) *Attorney, Agent, or Firm*—Brownstein Hyatt Farber Schreck, LLP

(57) ABSTRACT

A tunable laser for providing a laser beam with a selectable wavelength. In one example, the tunable laser includes a gain medium for generating the laser beam; a waveguide for processing the laser beam, the waveguide having liquid crystal material or other electro-optic material disposed therein; an optical path length control element disposed within said waveguide for controlling an effective optical path length of the laser cavity; and a wavelength selective element for controlling the wavelength of the laser beam. The tunable laser may be designed without any moving mechanical parts if desired.

12 Claims, 37 Drawing Sheets

U.S. PATENT DOCUMENTS

| | | | |
|---|---|---|---|
| 6,373,872 B2 * | 4/2002 | Deacon | 372/34 |
| 6,470,036 B1 | 10/2002 | Bailey et al. | |
| 6,480,513 B1 | 11/2002 | Kapany et al. | |
| 6,603,902 B1 | 8/2003 | So | |
| 6,763,047 B2 * | 7/2004 | Daiber et al. | 372/34 |
| 6,816,516 B2 | 11/2004 | Daiber | |
| 6,853,654 B2 | 2/2005 | McDonald et al. | |
| 6,859,567 B2 | 2/2005 | Galstian et al. | |
| 6,859,572 B2 * | 2/2005 | Ishibashi | 385/16 |
| 6,920,159 B2 * | 7/2005 | Sidorin et al. | 372/20 |
| 2001/0033400 A1 * | 10/2001 | Sutherland et al. | 359/15 |
| 2003/0048817 A1 | 3/2003 | Steffens et al. | |
| 2003/0086448 A1 | 5/2003 | Deacon | |
| 2003/0137999 A1 * | 7/2003 | Spiegelberg et al. | 372/6 |
| 2003/0214700 A1 * | 11/2003 | Sidorin et al. | 359/334 |
| 2005/0135439 A1 | 6/2005 | Chapman et al. | |

OTHER PUBLICATIONS

J. P. Sheridan, T. G. Giallorenzi; "Electro-Optically Induced Refraction and Reflection . . . ", Journal of the Optical Society of America, vol. 63, No. 10, (1973), p. 1291.

Desmet, H., et al.; 'Silicon-on-insulator optical waveguides with . . . ', Proceedings of the European Conference on Optical Communication (ECOC) 2003. vol. 3., (2003), p. 430-31.

P. Mormile, L. Petti, G. Righini, and G. Abbate, "A basic element for integrated electro-optical devices based on liquid crystal waveguides" Proc. SPIE 4078, (2000), p. 779-85.

B. Maune, et al., "Electrically tunable ring resonators incorporating nematic liquid crystals as cladding . . . ", Applied Physics Letters, vol. 83, No. 23, (2003), p. 4689-91.

L. Sirleto, et al., "Optical multimode interference router based on a liquid crystal waveguide", Journal of Optics A: Pure and Applied Optics, 5, (2003) p. S298-304.

M. Karpierz, "Nonlinear properties of waveguides with twisted nematic liquid crystal", Acta Physica Polonica A, vol. 99, (2001), p. 161-73.

L. Sirleto, et al., "Electro-optical switch and continuously tunable filter based on a Bragg grating in a planar waveguide with a . . . " Opt. Eng. 41(11), Nov. 2002, 2890-2898.

G. Coppola, L. Sirleto, G. Berglio, "Optoelectronic router in glass waveguide with a liquid crystal cladding", Proc. of SPIE, vol. 4829, (2003), pp. 527-29.

C. Hu, J. Whinnery, N. Amer, "Optical Deflection in Thin-Film Nematic-Liquid-Crystal Waveguides", IEEE Journal of Quantum Electronics, vol. QE-10, No. 2, (1974), p. 218-22.

J. Valera, et al., "Bistability and switching in thin-film waveguides with liquid-crystal cladding", Applied Physics Letters, vol. 48, No. 9, 1986, p. 573-74.

Y. Okamura, et al., :"Low-voltage driving in nematic liquid crystal overlayered waveguide", IEEE Journal of Lightwave Technology, vol. LC-4, No. 3, 1986, p. 360-63.

N. Clark, M. Handschy, "Surface-stabilized ferroelectric liquid-crystal electro-optic waveguide switch", Applied Physics Letters, vol. 57, No. 18, 1990, p. 1852-54.

J. Whinnery, C. Hu, Y. Kwon, "Liquid-Crystal waveguides for integrated optics", IEEE Journal of Quantum Electronics, vol. QE-13, No. 4, 1977, p. 262-67.

C. Hu, J. Whinnery, "Losses of a nematic liquid-crystal optical waveguide", Journal of the Optical Society of America, vol. 64, No. 11, 1974, p. 1424-32.

Joanna L. Casson, et al., "Near-IR tunable laser with an integrated LiTaO3 electro-optic deflector", Applied Optics, vol. 41, No. 30, Oct. 20, 2002, p. 6416-19.

Mono Kobayashi, et al., "2×2 Optical Waveguide Matrix Switch Using Nematic Liquid . . . ", IEEE Journal of Quantum Electronics, vol. QE-18, No. 10, Oct. 1982, p. 1603-10.

Joel M. Schnur, et al., "Prospectus for the Development of Liquid-Crystal Waveguides", Naval Research Lab, Nov. 10, 1972, p. 1-15.

Yasuyuki Okamura, et al., "Low-Voltage Driving in Nematic Liquid Crystal Overlayered Waveguide", Journal of Lightwave Technology, vol. LT-4, No. 3, Mar. 1986, p. 360-63.

T.G. Giallorenzi, et al., "Light scattering from nematic liquid crystal waveguides", Journal of Applied Physics, vol. 46, No. 3, Mar. 1975, p. 1271-82.

Anat Sneh, et al., "High-Speed Continuously Tunable Liquid Crystal Filter for WDM Networks", Journal of Lightwave Technology, vol. 14, No. 6, Jun. 1996, p. 1067-80.

J. P. Sheridan, et al., "Electro-optically, induced deflection in liquid-crystal waveguides", Journal of Applied Physics, vol. 45, No. 12, Dec. 1974, p. 5160-63.

Oh Kee Kwon, et al., "Proposal of Electrically Tunable External-Cavity Laser Diode", IEEE Photonics Technology Letters, vol. 16, No. 8, Aug. 2004, p. 1804-06.

Kevin S. Repasky, et al., "Tunable external-cavity diode laser based on integrated waveguide structures", Optical Engineering, vol. 42, No. 8, Aug. 2003, p. 2229-34.

David Hermann, Integrated Optics with Liquid Crystals, Available at http://fy.chalmers.se/-f9adh/pub/LCIO-Hermann.pdf, Chalmers Univ. of Tech., Goteberg, SE, (2000), p. 1-33.

International Search Report for PCT Application PCT/US05/01758, 2 pages, dated Aug. 31, 2006.

Written Opinion for PCT Application PCT/US05/01758, 3 pages, dated Aug. 31, 2006.

International Search Report for PCT Application PCT/US05/01586, 3 pages, dated Sep. 21, 2006.

Written Opinion for PCT Application PCT/US05/01586, 3 pages, dated Sep. 21, 2006.

* cited by examiner

TUNABLE LASER HAVING LIQUID CRYSTAL WAVEGUIDE

CROSS-REFERENCE TO RELATED APPLICATIONS

This application claims priority under 35 U.S.C. 119(e) to U.S. Provisional patent application No. 60/539,030 entitled "LIQUID CRYSTAL WAVEGUIDE HAVING REFRACTIVE SHAPES FOR DYNAMICALLY CONTROLLING LIGHT AND TUNABLE LASER INCLUDING SAME" filed Jan. 22, 2004 and is a continuation-in-part of U.S. patent application Ser. No. 10/963,946 entitled "LIQUID CRYSTAL WAVEGUIDE HAVING REFRACTIVE SHAPES FOR DYNAMICALLY CONTROLLING LIGHT" filed Oct. 12, 2004, the disclosures of which are hereby incorporated by reference in its entirety.

GOVERNMENT RIGHTS

This invention was made with Government support under grant No. 0319386 awarded by the National Science Foundation and under contract No. 68-D-03-010 awarded by the Environmental Protection Agency. The Government may have certain rights in the invention.

FIELD OF THE INVENTION

This invention relates, in general, to tunable lasers, and more particularly, to tunable lasers having electro-optic elements therein.

BACKGROUND OF THE INVENTION

Tunable lasers are lasers in which the frequency or color of the lasing light can be controllably altered. Tunable lasers have utility in a number of diverse applications, including but not limited to telecommunications, open air remote sensing for environmental monitors, distributed fiber sensors, holographic data storage, spectroscopy, atomic frequency and time standards, optical coherence tomography for medical imaging, laser cooling, lidar, and many more. As a specific example, the ability to control the wavelength of the laser light has enabled wavelength division multiplexing in telecommunications, thereby increasing the bandwidth of optical fibers. As a second specific example, common embodiments of distributed fiber sensors require a tunable laser interrogator, through which temperature, pressure, chemical analysis, or other measurable quantities can be probed in diverse environments such as along power lines, embedded inside oil wells, along bridges and tunnels, and many more. In a third example, tunable laser light can be passed through suspect regions of air and then the intensity measured. Wavelength specific absorption features can signify the presence of certain chemicals, contaminants, or other pollutants. As another specific example, in the emerging market of holographic data storage, tunable lasers can be utilized to compensate for temperature changes in the storage medium.

There are various types of conventional tunable lasers. Prominent examples include distributed Bragg reflector (DBR) lasers, distributed feedback (DFB) lasers, and external cavity diode lasers (ECDL). Multi-section DBR lasers can provide significant wavelength tuning (up to 100 nm), but not in a continuous fashion. Specifically, after the DFB laser tunes a small amount, the frequency may jump (mode-hop) in an often-uncontrollable way. DBR lasers can typically only change the laser wavelength a small amount (a few nanometers). Furthermore, both DBR and DFB lasers are difficult to construct at arbitrary wavelengths. Conventional external cavity diode lasers provide wavelength versatility and large continuous mode-hop free tuning ranges.

Conventional external cavity diode lasers, however, typically utilize various moving mechanical parts for electromechanically tuning the laser. For instance, a conventional tunable laser includes a cavity whose length may be mechanically adjusted so that the phase of the laser output signal can be electromechanically controlled for particular applications. Furthermore, intricate mechanical systems have been devised for controlling the frequency of the laser output. For instance, some conventional mechanically tunable lasers include a reflection grating which, depending upon the angle at which light strikes the grating, retro-reflects back only certain frequencies of light. In order to provide for large, continuous mode-hop free tuning, both the phase (total optical path length) and the frequency of the laser must be tuned in a synchronous and often complex mechanical fashion.

Conventionally, a frequency selective grating may be connected to one end of a pivot arm, which at its opposing end is fixed to a pivot point. The pivot arm and grating are then mechanically rotated in a highly precise and often complex manner so that only certain desired frequencies of light are reflected within the mechanically tunable laser cavity as desired. Furthermore, by appropriate choice of the pivot point, rotation of the grating about that pivot point results in the desired synchronous tuning of both the frequency and total optical path length of the laser. This can provide extended mode-hop free tuning. One such example of a mechanically tunable laser is described in U.S. Pat. No. 5,319,668 incorporated herein by reference.

These mechanical laser designs can utilize a wide array of laser diodes as the gain medium, thereby providing wavelength versatility. Furthermore, within the laser diodes gain profile, the mechanical external cavity diode laser can provide extended continuous tunability.

However, as recognized by the present inventors, mechanically tunable lasers have various limitations. First, it is difficult to make such mechanical devices compact. Second, such devices have limited lifetimes due to mechanical wear and failure issues. Third, mechanical devices are inherently vibration sensitive, which limits the type of environment in which they can be used. Finally, mechanical devices necessitate a level of design complexity including gears, bearings, and other mechanical components, which add to the cost, expense, and maintenance of such designs.

Accordingly, as recognized by the present inventors, what is needed is a tunable laser, with the desirable attributes of mechanically tuned external cavity lasers, which may be implemented without the need for any mechanically movable parts.

It is against this background that various embodiments of the present invention were developed.

SUMMARY

In light of the above and in according to one broad aspect of an embodiment of the present invention, disclosed herein is a tunable laser for providing a laser beam characterized by a selectable wavelength. In one example, the tunable laser defines a laser cavity and the tunable laser may include a gain medium for generating the laser beam, a waveguide for processing the laser beam, the waveguide having liquid crystal material disposed therein, an optical path length control element disposed within said waveguide for controlling an effective optical path length of the laser cavity, and a wavelength selective element for controlling the wavelength of the laser beam. The gain medium may be a laser diode or any conventional or other gain medium. Coupling optics may be positioned between the gain medium and the waveguide.

In one example, the waveguide may also include a core for guiding the laser beam through the waveguide and a cladding having a liquid crystal material therein. In one embodiment, as the laser light travels through the core, the liquid crystal material interacts with the evanescent portion of the light to control the delay of the light (thereby altering the effective optical path length of the cavity of the laser) as well as to control the wavelength of the light. Hence, a tunable laser can be formed using electro-optic controls with no mechanical parts.

In one example, the core may include a silicon oxynitride material or any number of conventional or other materials, and the liquid crystal material may be a nemetic material or, more generally, any conventional or other electro-optic material.

In one example, the optical path length control element includes an electrode for receiving a first voltage for controlling the effective optical path length of the laser cavity. The electrode may have a generally rectangular portion and may be positioned adjacent the cladding in the waveguide and when the first voltage is applied to the electrode, the electrode induces an electric field on the liquid crystal material proximate the electrode to alter the effective optical path length of the laser cavity. In one example, the electrode may be formed using ITO material or a conductive layer.

In one embodiment, the wavelength selective element includes an electrode disposed within said waveguide for receiving a second voltage for controlling the wavelength of the laser beam. The electrode of the wavelength selective element may have a generally triangular portion, or in another example may have a plurality of refractive shapes. The electrode may be positioned adjacent the cladding in the waveguide and when the second voltage is applied to the electrode, the electrode induces an electric field on the liquid crystal material proximate the electrode to steer the laser beam within the laser cavity. By steering the laser beam within the cavity, the laser beam or spectral portions thereof can be steered to impinge upon a diffraction grating or a reflector (depending upon the implementation) so that only certain wavelengths of the laser light are active within the tunable laser.

In place of electrodes for controlling the optical path length or wavelength, other embodiments are disclosed herein including the use of patterned alignment of liquid crystal material, the use of cavities having liquid crystal material therein, or other alternatives.

In one embodiment, the waveguide has a front and rear facet and the tunable laser may also include a diffraction grating coupled with a rear facet of the waveguide. In this embodiment, the wavelength selective element controls an angle at which the laser beam strikes the diffraction grating.

In another embodiment, the waveguide has a front facet, a top facet, and a bottom facet, and the tunable laser may also include a diffraction grating coupled with the bottom facet of the waveguide and a reflector coupled with the top facet of the waveguide. In this embodiment, the wavelength selective element controls an angle at which the laser beam strikes the reflector and reflects back into the diffraction grating coupled with the bottom facet.

In another embodiment, the waveguide may include a core for guiding the laser beam through the waveguide, a cladding having a liquid crystal material therein, and a Bragg grating for providing wavelength selection. The Bragg grating may be embedded along a portion of the core or may be embedded along a portion of the cladding. An electrode may be disposed in said waveguide for receiving a voltage for controlling the wavelength of the laser beam. For example, the electrode may be positioned adjacent the Bragg grating in the waveguide, and when the second voltage is applied to the electrode, the electrode induces an electric field on the liquid crystal material of the Bragg grating to selectively reflect wavelengths of the laser beam.

In another embodiment, the core of the waveguide may include a channel. The tunable laser may also include a prism coupled with a surface of the waveguide proximate an out-coupling grating and a reflector coupled with the prism.

In another example, the optical path length control element includes an electrode for receiving a first voltage for controlling the effective optical path length of the laser cavity, and the wavelength selective element includes an electrode for receiving a second voltage for controlling the wavelength of the laser beam. The first and second voltages may be adjusted synchronously in order to provide mode-hop free tuning of the tunable laser.

In another example, the optical path length control element and the wavelength selective element are implemented in a single electrode for receiving a voltage for simultaneously controlling the effective optical path length of the laser cavity and the wavelength of the laser beam.

According to another broad aspect of another embodiment of the present invention, disclosed herein is a tunable laser having a laser cavity, the tunable laser including a gain medium for generating light and a waveguide for processing the light within the laser cavity, the waveguide having liquid crystal material disposed therein. In one embodiment, the waveguide may also include a core for guiding the light through the waveguide and at least one cladding having a liquid crystal material therein. The waveguide may also include an optical path length control element for controlling an effective optical path length of the laser cavity, and a wavelength selective element for controlling the wavelength of the light.

According to another broad aspect of another embodiment of the present invention, disclosed herein is a tunable laser including a gain medium for generating a laser beam, and a waveguide for processing the laser beam, the waveguide having liquid crystal material disposed therein and at least one electrode having a portion with a generally triangular shape for controlling the direction of the laser beam within the waveguide. In one example, the waveguide may include a core for guiding the laser beam through the waveguide and at least one cladding having a liquid crystal material therein. The waveguide may also include an optical path length control element for controlling an effective optical path length of the tunable laser.

According to another broad aspect of another embodiment of the present invention, disclosed herein is a tunable laser having a laser cavity. In one example, the tunable laser includes a gain medium for generating a laser beam; a waveguide for processing the laser beam, the waveguide having electro-optic material disposed therein; and an optical path length control element disposed in said waveguide for controlling an effective optical path length of the laser cavity. The tunable laser may also include a wavelength selective element for controlling the wavelength of the laser beam.

According to another broad aspect of another embodiment of the present invention, disclosed herein is a tunable laser for providing a laser beam characterized by a wavelength, the tunable laser defining a laser cavity. In one example, the tunable laser includes a gain medium for generating the laser beam; a waveguide for processing the laser beam, the waveguide having liquid crystal material disposed therein; an optical path length control element disposed within said waveguide for controlling an effective optical path length of the laser cavity, the optical path length control element including at least a first electrode for receiving a first voltage; and a wavelength selective element for controlling the wavelength of the laser beam, the wavelength selective element including at least a second electrode for receiving a second voltage.

According to another embodiment, a tunable laser includes an optical path length control element disposed in a waveguide for controlling an effective optical path length of the laser cavity, and a conventional mechanical wavelength selective element. In another example, a tunable laser includes a wavelength selective element disposed in a waveguide, and a conventional mechanical optical path length control.

According to another broad aspect of another embodiment of the present invention, disclosed herein is a method for controlling the wavelength of a laser beam of a laser. In one example, the method may include providing a waveguide for processing the laser beam, the waveguide having electro-optic material disposed therein, the waveguide having a wavelength selective element disposed within said waveguide for controlling the wavelength of the laser beam and an optical path length control element for controlling an effective optical path length of the laser; applying a first control voltage to the wavelength selective element to control the wavelength of the laser beam; and applying a second control voltage to the optical path length control element to control the effective optical path length of the laser. The operation of applying the first control voltage occurs substantially synchronously with the operation of applying the second control voltage in order to provide mode hop free tuning of the laser beam.

Other features, utilities and advantages of the various embodiments of the invention will be apparent from the following more particular description of embodiments of the invention as illustrated in the accompanying drawings.

DETAILED DESCRIPTION

Disclosed herein are various embodiments of tunable lasers which can be electronically controlled and implemented without any mechanically moving parts. Generally, a tunable laser according to embodiments of the present invention may include a liquid crystal waveguide within the laser cavity (or a liquid crystal waveguide that functions as the laser cavity) with elements to control the optical path length of the cavity and may include elements to control or select the wavelength or frequency of the output laser beam. Through the use of a waveguide having liquid crystal or other electro-optic material disposed therein, an electrically tunable laser with no moving parts may be implemented. Various embodiments of the present invention are described herein.

Figure 1:
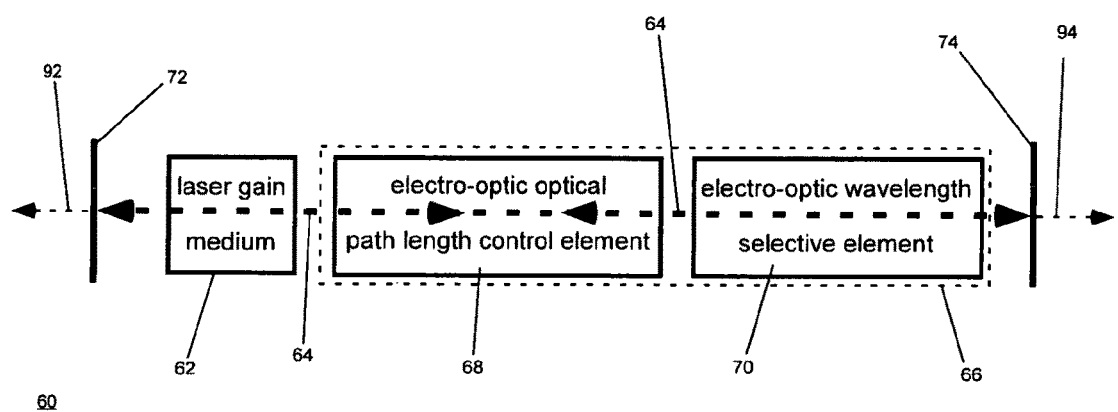
FIG. 1 illustrates a block diagram of a tunable laser, in accordance with an embodiment of the present invention.
Figure 2:
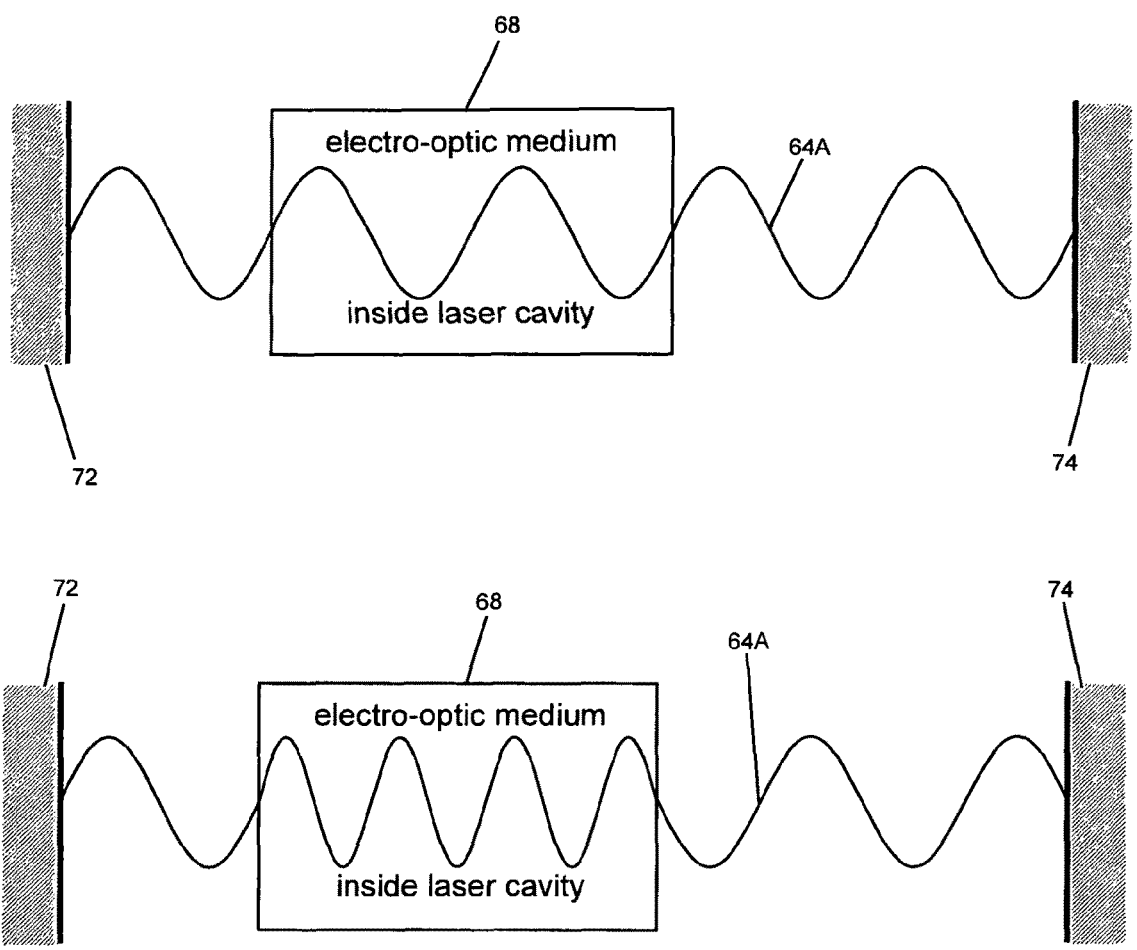
FIGS. 2A-B illustrate an example of the effect of a phase control electrode on light traveling in a waveguide within a tunable laser, in accordance with an embodiment of the present invention.

Referring to the example of FIG. 1, the basic elements of a tunable laser 60 are illustrated schematically, in accordance with an embodiment of the present invention. In one example, the tunable laser 60 may include a gain medium 62 for generating the laser beam 64, a waveguide 66 for processing the laser beam 64, the waveguide 66 having liquid crystal or other electro-optic material disposed therein, an optical path length control element 68 disposed within said waveguide 66 for controlling an effective optical path length of the laser cavity, and a wavelength selective element 70 for controlling the wavelength of the laser beam. In FIG. 1, the laser cavity may be defined between a first end 72 and a second end 74.

Figure 3:
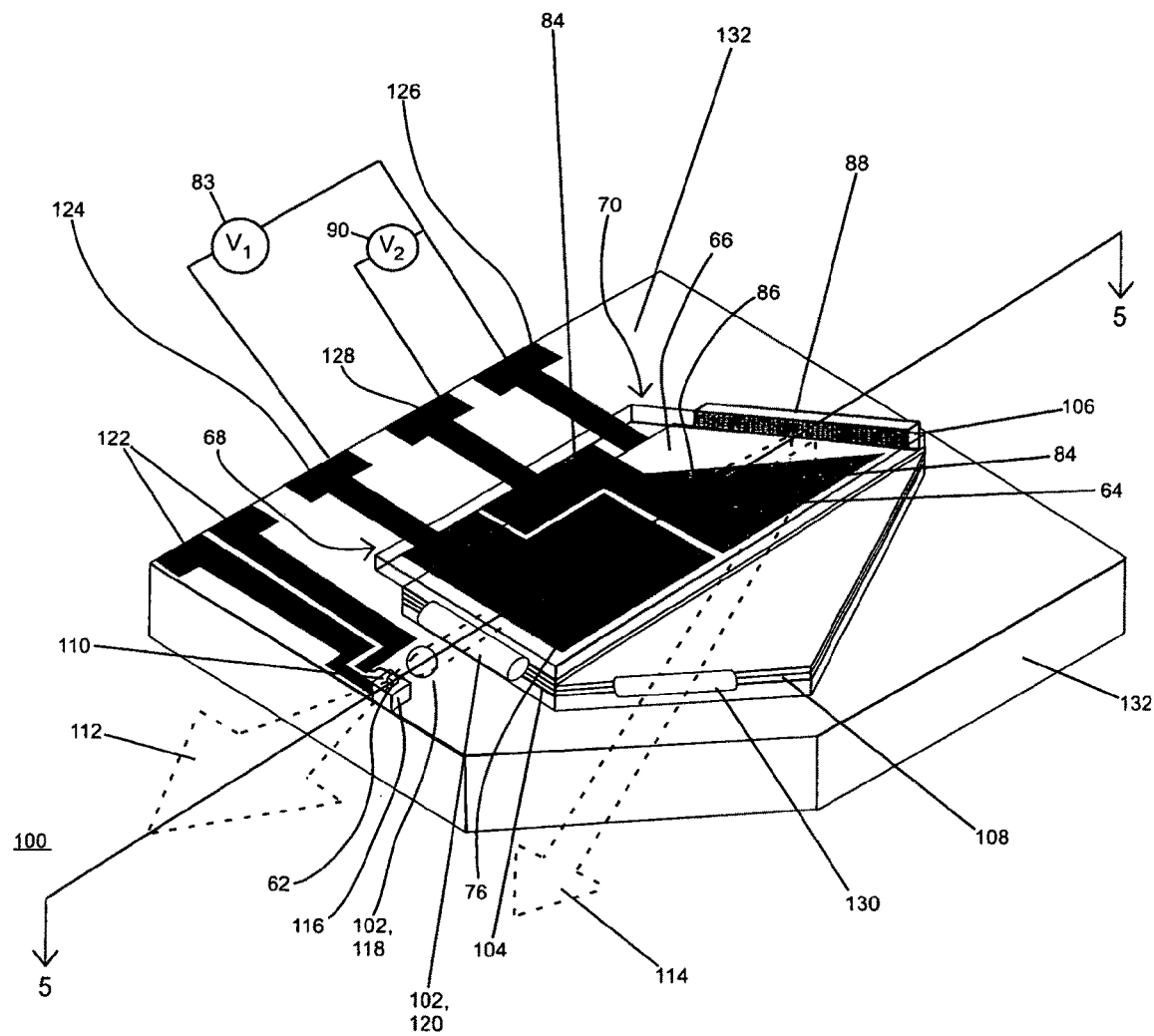
FIG. 3 illustrates an example of a tunable laser, in accordance with one embodiment of the present invention.
Figure 4:
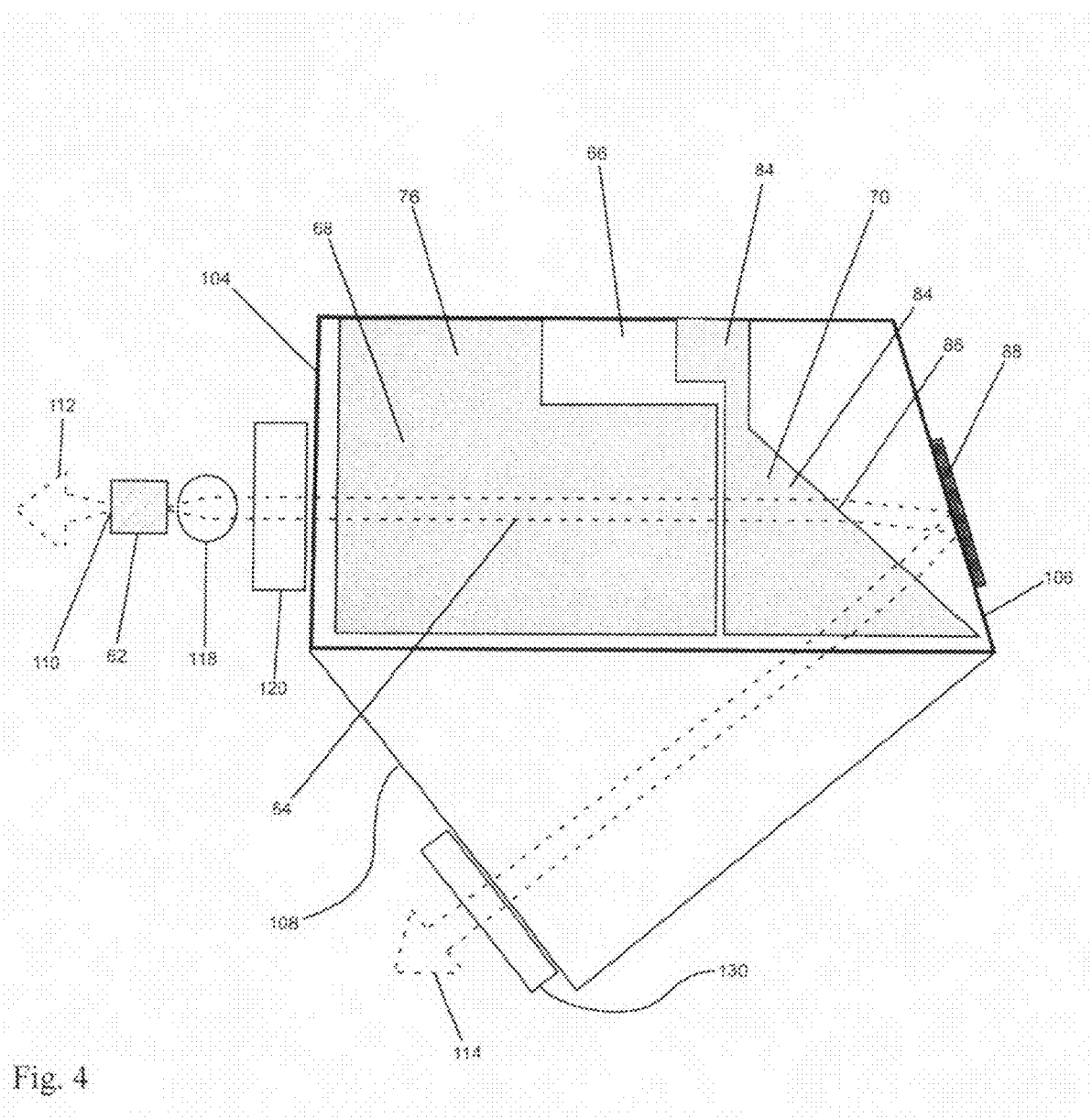
FIG. 4 illustrates a top view of the tunable laser of FIG. 3, in accordance with one embodiment of the present invention.
Figure 5:
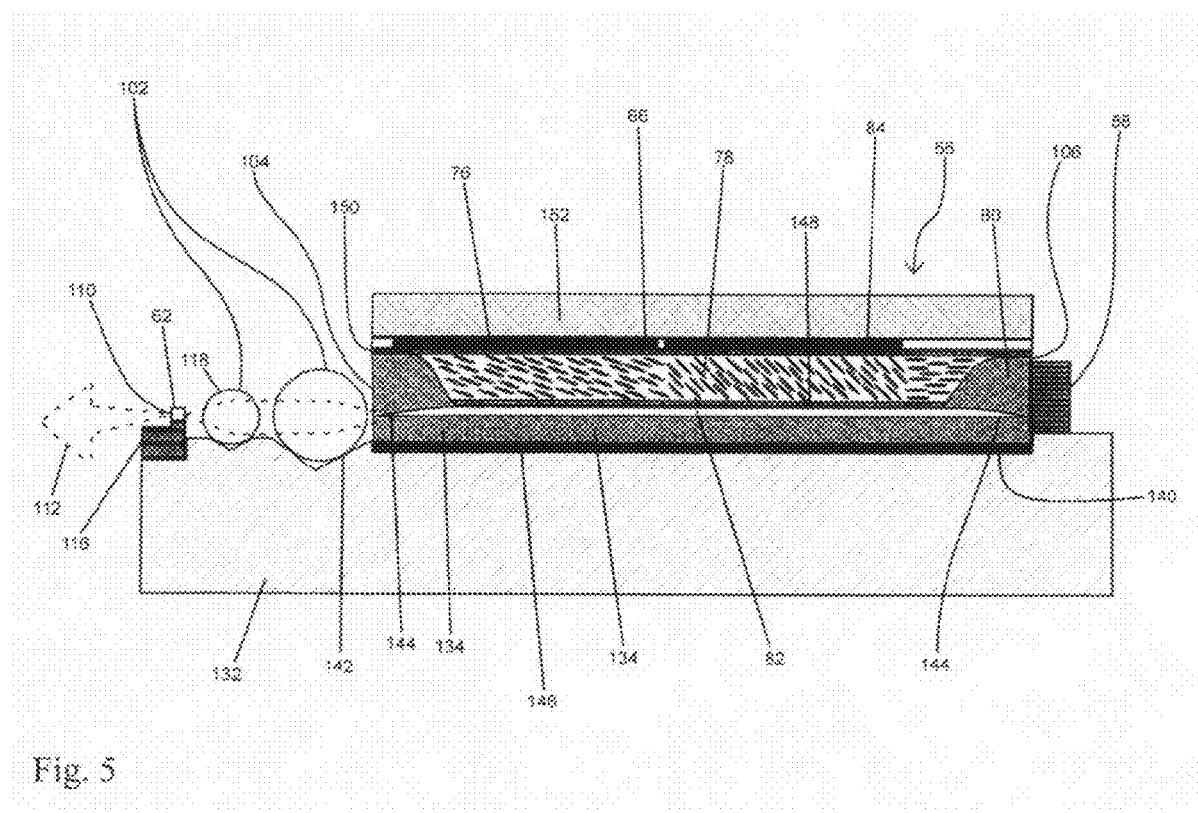
FIG. 5 illustrates a sectional view of the tunable laser of FIG. 3 taken along section line 5-5, in accordance with one embodiment of the present invention.

In the example of FIG. 1, an optical path length control element 68 provides a change in the index of refraction of the optical path of a laser beam 64 based upon an applied electrical signal such as a voltage or a current. For instance and as shown in FIGS. 3-5, a liquid crystal waveguide 66 including a rectangular or planar electrode 76 with liquid crystal material 78 in a cladding 80 adjacent the core 82 of the waveguide 66 may be provided, such that when different voltages 83 (shown as V1) are applied to the electrode 76, an electric field is created which changes the orientation of the liquid crystal material 78 in the waveguide 66 and thereby controllably alters the index of refraction that a laser beam 64 experiences as it travels through the liquid crystal waveguide 66. By changing the index of refraction, the optical path length control element 68, 76 can controllably increase or decrease the optical path delay (OPD), which can increase or decrease the effective optical path length of the laser cavity. In other words, by increasing the optical path delay that laser light 64 experiences when transmitted through the waveguide 66, the effective path length of the laser cavity is effectively increased or decreased in an electro-optic manner, without any moving parts. Various examples of optical path length control elements are described herein.

In FIG. 1, optical path length control elements 68 may be implemented using electrodes (FIGS. 3-15, 17-35), inverted electrode planes (FIG. 36), patterned alignment techniques (FIGS. 37-42), or shaped cavities (FIGS. 43-48). Generally, the optical path length control elements 68 include a generally rectangularly-shaped portion or a portion of other shapes including for example but not limited to, squares, parallelograms, rhombuses, or other polygons. For simplicity, the description of the embodiments of FIGS. 1-16 will assume that the optical path length control elements 68 are implemented using electrodes, but it is understood that the optical path length control elements 68 could be implemented using inverted electrode planes, patterned alignment techniques, or shaped cavities if desired.

A tunable laser 60 may also include a wavelength selective element 70 for controlling the laser wavelength within a laser cavity. In one embodiment (FIGS. 3-5), an electro-optic wavelength selective element 70 includes in the waveguide a beam steering element such as an electrode 84 with a non-normal interface 86 to steer the laser light against a grating 88 or a reflector that is attached to a facet or edge of the waveguide 66. As different voltages 90 (shown as V2) are applied to the electrode 84 of the liquid crystal waveguide, the light within the waveguide is steered to strike the surface of the grating 88 or reflector at specific angles, such that a particular wavelength of diffracted light coming off the grating 88 may be directed back onto the light's original path. One may choose this to be the first order diffracted light.

For example, if a grating 88 is provided with various grooves that can retro-reflect or diffract different wavelengths of light depending upon the angle at which light 64 strikes the grating 88, then the electro-optic wavelength selective element 70, 84 can be used to steer the light to strike the grating 88 at various angles to achieve reflection or diffraction of particular desired wavelengths of light. Hence, embodiments of the present invention may include wavelength selective elements that can be controlled electronically without any moving mechanical parts.

Alternatively or in combination, a wavelength selective element 70 may include a Bragg grating or reflector embedded in the core or cladding of a waveguide (FIGS. 9-14). As voltages are applied across the liquid crystal material, the index of refraction of the light propagating through the Bragg region can be controllably altered. This will alter the effective pitch of the Bragg reflector, and therefore alter the wavelength of light that is reflected.

Various examples of wavelength selective elements 70 are described herein. Wavelength selective elements 70 may be implemented using electrodes (FIGS. 3-15, 17-35), inverted electrode planes (FIG. 36), patterned alignment techniques (FIGS. 37-42), shaped cavities (FIGS. 43-48). Generally, the wavelength selective elements 70 include a generally triangularly-shaped portion or a portion that has other refractive shapes including for example but not limited to, wedges, triangles, or other polygons. For simplicity, the description of the embodiments of FIGS. 1-8 will assume that the wavelength selective elements are implemented using electrodes, but it is understood that the wavelength selective elements 70 could be implemented using inverted electrode planes, patterned alignment techniques, or shaped cavities if desired. Wavelength selective elements 70 may also include Bragg gratings as shown in FIGS. 9-14.

Waveguides are described herein as having liquid crystal material 78 therein. The liquid crystal material 78 may include, but is not limited to, any electro-optic material or liquid crystal material such as nematic liquid crystal, with either a positive dielectric constant or a negative dielectric constant or a mixture of each, polymer dispersed liquid crystal material, Smectic A* and C* liquid crystal material, cholesteric liquid crystal material such as ferroelectrics and surface stabilized ferroelectrics, or dual-frequency liquid crystal material, for example. While the various figures herein show the liquid crystal material 78 as being nematic liquid crystal, it is understood that embodiments of the present invention may utilize other types of liquid crystal or electro-optic material.

In FIG. 1, a tunable laser 60 includes a laser cavity defined by or between two reflecting surfaces 72, 74. Light 64 that is within the laser cavity may bounce back and forth multiple times prior to exiting the cavity. These reflective surfaces 72, 74 can be mirrors, interference coatings applied to elements within the laser cavity (such as a reflective coating applied to a surface of the gain medium or a surface of the wavelength selective element), reflections from a diffraction grating, or other reflective elements.

In one example, a tunable laser 60 includes a gain medium 62, such as a laser diode, that provides a coherent beam of light along an optical path. This gain medium 62 contains a substance that i) emits the initial light and ii) contains a population inversion mechanism such that as photons pass through the medium 62 they are likely to entice additional photons to be coherently emitted, which thereby creates the optical gain. Some examples of typical gain media 62 include semiconductor materials such as laser diodes, galium nitride, or other materials such as quantum dots, optically pumped organic dyes, solid state crystals that have been doped with a fluorophore, excited gases, etc. The gain medium 62 emits light 64, and provides optical gain, over a spectral region known as the gain profile or gain curve. The laser 60 may typically operate at a variety of wavelengths within the gain profile.

In operation, light 64 from the gain medium 62 strikes a tuning grating 88 (FIGS. 3-5) having various grooves therein, and light diffracted from the tuning grating 88 re-enters the laser cavity and eventually returns to the gain medium 62. As the light 64 within the laser cavity undergoes round trips within the cavity, the light passes through the laser gain medium 62.

The specific wavelength at which the laser 60 operates within the gain profile is determined by i) the total optical length of the cavity and ii) the properties of the wavelength selective element 70. In order for optical gain to occur, the length of the laser cavity must contain an integer number of half optical waves. This condition may be satisfied for multiple discrete wavelengths across the gain profile. In one example, the wavelength selective element 70 is utilized to select only one wavelength at which the laser will operate. In order to continuously tune the wavelength of a single longitudinal mode of the laser, both the wavelength selective element 70 and the optical path length of the cavity are synchronously tuned. As discussed above, in conventional mechanical external cavity diode lasers, this is achieved by synchronously i) mechanically increasing or decreasing the total length of the cavity (which controls the optical length, or optical phase delay (OPD)), and ii) mechanically rotating a diffraction grating or rotating a mirror next to a diffraction grating (which controls the wavelength selection). In order to circumvent the need for mechanical motion, these two tasks can be accomplished with electro-optic elements, as recognized by the present inventors. Rather than physically change the size of the laser cavity, an electro-optic element 68 can be utilized to alter the index of refraction of portions of the waveguide and therefore change the total optical path length. Likewise, wavelength selection can be achieved in an electro-optic manner by wavelength control element 70, whereby a voltage or current determines which wavelengths are permitted to circulate within the laser cavity. Hence, continuous tuning of the output laser color/wavelength can be achieved by the adjustment of control voltages applied to the optical path length control element 68 and to the wavelength selective element 70.

The laser output 92, 94 can be taken through either one of the reflective surfaces 72, 74, as in the case of a partially reflective coating, or other means by which light can exit the cavity, such as a higher or lower order diffracted beam that is reflected or diffracted from a grating.

FIGS. 2A-2B illustrate an example where an optical path length control element 68 is placed within a laser cavity for controlling the optical path length of the laser cavity, in accordance with one embodiment of the present invention. A condition for lasing is that the laser cavity should contain an integer number of half wavelengths. For a tunable laser, as the color or frequency of the output light is changed, the wavelength is also changed so the cavity length will in general no longer contain an integer number of half wavelengths. As previously stated, in order to maintain the lasing condition, the optical length of the cavity can be altered in a manner synchronous with the laser output tuning.

As shown in the example of FIGS. 2A-2B, this may be accomplished in a non-mechanical fashion with an optical path length control element 68. As a voltage is applied to the optical path length control element 68 that includes liquid crystal material, the index of refraction for light 64 traveling through the waveguide is altered. In FIGS. 2A-2B, light is represented as a wave 64A. In FIG. 2A, wave 64A has five full wavelengths within the cavity due to optical path length control element 68.

Since the wavelength of light within a medium is dependent on the index of refraction, the number of optical waves within the laser cavity may be controllably altered. For example, in FIG. 2A, a low voltage condition is illustrated where the resulting index of refraction is at a low value, and hence the optical path delay created by the optical path length control element 68 is minimal. Alternatively in FIG. 2B, a high voltage condition is illustrated where the index of refraction is at a higher value, and hence the optical path delay created by the optical path length control element 68 is significant. A significant optical path delay (OPD) serves to increase the effective optical path length of the laser cavity. This technique can serve as a replacement for mechanically altering the length of the laser cavity. For extended laser frequency tuning, the optical length of the cavity may be changed by an amount of several hundred optical waves which may be achieved using liquid crystal waveguides as described herein.

Referring to FIGS. 3-5, a tunable laser 100 is illustrated in the form of an external cavity diode laser in accordance with one embodiment of the present invention. This example is generally configured in a Littrow-type configuration. In this example, the tunable laser 100 includes a gain medium 62 (diode laser), coupling optics 102, a waveguide 66 having liquid crystal material 78 therein, and a diffraction grating 88. The waveguide includes an optical path length control element 68 including a first electrode 76, and a wavelength selective element 70 including a second electrode 84. The waveguide has a front facet 104, a rear facet 106, and an exit facet 108. The front, rear, and exit facets of the waveguide may be polished surfaces so as to reduce optical losses. In the example of FIGS. 3-5, the boundaries of the laser cavity are defined on a first end by the exterior facet 110 of the laser diode 62, and on a second end by the surface of the diffraction grating 88 on the rear facet 106 of the waveguide. A laser output 112 can be taken at the exterior facet 110 of the diode laser 62 or a laser output 114 can be taken at the exit facet 108.

A diode laser 62 on a standard mount such as a C-mount 116 provides the gain medium for the laser. The exterior facet 110 of the laser diode 62 may include a reflective coating thereon which, in one example, defines a boundary of the cavity of the laser. The opposing, interior facet of the diode laser may be coated with an anti-reflective coating. Alternatively, or in combination, an angle faceted diode laser may be utilized. It is understood that any conventional diode laser and mount can be utilized as the laser gain medium in various embodiments of the invention.

Light 64 emitted from the diode laser is coupled into the liquid crystal waveguide 66 using optical coupling techniques. The coupling optics 102 are selected so as to provide a beam width within the waveguide sufficient to adequately fill the diffraction grating 88. In one example, optical coupling elements 102 include a ball lens 118 for collimating the light from the diode 62, in series with a cylindrical lens 120, which receives the collimated light and focuses the light into the waveguide 66 for processing therein. In place of or in combination with the ball lens 118 and cylindrical lens 120, many conventional light coupling techniques or elements can be utilized to couple the light from the diode laser into the waveguide, including but not limited to the use of butt-coupling techniques, integrated optical lenses, a combination of cylindrical microlenses and ball lenses, or other conventional techniques. The coupling optics 102 and the front facet 104 of the waveguide may be coated with antireflective coating so as to minimize unwanted optical feedback.

An optical path length control element 68, shown including a first electrode 76, may be provided for effectively altering the cavity length of the laser cavity, shown in FIG. 3 as a rectangular or square or planar electrode 76. As described above, this electrode 76 can alter the optical path delay of light that travels through the portion of the liquid crystal waveguide 66 proximate this electrode 76. As voltage V1 (83) is applied to this electrode 76, liquid crystal material 78 in a cladding 80 adjacent this electrode 76 has its orientation changed so as to alter the effective index of refraction that the laser light experiences as it travels through the core 82 of the liquid crystal waveguide 66.

A wavelength selective element 70, shown as including a second electrode 84, may be provided to steer or direct the laser light within the waveguide 66 so that the light strikes the surface of the grating 88 at particular desired angles so that the grating 88 reflects or diffracts certain desired frequencies back into the laser cavity. In this way, the second electrode 84 provides electrical control of the selection of the wavelength of the laser light of the tunable laser.

The optical path length control element 68 can be implemented with one, two or more rectangularly shaped electrodes in series. For the two-electrode example, a small surface area electrode provides a fine or precise amount of OPD control, while a second electrode of a larger surface area provides a coarse or approximate, albeit larger, amount of OPD control.

Likewise, the second wavelength selective electrode 84 can be implemented as two or more electrodes, wherein one electrode may provide a coarse or approximate amount of beam steering and the other electrode can provide a finer or more precise control of the beam steering amount.

The second electrode 84 for wavelength selection may include multiple triangular, prism or wedge shapes (see FIGS. 32-34) in series to provide a greater amount of steering so that the laser beam within the cavity of the laser can be directed to strike the reflective grating over a larger range of angles than the example of FIG. 3.

In overall operation, in one example the laser 100 is operated by applying a desired current through the diode laser 62 via the electrical contacts 122 in order to generate the laser light 64. In order to control the optical path length electrode 76, a desired electrical signal 83 (i.e., voltage signal V1) is applied to the contact 124 for this electrode 76 with respect to the contact 126 for the electrical ground. A second signal 90, shown as V2, can be applied to the wavelength/frequency selective electrode 84 via contact 128 with respect to ground 126.

The diode laser 62 emits light with a broad spectral profile or spectral component as defined by a gain curve or gain profile of the diode laser. This light is focused by coupling optics 102 into the waveguide core 82 (FIG. 3) for processing within the waveguide. The light passes through the optical path length control section and the wavelength/frequency selective section of the waveguide core 82 and impinges upon the diffraction grating 88.

Upon passing the wavelength/frequency selective portion of the waveguide, the light exits the rear facet 106 of the waveguide and impinges upon the surface of the diffraction grating 88. This light is diffracted by the grating 88 and recouples back into the waveguide. The angle of propagation of the diffracted light is dependent upon, among other things, the pitch of the diffraction grating 88, the frequency of the light 64, and the angle at which the light 64 impinges upon the diffraction grating 88. The steering electrode 84 controls which spectral components of the light diffracted from the grating 88 are directed at such an angle so as to recouple into the laser diode 62 through the coupling optics 102. In this manner, for this selected spectral component, the exterior diode facet 110 and the surface of the diffraction grating 88 define the laser cavity in which this light may resonate therebetween. As the voltage 90 applied to the beam steering electrode 84 is changed, the spectral component of the light which is directed off of the grating 88 and back into the laser diode 62 is also selectively controlled. The spectral components of light which are not diffracted back into the diode laser 62 undergo large optical losses and therefore do not contribute to the optical lasing. Hence, the beam steering electrode 84 functions as a frequency selective control, thereby eliminating the need for conventional mechanical tilting or rotation of a diffraction grating 88 as in the prior art.

Stated differently, after transmission of the laser light through the waveguide portion adjacent the prism shaped electrodes 84, the light impacts onto a grating 88. Some fraction of the total light will be reflected back along the original beam path. The wavelength of the light which is reflected or diffracted back (i.e., all the way back into the laser diode 62) is dependent on the angle at which the light impacts the grating. Therefore, by changing the voltages 90 to the prism shaped electrode 84, the user can change and select the wavelength at which the laser 100 operates.

In order to satisfy the lasing condition, an integral number of half wavelengths should be propagating within the boundaries of the laser cavity. In order to alter the color/frequency/wavelength of the light emitted by the tunable laser 100, as the voltage 90 applied to the beam steering electrode 84 is changed to alter the frequency of the laser, the effective optical path length of the laser cavity should also be simultaneously altered so as to maintain the lasing condition that an integral number of half wavelengths are contained in the laser cavity.

By changing the voltages 83, 90 applied to the first and second electrodes 76, 84 in a synchronous manner, the frequency and wavelength of the laser output 112, 114 may be tuned or altered in a continuous, mode hop free manner. If discrete, non-continuous tuning is desired, then the voltage 83 to the first electrode 76 can be held constant while the voltage 90 to the beam steering electrode 84 is varied. In this case, the frequency or wavelength of the laser output 112, 114 will jump by an amount dictated by the free spectral range of the laser cavity.

The reflective coating on the exterior diode facet 110, which defines one boundary of the laser cavity, can be constructed using coatings that permit transmission of portions of light within the laser cavity to pass through the coating and thereby exit the laser cavity to form the laser output 112. Due to large optical gain of the diode laser 62, a wide range of reflective coatings may be used.

In one example, the laser 100 of FIGS. 3-5 includes a first laser output 112 through the exterior diode facet 110 of the laser diode 62. The laser diode mount may be altered to limit clipping of the laser beam as it exits the exterior diode facet. A second or alternate laser output 114 can be taken from an exit facet 108 of the waveguide which includes light of the zero order or reflection from the diffraction grating 88. Some of the light is reflected or diffracted off the grating 88 and back into the laser diode 62. However, not all of the light is reflected or diffracted back into the laser diode 62. Some of the light undergoes a reflection or diffraction which results in light leaving the waveguide at the exit facet 108, which can be used as the laser output 114 if desired.

In one example, the exit facet 108 of the waveguide is oriented such that the exit facet 108 is substantially normal or perpendicular to the expected propagation angle of the laser output 114 reflected off of the diffraction grating 88. This reduces the potential angular deviation of the output laser light 114 as the laser frequency is altered.

The first laser output 112 is beneficial in that it provides a laser output at a fixed position and propagation angle, in contrast with the second laser output 114 which may be subject to differing propagation angles and positions depending upon the frequency of the laser output. The magnitude of the power output from the first or second outputs 112, 114 of the laser can be controlled by the characteristics of the reflective coating applied to the exterior diode facet 110 as well as the blaze angle of the diffraction grating 88, as desired.

In one example, the wavelength selective electrode 84 is sized so as to cover the light reflected off the grating 88 prior to exiting the waveguide at output 114. This reduces potential angular deviations of light 114 exiting the laser by offsetting the changes in propagation direction of reflected light from the grating 88. In other words, as voltages are applied to the beam steering or frequency selective electrode 84 in order to alter the frequency output of the laser, the angle at which the intra-cavity laser light impinges upon the grating 88 is altered. This also alters the angle at which the reflected beam propagates, which can be undesirable because it can alter the direction of the output laser beam 114. By forming a beam steering electrode 84 that covers the reflected beam from the grating 88, this effect can be partially cancelled by having the output laser light 114 pass again under the same electrode 84 prior to exit.

Collimation optics or optical conditioning elements 118, 120, 130 can be applied to either the first or second laser output 112, 114 as desired. Conventional gratings 88 can be used, for example but not limited to, holographically etched gratings of 600 or 1200 lines per millimeter with blaze angles selected to control the percentage of power sent back in the first diffracted order. For a given grating pitch and desired laser output frequency, the angle at which the rear facet is oriented with respect to the main portion of the intra cavity laser light can be selected. In one example, for laser wavelengths around 1.3 microns and with a grating pitch of 600 lines per millimeter, the grating angle may be chosen to be 13 degrees with respect to the intra-cavity laser beam.

The grating 88 can be coupled with or affixed to the rear facet 106 of the waveguide in any conventional or other manner, including through the use of optical adhesives or other techniques. If optical adhesives are utilized, it is understood that due to the higher index of refraction of the optical adhesive as compared to air, the effective pitch of the grating 88 may be altered and accordingly the angle at which the rear facet 106 is oriented may be affected.

As shown in the example of FIGS. 3-5, a substrate or printed circuit board 132 or similar material may be provided for supporting the waveguide 66 and other optical components of the laser 100. In one embodiment, the thermal expansion coefficients of the substrate/printed circuit board 132 and the waveguide 66 are selected to be similar so that as the laser 100 is utilized in environments having varying temperatures, the alignment of the waveguide 66 with the other optical components is maintained substantially unaffected. In one example, the laser 62 is mounted on a thermal electric cooler (not shown) and the laser may be temperature stabilized. The substrate/printed circuit board 132 may be made of any conventional material, and in one example is formed from a ceramic material with low thermal expansion characteristics. In another example, the circuit board 132 is implemented using a silicon material similar to that used in the lower cladding 134 of the waveguide 66. The circuit board 132 may include one or more electrical traces (i.e., 124, 126, 128) for providing electrical coupling between the electrodes 76, 84 of the waveguide 66 and external circuitry.

Figure 12:
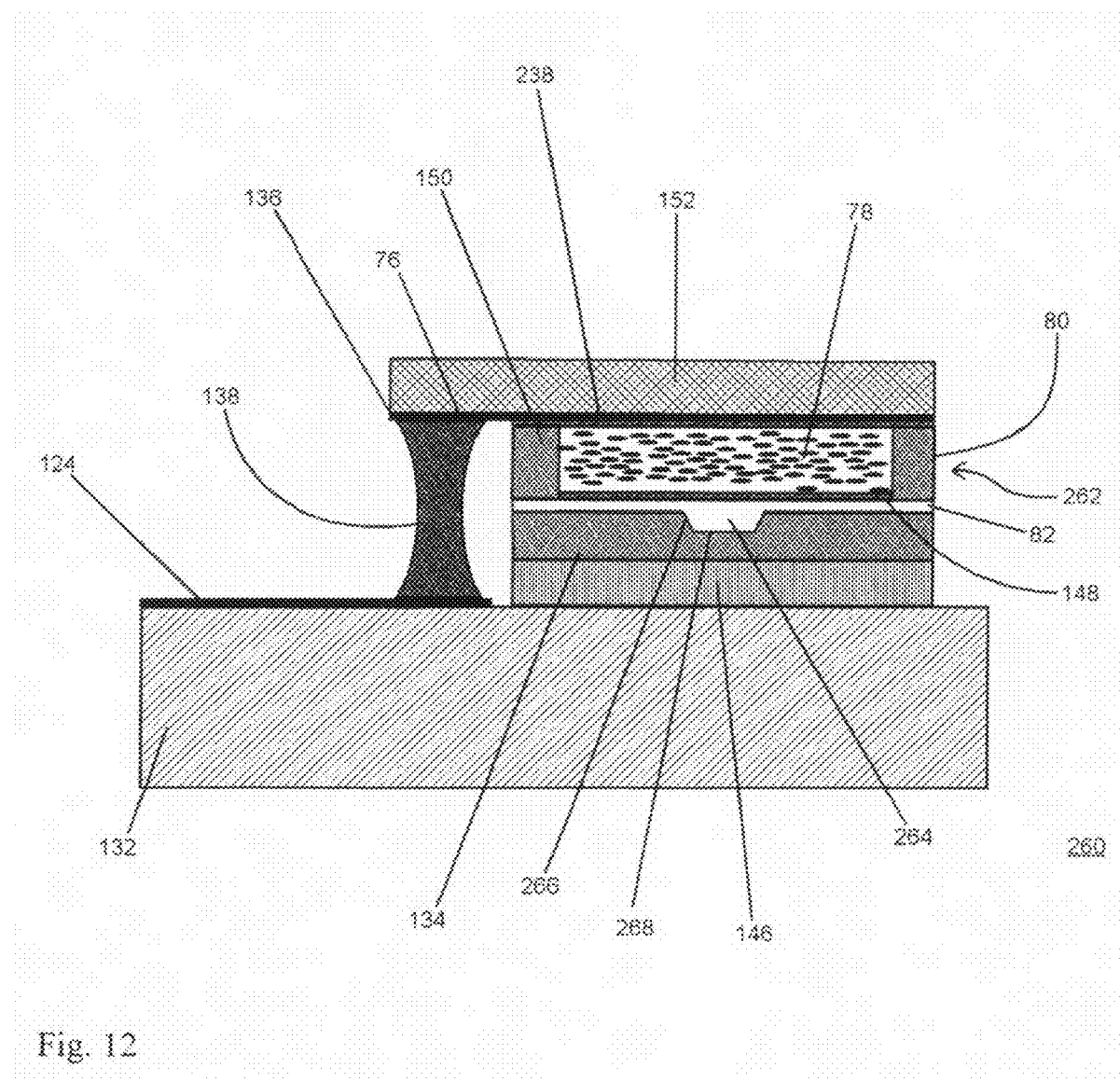
FIG. 12 illustrates a sectional view of the tunable laser of FIG. 11 taken along section lines 12-12, in accordance with one embodiment of the present invention.

For forming electrical connections between the electrodes 76, 84 of the waveguide and the printed circuit board 132, an overhang portion 136 of the electrodes in the waveguide can be provided and a conductive cross-over 138 (which may be formed using conductive glue or other material) can be used to electrically couple the waveguide electrodes 76, 84 to the traces 124, 128 on the circuit board 132 (see also FIG. 12).

The electrical contacts for the diode laser 62 can be formed using conventional wire bonding techniques or other conventional techniques.

The topology of the printed circuit board 132 can be adapted to provide optical alignment between the laser diode 62, coupling optics 118, 120, and waveguide core 82, and collimation optics 130. In one example, the printed circuit board includes a cavity 140 for receiving the lower portion of the waveguide 66 (see FIG. 5) although other structures may be used. In another example, grooves 142 in the top surface of the printed circuit board are provided to receive and orient the coupling optics. For example, a V groove can be provided in the top surface of the printed circuit board to receive the cylindrical coupling lens 120 or a cylindrical collimation lens 130. In another example a pair of grooves having V-shaped cross-sections can be oriented perpendicularly to one another on the surface of the printed circuit board in order to receive a ball lens 118. These optical elements can be secured to the printed circuit board using conventional adhesives or other techniques.

FIG. 5 illustrates a sectional view of the tunable laser 100 of FIG. 3 which shows an example of an implementation of a liquid crystal waveguide 66, in accordance with one embodiment of the present invention. As shown in FIG. 5, the waveguide 66 may include a core layer 82 for guiding the light from the laser diode 62 throughout the waveguide 66. In one example, the core 82 has a generally uniform cross section throughout a central portion of the waveguide and has a tapered cross-section 144 about the front and rear facets 104, 106 of the waveguide. This tapering is done for the purpose of coupling light into and out of the waveguide, specifically the mode profile of the guided light is increased toward the front and rear facets 104, 109 and therefore the divergence properties of the light exiting the waveguide are smaller than they would be for an untapered core.

In one example, a lower cladding 134 is positioned below the waveguide core 82, and a lower electrode or electrode plane 146 is provided beneath the lower cladding 134. The lower electrode 146 may provide a ground plane for the electric fields or voltages that are applied to the liquid crystal material 78, as described herein.

In one example, an upper cladding 80 may be provided proximate to or adjacent to the top surface of the waveguide core layer 82. The upper cladding 80 may include electro-optic material 78, such as liquid crystal material, as shown in FIG. 5. If desired, one or more alignment layers 148, 150 may be provided on the upper or lower surfaces of the upper cladding 80 in order to provide a positional bias or initial orientation of the liquid crystal material 78 within the upper cladding 80. On the top surface of the top cladding 80, one or more electrodes 76, 84 may be provided for controlling the optical path length of the laser cavity and for providing wavelength selection for the light propagating within the waveguide. If desired, a glass cover or other protective or insulating layer 152 may be provided along the top surface of the electrodes as shown in FIG. 5.

While FIG. 5 illustrates a specific implementation of a waveguide 66, it is understood that the waveguide 66 of FIG. 5 could be implemented utilizing a number of alternative structures, layers, and materials as described herein. FIGS. 17-51 and the descriptions related thereto disclose various alternative structures, materials, and processes that may be utilized in formation of a waveguide for use in a tunable laser, depending upon the particular implementation.

Figure 6:
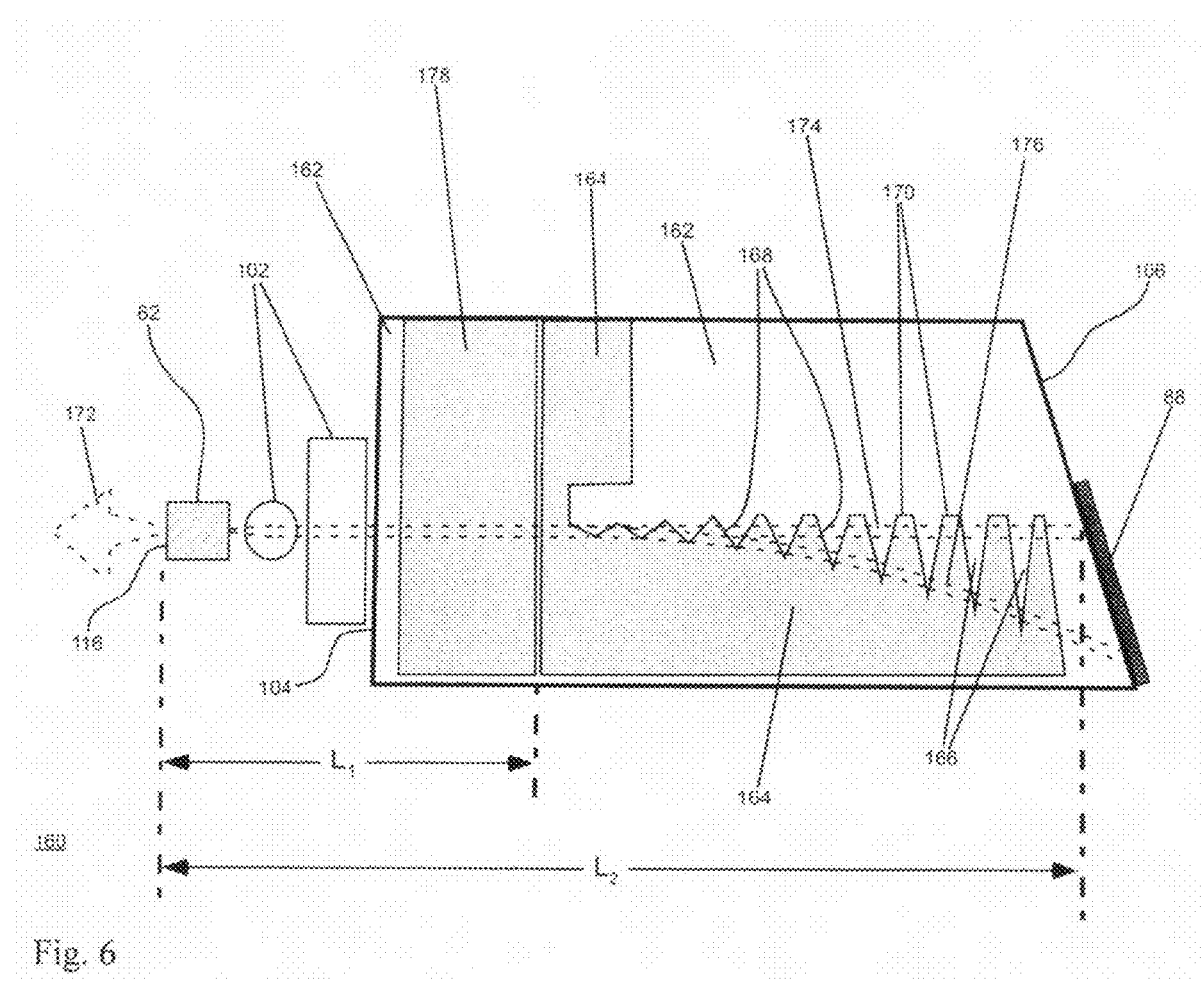
FIG. 6 illustrates another example of a tunable laser of FIG. 3 including an electrode with a plurality of refractive shapes, in accordance with one embodiment of the present invention.

FIG. 6 illustrates another example of a tunable laser 160 utilizing a liquid crystal waveguide 162, in accordance with one embodiment of the present invention. In this example, which may be implemented in a substantially similar manner as the examples of FIGS. 3-5, a wavelength selective electrode 70 may be implemented using a horn shaped electrode 164 having a plurality of V-shaped gaps 166 defining a plurality of interfaces 168 as described below.

In the example of FIG. 6, the beam steering electrode 164 includes a plurality of wedge shaped elements 170 which provide a plurality of refractive interfaces 168 thereby increasing the amount to which the beam can be steered within the waveguide 162. Additional discussion relating to this horn-shaped electrode 164 is described below with reference to FIG. 34. Hence, the angles at which the light can impinge upon the grating 88 includes a larger range than the example of FIG. 34. This enables a larger range of wavelengths that can be selected by the wavelength selective element 70, which thereby provides a larger range of wavelengths at which the laser 160 can operate. In this example, the laser output 172 is provided through the exterior diode facet 110 of the diode laser 62.

As shown in FIG. 6, when a low or no voltage is applied to the second electrode 164, there is little or no beam steering as represented by beam 174. As a greater voltage is applied to electrode 164, the amount of deflection or steering of the beam increases as represented by beam 176. Generally, the light diffracted by the grating 88 back into the laser diode 62 in response to the angle at which beam 174 impinges upon the grating 88 is typically a shorter wavelength, while the light diffracted by the grating 88 back into the laser diode 62 in response to beam 176 is typically characterized as having a longer wavelength. Hence, it can be seen that through the application of different voltages to electrode 164, different wavelengths of light are diffracted back into the laser diode 62, thereby providing wavelength selection for the tunable laser 160.

Due in part to the orientation of the rear facet 106 and grating 88 with respect to the intra cavity laser light and in part to the geometry of the steered intra cavity beam, it can be seen that beam 174 traverses a shorter optical path length than does beam 176. Therefore, the application of voltage to electrode 164 simultaneously alters the wavelength selection and the optical path length. Therefore, by selecting the value for length L1, the value for length L2, and the grating pitch, the application of voltage to electrode number 164 can enable extended continuous mode tuning of the output 172 laser frequency. Stated differently, lengths L1, L2 and the grating pitch can be chosen so that as voltage is applied to a single electrode 164 the degree to which the optical path length and the wavelength selection change can by synchronized so as to provide for mode hop free tuning.

In one example, a laser 160 includes a waveguide having a single electrode which controls both respective optical path lengths and wavelength selection. In FIG. 6, L1 defines the distance between the exterior diode facet 110 of the laser diode 62 and the front or proximate end of the second electrode 164, while the distance L2 is defined by the distance between the exterior diode facet 110 of the laser diode 62 and the surface of the grating 88. While the second electrode 164 of FIG. 6 can provide both wavelength selection and optical path length tuning, the range of single mode or mode hop free tuning may be limited, for instance by dispersion. In order to address these limitations, a first electrode 178 may be provided to permit greater optical path length control.

Figure 7:
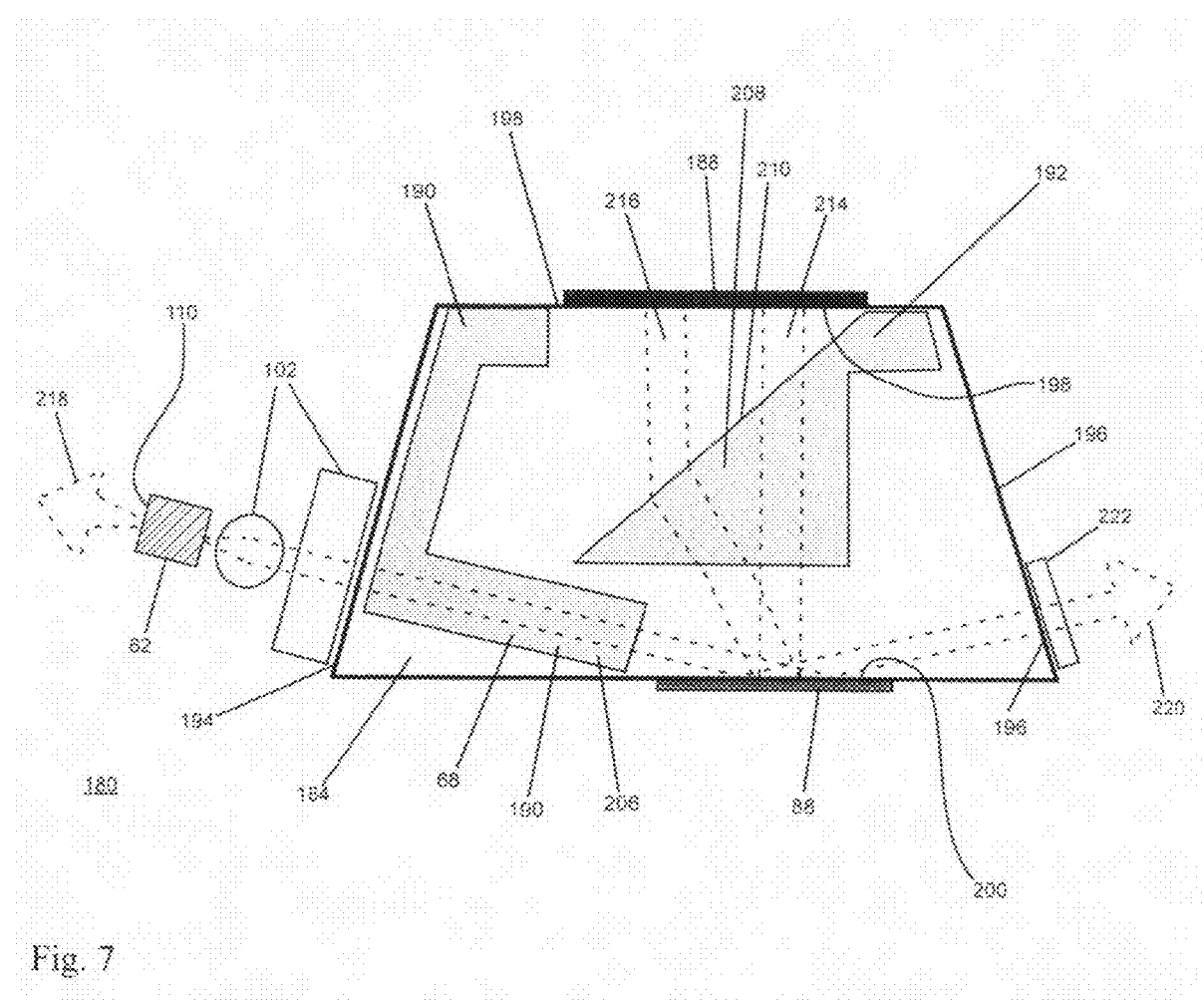
FIG. 7 illustrates another example of a tunable laser, in accordance with one embodiment of the present invention.
Figure 8:
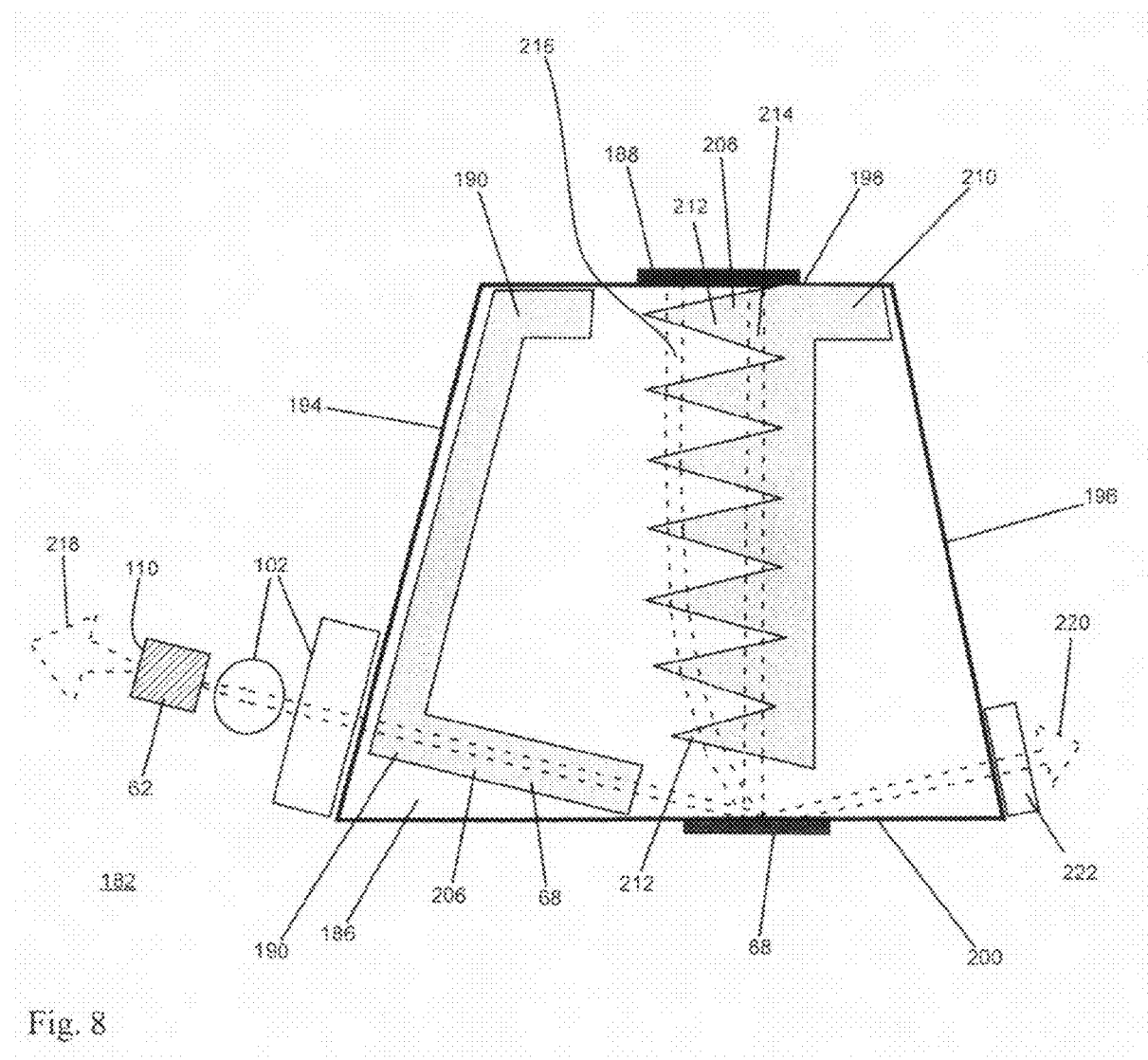
FIG. 8 illustrates another example of a tunable laser of FIG. 7 including an electrode with a plurality of refractive shapes, in accordance with one embodiment of the present invention.

FIGS. 7-8 illustrate other examples of the invention wherein tunable lasers 180, 182 are formed using liquid crystal waveguides 184, 186, in accordance with one embodiment of the present invention. These embodiments are generally configured in a Littman-Metcalf type, external cavity diode laser configuration.

In the examples of FIGS. 7-8, the tunable laser 180, 182 includes a gain medium (diode laser) 62, coupling optics 102, a waveguide 184, 186 having liquid crystal material therein, a diffraction grating 88, and a reflector 188. The waveguide 184, 186 includes an optical path length control element 68 including a first electrode 190, and a wavelength selective element 70 including a second electrode 182. The waveguide 184, 186 has a front facet 194, a rear or exit facet 196, a top facet 198, and a bottom facet 200. The front, rear, top and bottom facets of the waveguide may be polished surfaces so as to reduce optical losses. The boundaries of the laser cavity are defined on a first end by the exterior facet 110 of the laser diode 62, to the diffraction grating 88 on the bottom facet 200, to a second end by the reflector 188 on the top facet 198 of the waveguide. A laser output 202 can be taken at the exterior facet 110 of the diode laser 62 or a laser output 204 can be taken at the rear/exit facet 196. To achieve continuous single mode tuning, the voltages applied to the first and second electrodes 190, 192 should be synchronized.

In the waveguide, the first electrode 190 includes a generally rectangular portion 206 and may be used to change the total optical path length of the laser cavity in a manner similar as described with reference to FIGS. 1-6.

The embodiment of FIG. 7 may include, as a portion of the second electrode 192 for wavelength selection, a single refractive shape portion 208 such as described herein, including a triangle, wedge, prism, or other shape with a non-normal interface 210. The second electrode 192 is used to voltage tune the propagation direction of the light which has been diffracted off the edge bonded grating 88. Specifically, this electrode 192 will determine which wavelength hits the edge reflector 188 at an angle which will be reflected and eventually traveling all the way back into the laser diode 62. Hence, by controlling the voltage applied to the prism shaped electrode 192, the wavelength that is coupled back into the gain medium or laser diode 62 can be selected. In another embodiment, a second electrode 210 for selecting the laser wavelength includes a plurality of refractive shapes 212 in series for providing a greater amount of steering of the laser beam within the cavity (see FIG. 8 and FIG. 32).

These configurations 180, 182 of FIGS. 7-8 of a tunable laser have the benefit of providing a laser output whose angle of propagation is not dependent upon the wavelength of the laser. Furthermore, this configuration has the advantage of improved side mode suppression ratio, or in other words the spectral characteristics of the output laser may be improved. This is for two reasons. First, since the laser light impinges upon the diffraction grating 88 at a smaller angle of incidence than it does in the Littrow configuration, more grating lines are filled by the same beam size. Second, since the diffraction grating 88 is mid-cavity, rather than at the end of the laser cavity, the intra cavity laser light interacts with the diffraction grating 88 twice throughout a round trip cavity path.

In operation, light is emitted from the laser diode 62 and coupled into the waveguide 184, 186 through the coupling optics 102. The light passes through the optical path length control section 68 of the waveguide, whose index of refraction is controlled by voltages applied to a first electrode 190. The light then impinges upon a diffraction grating 88, in a manner as described with reference to FIGS. 3-5, although the angle of incidence of the light in FIGS. 7-8 onto the grating 88 is smaller than in FIGS. 3-5. Due to this smaller angle of incidence, the first order diffracted beam of light from the diffraction grating 88 is not directed back into the laser diode 62, but instead is directed through a beam steering section 192, 210 of the waveguide to a reflector 188.

At the diffraction grating 88, light of different spectral components emitted from the laser diode 62 is diffracted at differing angles by the grating 88 into the region of the waveguide including the beam steering electrode 192, 210 portion. Through application of voltage to the beam steering electrode 192, 210, a particular diffracted spectral component of the light is steered such that it impinges upon the reflector 188 at normal or perpendicular incidence, which thereby reflects such light eventually back into the laser diode 62. Stated differently, in one example only light (or certain spectral components of light) that perpendicularly impinges upon the surface of the reflector 188 will be reflected back on to its original path and therefore also back to the grating 88 and subsequently into the laser diode 62.

The reflector 188 can be any conventional reflector or mirror affixed to a polished top facet 198 of the waveguide. In another example, the reflector 188 may be realized using a reflective coating applied to the polished top facet 198 of the waveguide.

For example, as shown in FIGS. 7-8, when a low or no voltage is applied to the second electrode 192, 210, there is little or no beam steering as represented by beam 214. As a greater voltage is applied to electrode 192, 210 the amount of deflection or steering of the beam increases as represented by beam 216. Generally, the light diffracted from the grating 88 in response to the angle at which beam 214 impinges upon the grating 88 is typically a shorter wavelength, while the light diffracted by the grating in response to the angle at which beam 216 impinges upon the grating 88 is typically characterized as having longer wavelengths. Hence, it can be seen that through the application of different voltages to electrode 192, 210, different wavelengths of light are selected so as to impinge upon the reflector 188 at normal incidence, and therefore to reflect back into the laser diode 62, thereby providing wavelength selection for the laser 180, 182.

In FIGS. 7-8, a laser output 218 can be realized through the exterior facet 110 of the laser diode 62, or a laser output 220 may be taken at the exit facet 196 of the waveguide which includes the zero order or reflective beam off of the diffraction grating 88. Unlike in the laser configuration of FIGS. 3-5, this output 220 does not change its propagation angle when the wavelength of the laser changes. The zeroth order beam (i.e., reflected beam off the grating 88) is directed out of the waveguide. Stated differently, in addition to the light which is diffracted toward the prism shaped electrodes 192, 210, some light just undergoes a normal reflection from the grating 88 and can serve as the laser output 220. After exiting the waveguide, the laser output light passes through collimating optics 222, if desired.

It is appreciated that the wavelength selective electrode 192 can include more than one non-normal interface. For example, the wavelength selective electrode may include a plurality of wedge shapes 212 arranged in series, and one such example is illustrated in FIG. 8. FIG. 8 shows an electrode 210 having a plurality of wedge shaped refractive elements 212 arranged in series to provide a large amount of beam steering of the laser light within the cavity. In this embodiment, the second electrode 210 can control both wavelength selection and the effective optical path length of the cavity, in the manner similar to electrode 164 of FIG. 6.

In one example, the layer structure of the waveguide core and lower cladding of waveguides 184, 186 may be constructed from SiO2, and silicon nitride. The lower substrate may be constructed from heavily P-doped Si, and therefore may also serve as the lower electrode. This electrode may be held at ground and serve as the ground for all of the electrodes. One may use a double side polished <100>Si wafer, which has been heavily P-doped (resistivity of 0.1 to 0.5 Ohms-Cm), with a diameter of 100 mm, and a thickness of 550 microns. A thermal oxide layer may be grown on the wafer, or alternatively a plasma enhanced chemical vapor deposition (PECVD) layer of SiO2 may be deposited. The PECVD layer can be advantageous because the index of refraction can be designed to match the index of refraction of a top cladding near the in-coupling and out-coupling regions of the waveguide. This may symmetrize the electric field profile of the guided light and therefore facilitate in-coupling and out-coupling of the guided light. The lower cladding of SiO2 or thermally oxidized silicon may be two to four microns thick. The guide layer or core may be constructed of PECVD silicon nitride, with an index of refraction of approximately 2.0. For operation at wavelengths near 1800 nm a core thickness of 700 nm may be chosen.

Once the core layer is deposited, in-coupling and out-coupling tapers may be defined. In one example, the in-coupling section may comprise a region where the thickness of the core layer is tapered down from a value of 700 nm to a value of 90 nm. The taper angle may be chosen to be 0.15 degrees. Likewise, the region where the grating is affixed to the exit facet of the waveguide may contain a similar tapered core section. Since the grating is affixed at an angle relative to the intracavity laser light, the taper at the grating end of the waveguide may end 2 mm prior to the grating. In this way, the Littrow angle of the grating will not cause the grating to extend beyond the taper. After these tapers have been defined with a photo-resist they may be formed in the core layer via an etching process. Once the tapers have been created 3 microns of PECVD SiO2 may be applied to the top of the core layer. This will symmetrize the electric field profile of the guided light. A region of this SiO2 overcladding may be etched away to provide a cavity into which one may place the liquid crystal. Spacer balls and glue, for affixing the glass coverplate, may be placed on top of the SiO2 surrounding walls, so as to not impact the intracavity laser light. One may choose to utilize the exterior facet 110 of the laser diode 62 for the laser output 218, in which case the diffraction grating 88 may be chosen so as to provide as much reflectivity back toward the laser diode 62 as possible.

Figure 9:
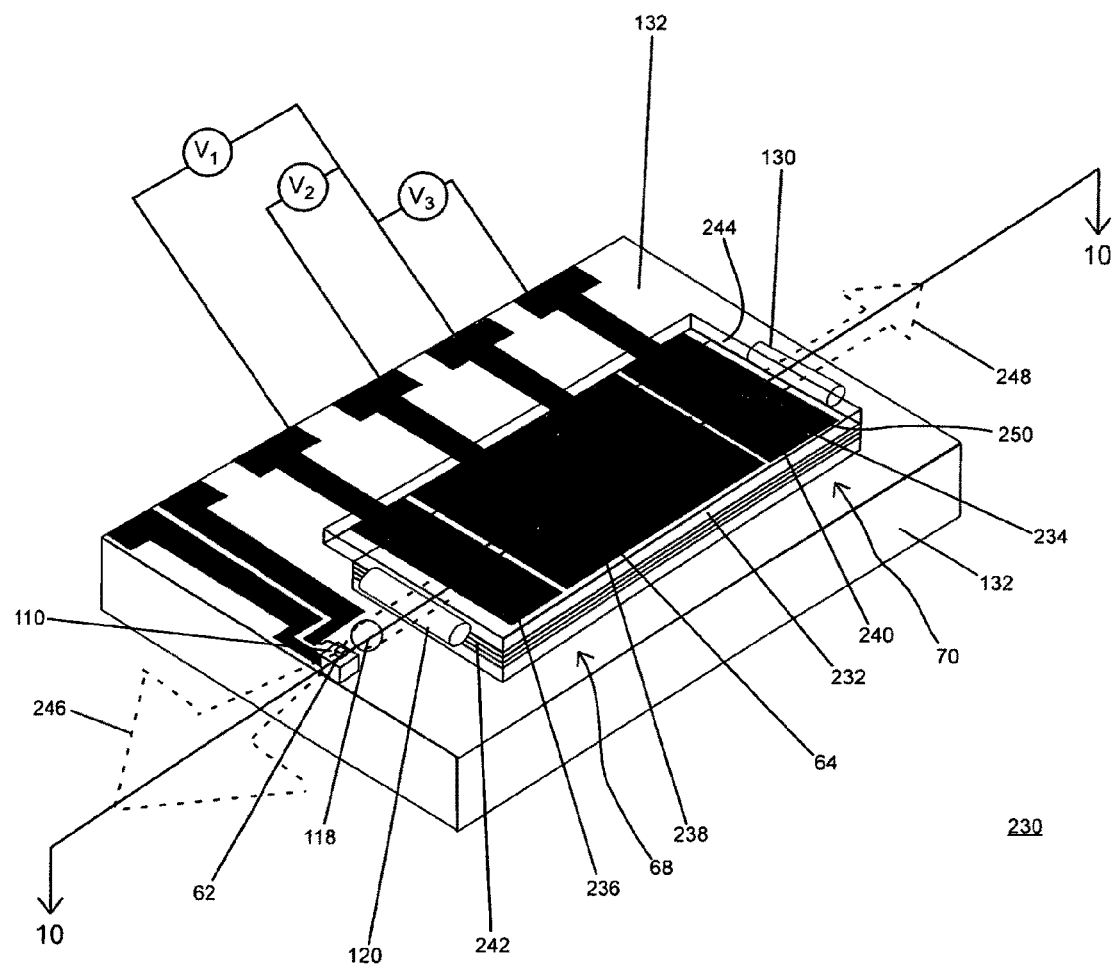
FIG. 9 illustrates another example of a tunable laser having a Bragg grating, in accordance with one embodiment of the present invention.
Figure 10:
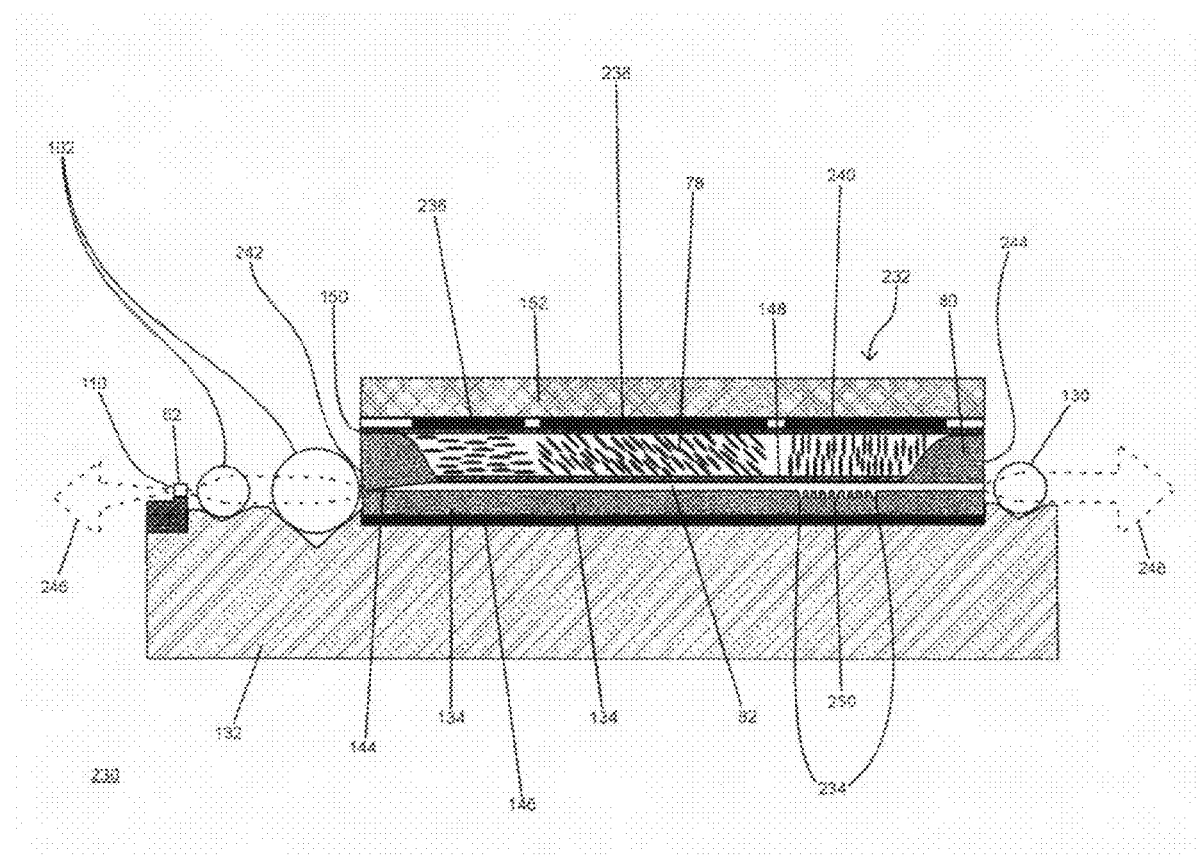
FIG. 10 illustrates a sectional view of the tunable laser of FIG. 9 taken along section lines 10-10, in accordance with one embodiment of the present invention.

FIGS. 9-10 illustrate another embodiment of a tunable laser 230 of the present invention wherein the wavelength selective element includes an embedded Bragg grating within the waveguide. In the example of FIGS. 9-10, a tunable laser 230 may include a gain medium 62 (diode laser), coupling optics 102, a waveguide 232 having liquid crystal material 78 therein, and a Bragg grating 234 embedded in the waveguide. The waveguide 232 includes an optical path length control element 68 including a first electrode 236 and second electrode 238, and a wavelength selective element 70 including a third electrode 240 proximate said Bragg grating 234. Voltages V1, V2, V3 applied to the first, second, and third electrodes 236, 238, 240 are used to control the optical path length of the tunable laser as well as to select the wavelength of light reflected into the laser cavity which governs the wavelength of the tunable laser output.

The waveguide 232 has a front facet 242 and a rear facet 244, which may be polished surfaces so as to reduce optical losses. The boundaries of the laser cavity are defined on a first end by the exterior facet 110 of the laser diode 62, to a second end defined by the Bragg grating 234. A laser output 246 can be taken at the exterior facet 116 of the diode laser 62 or a laser output 248 can be taken at the rear/exit facet 244. To achieve continuous single mode tuning, the voltages V1, V2 applied to the first and second electrodes 236, 238 should be synchronized with the voltage V3 applied to the third electrode 240.

In the example shown in FIG. 9, if desired, the optical path length control element 68 can be implemented using more than one electrode in series, wherein a first electrode 236 provides a fine control, and a second electrode 238 provides a coarse control, wherein the length of the second electrode 238 is larger than the length of the first electrode 236. By using two or more electrodes of different sizes for optical path length control, this provides added versatility. It is understood that the optical path length control element 68 of all of the embodiments disclosed herein can be implemented using one or more electrodes, depending upon the particular implementation.

The Bragg grating 234 provides wavelength control of the tunable laser 230. The voltage V3 applied to the third electrode 240 selectively controls the wavelength of the light that is reflected by the Bragg grating 234 back into the laser cavity, which thereby provides control over the wavelength of the tunable laser output 246, 248. The Bragg grating may comprise a sampled Bragg grating, which may provide extended wavelength tuning.

FIG. 10 illustrates a sectional view taken along section lines 10-10 of FIG. 9 and shows an implementation of a liquid crystal waveguide 232, in accordance with one embodiment of the present invention. In FIG. 10, the waveguide 232 may include a core layer 82 for guiding the light from the laser diode 62 throughout the waveguide. In one example, the core 82 has a generally uniform cross section throughout a central portion of the waveguide and has a tapered cross-section 144 about the front facet 242 of the waveguide. This tapering is done for the purpose of coupling light into and out of the waveguide, specifically the mode profile of the guided light is increased toward the front facet 242 so that the divergence properties of the light exiting the waveguide are smaller than they would be for an untapered core.

In one example, a lower cladding 134 is positioned below the waveguide core 82 and the top surface of the lower cladding 134 is provided with etchings or a comb pattern 250 to form a Bragg grating, and properties and structures of a Bragg grating are discussed herein.

A lower electrode or electrode plane 146 is provided beneath the lower cladding 134. The lower electrode 146 may provide a ground plane for the electric fields or voltages that are applied to the liquid crystal material 78, as described below. In one example, an upper cladding 80 may be provided proximate to or adjacent to the top surface of the waveguide core layer 82. The upper cladding 80 may include electro-optic material 78 therein, such as liquid crystal material, as shown in FIG. 10. If desired, one or more alignment layers 148, 150 may be provided on the upper or lower surfaces of the upper cladding 80 in order to provide a positional bias or initial orientation of the liquid crystal material 78 within the upper cladding 80.

On the top surface of the top cladding 80, a plurality of electrodes 236, 238, 240 may be provided for controlling the optical path length of the laser cavity and for providing wavelength selection for the light propagating within the waveguide. The third electrode 240 is positioned proximate or above the Bragg grating 234 so that the electric field created by the application of voltage to the third electrode 240 affects the liquid crystal material 78 proximate the Bragg grating 234.

If desired, a glass cover or other protective or insulating layer 152 may be provided along the top surface of the electrodes 236, 238, 240 as shown in FIG. 10. While FIG. 10 illustrates a specific implementation of a waveguide 232, it is understood that the waveguide 232 of FIG. 10 could be implemented utilizing a number of alternative structures, layers, and materials as described herein. For instance, the Bragg grating 234 could be implemented in the core 82 or lower cladding 134 of the waveguide 232.

In FIG. 10, the regions of the waveguide 232 proximate the front facet 242 and the rear facet 244 of the waveguide each have an upper cladding 80 that has an index of refraction similar to or the same as the index of refraction of the corresponding lower cladding 134. This serves to improve the coupling efficiencies into the front facet 242 and improves the beam quality of the laser light exiting the rear facet 244.

The Bragg grating 234 serves as the wavelength selective element 70 of the tunable laser 230 and reflects only certain wavelengths of light back into the laser diode 62. The Bragg grating 234 includes a periodically varying index of refraction along the length of the Bragg grating within the waveguide. In one example, this may be realized through the use of periodic variations of the thickness of the core layer, although any conventional or other techniques for forming a Bragg grating in a waveguide may be used. In this example, through the selection of the appropriate pitch or distance between these index variations, the frequency of light which is diffracted or reflected back into the laser diode 62 may be selected. Due to the electro-optic (i.e., liquid crystal) materials 78 included in the upper cladding 80, the effective pitch of the Bragg grating 234 is controllable through the application of different voltages V3 to the wavelength electrode 240 proximate the Bragg grating 234. Stated differently, as voltages V3 are applied to the third electrode 240, the effective pitch of the Bragg grating 234 is adjusted or tuned so as to select the wavelength of light that is diffracted or reflected back into the laser diode 62. As with the embodiments described above, the synchronous tuning of the phase electrodes 236, 238 and the wavelength selective electrode 240 can provide for continuous, mode hop free tuning of the laser 230.

As shown in FIG. 9, the geometry of the optical path length control electrodes 236, 238 can be such that they occupy a large portion of the laser cavity. This may be advantageous because, due to the larger amount of the cavity that is affected by the optical path length control electrodes 236, 238, changes in the index of refraction of the core 82 proximate the optical path length control electrodes 236, 238 will have an overall greater fractional effect upon the total optical path length of the laser cavity.

In FIG. 9, the laser output 246 may be taken, in one example, from the exterior facet 110 of the diode laser 62, or, alternatively, the Bragg grating 234 might be designed to transmit a certain fractional portion of the light through the Bragg grating 234 to the rear facet 244 of the waveguide and the laser output 248 may be taken at the rear facet 244. For example, the Bragg grating 234 may be designed to reflect or diffract 80% of impinging light and transmit the remaining 20% to the rear facet 244, although these particular percentages are provided as examples only and are a matter of choice depending upon the particular implementation.

Stated differently, the Bragg grating 234 serves to selectively reflect only a subset or certain spectral components of the total light emitted from the diode laser 62 back into the laser cavity. In one example, from the broad emission from the laser diode 62 (i.e., approx. 100 nm in one example), only a small portion of wavelength is reflected back (i.e., less than 1 nm in one example). By placing liquid crystal material 82 adjacent the Bragg grating 234 in the waveguide, with a rectangular shaped electrode 240 which encompasses the Bragg reflector region, then voltage V3 applied to the rectangular shaped electrode 240 can tune the wavelength which is reflected by the Bragg grating 234.

In one example the layer structure of the waveguide core and lower cladding, for FIGS. 9-10, may be constructed from SiO2, and silicon nitride. The lower substrate may be constructed from heavily P-doped Si, and therefore may also serve as the lower electrode. This electrode may be held at ground and serve as the ground for all of the electrical components. One may use a double side polished <100>Si wafer, which has been heavily P-doped (resistivity of 0.1 to 0.5 Ohms-Cm), with a diameter of 100 mm, and a thickness of 550 microns. A 4 micron thick thermal oxide layer may be grown on the wafer and serve as a lower cladding. The Bragg grating 234 may be formed via etching a series of parallel lines into the subcladding, which are then backfilled with a higher index material. These parallel lines may be oriented at 90 degrees with respect to the intracavity laser beam. By embedding the grating on the lower portion of the waveguide core this will create an inverted grating structure, which will therefore not impact liquid crystal alignment. These lines may be a few millimeters long and 1 to 2 nanometers deep. The pitch, or spacing between adjacent lines, may be chosen so as to reflect the appropriate wavelength. The number of lines, or equivalently the length of the Bragg grating 234, may be chosen for the desired reflectivity. If the laser output is taken from the exterior diode facet then the Bragg grating may be designed to reflect 80-90% of the light.

The lines may be formed with an e-beam write onto a photoresist and then a dry etch into the subcladding. The dry etch may be advantageous over a wet etch since the walls of the grating lines will be more square. Once these grating trenches have been etched into the subcladding, these trenches may be backfilled with a 100 nm thick, Si3N4 (stoichiometric silicon nitride) layer. This layer may be applied by means of a low vapor pressure chemical vapor deposition (LPCVD) process, which may provide a better fill of the grating trenches than a PECVD process. This 100 nm LPCVD layer may form the lower portion of the core or guide layer. Tapers, to facilitate in and out-coupling of the light from the waveguide, may be applied to this layer in a manner similar to that discussed previously. On top of the LPCVD layer one may deposit a 400 nm thick PECVD silicon nitride layer. The overall core thickness may therefore be 500 nm. Again, tapers may be created in the 400 nm PECVD layer in a manner similar to that discussed previously. The core layer 82, which may be comprised of both the LPCVD and PECVD silicon nitride layers, may taper down to a thickness of 50 to 70 nm to facilitate waveguide coupling. Next, 3 microns of PECVD SiO2 may be applied to the top of the core layer. This will symmetrize the electric field profile of the guided light. A region of this SiO2 overcladding or top cladding may be etched away to provide for a cavity in which the liquid crystal may be placed. Spacer balls and glue, for affixing the glass coverplate, may be placed on top of the SiO2 surrounding walls, so as to not impact the quality of the intracavity laser light.

Figure 11:
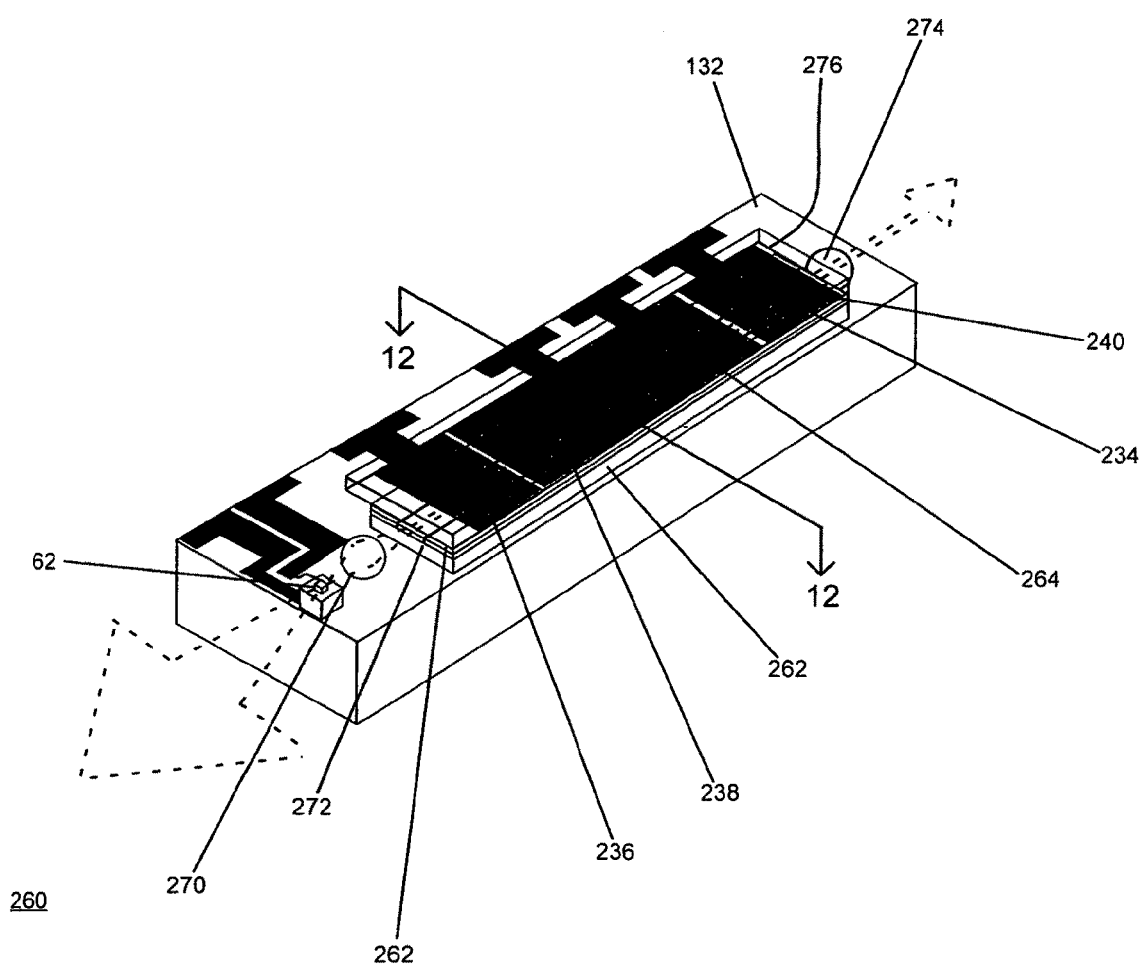
FIG. 11 illustrates another example of a tunable laser having a Bragg grating, in accordance with one embodiment of the present invention.

FIGS. 11-12 illustrate another embodiment of a tunable laser 260 similar to 230 shown in FIGS. 9-10, wherein FIGS. 11-12 show a waveguide 262 having a channel 264 extending along the length of the waveguide core 82. As shown in FIG. 12, one example of a channel 264 in the core 82 is illustrated as an inverted ridge defining a pair of downwardly angled sides 266 terminating at a bottom edge 268. It is understood that the particular cross sectional geometry of the channel 264 can be implemented in many different conventional or other manners. The channel 264 provides lateral confinement of the guided light traveling through the waveguide core 82 and may eliminate the need for cylindrical lenses for coupling light in and out of the waveguide 262. For instance, in FIG. 11, a ball lens 270 may couple the laser light in and out of the front facet 272, and another ball lens 274 may be used to couple the light exiting the rear facet 276 of the waveguide. Alternatively, high numerical aperture aspheric lenses can be used for coupling light into and out of the waveguide. Alternatively, the diode laser 62 may be butt-coupled to the front facet 272 of the waveguide without the need for any lens.

Furthermore, the width of the channel 264 of the core 82 proximate the front and rear facets 272, 276 of the waveguide may be tapered to a different width (i.e., larger width) in order to facilitate light coupling in and out of the waveguide proximate the front and rear facets of the waveguide. This tapering of the width of the channel 264 may be done, in another example, in combination with the tapering of the thickness of the waveguide core 82 as shown in FIG. 10, if desired.

Another benefit provided by the channel 264 waveguide of FIGS. 11-12 is that the lateral extent of the Bragg grating 234 may be limited to the lateral extent of the core region, thereby reducing manufacturing costs.

As shown in FIG. 12, an overhang portion 136 of the electrodes in the waveguide 262 can be provided and a conductive cross-over 138 (which may be formed using conductive glue or other material) can be used to electrically couple the waveguide electrodes to voltage sources for the electrodes.

In one example the layer structure of the waveguide core 82 and lower cladding 134, for FIGS. 11-12, may be constructed from SiO2 and silicon nitride. The lower electrode 146 may be constructed from heavily P-doped Si. This electrode may be held at ground and serve as the ground for all of the electrical components. One may use a double side polished <100>Si wafer, which has been heavily P-doped (resistivity of 0.1 to 0.5 Ohms-Cm), with a diameter of 100 mm, and a thickness of 550 microns. A 4 micron thick thermal oxide layer may be grown on the wafer and serve as a lower cladding.

The Bragg grating 234 may be formed via etching a series of parallel lines into the subcladding, which are then backfilled with a higher index material. These lines may be oriented at ninety degrees with respect to the intra-cavity laser light. This structure will create an inverted grating structure, and will therefore not impact liquid crystal alignment. Rather than in the slab grating structure, these lines may be only a few microns long (rather than a few millimeters) and 1 to 2 nanometers deep. The pitch, or spacing between adjacent lines, may be chosen so as to reflect the appropriate wavelength. The number of lines, or equivalently the length of the Bragg grating, may be chosen for the desired reflectivity. If the laser output is taken from the exterior diode facet 110 then the Bragg grating 234 may be designed to reflect 80-90% of the light, in one example. The lines may be formed with an e-beam write onto a photoresist and then a dry etch into the subcladding. The dry etch may be advantageous over a wet etch since the walls of the trench that is left after the etching will be more square. Once these grating trenches have been etched into the subcladding, these trenches may be backfilled with a 150 nm thick, Si3N4 (stoichiometric silicon nitride) layer. This layer may be applied by means of a low vapor pressure chemical vapor deposition (LPCVD) process, which may provide a better fill of the grating trenches than a plasma enhanced chemical vapor deposition (PECVD) process. This 150 nm LPCVD layer may form the lower portion of the core or guide layer. Tapers, to facilitate in and out-coupling of the light from the waveguide, may be applied to this layer in a manner similar to that discussed previously. Furthermore, the 150 nm thick LPCVD layer may be removed via etching in all regions except for a channel above the grating structure. After the channel has been defined the structure may be covered with a 200 nm thick LPCVD SiO2 layer. A chemical-mechanical polishing (CMP) process may then be applied. The CMP may proceed until the silicon nitride channel is reached. A PECVD silicon nitride layer may be placed on top of this. The PECVD silicon nitride layer and the LPCVD silicon nitride channel may comprise the waveguide core. Again, tapers may be created in the PECVD layer in a manner similar to that discussed previously. The core layer, which may be comprised of both the LPCVD and PECVD silicon nitride layers, may taper down to a thickness of 50 to 70 nm to facilitate waveguide coupling. Next, 3 microns of PECVD SiO2 may be applied to the top of the core layer. This will symmetrize the electric field profile of the guided light. A region of this SiO2 overcladding may be etched away to provide for a cavity in which the liquid crystal may be placed. Spacer balls and glue, for affixing the glass coverplate, may be placed on top of the SiO2 surrounding walls, so as to not impact the quality of the intracavity laser light.

Figure 13:
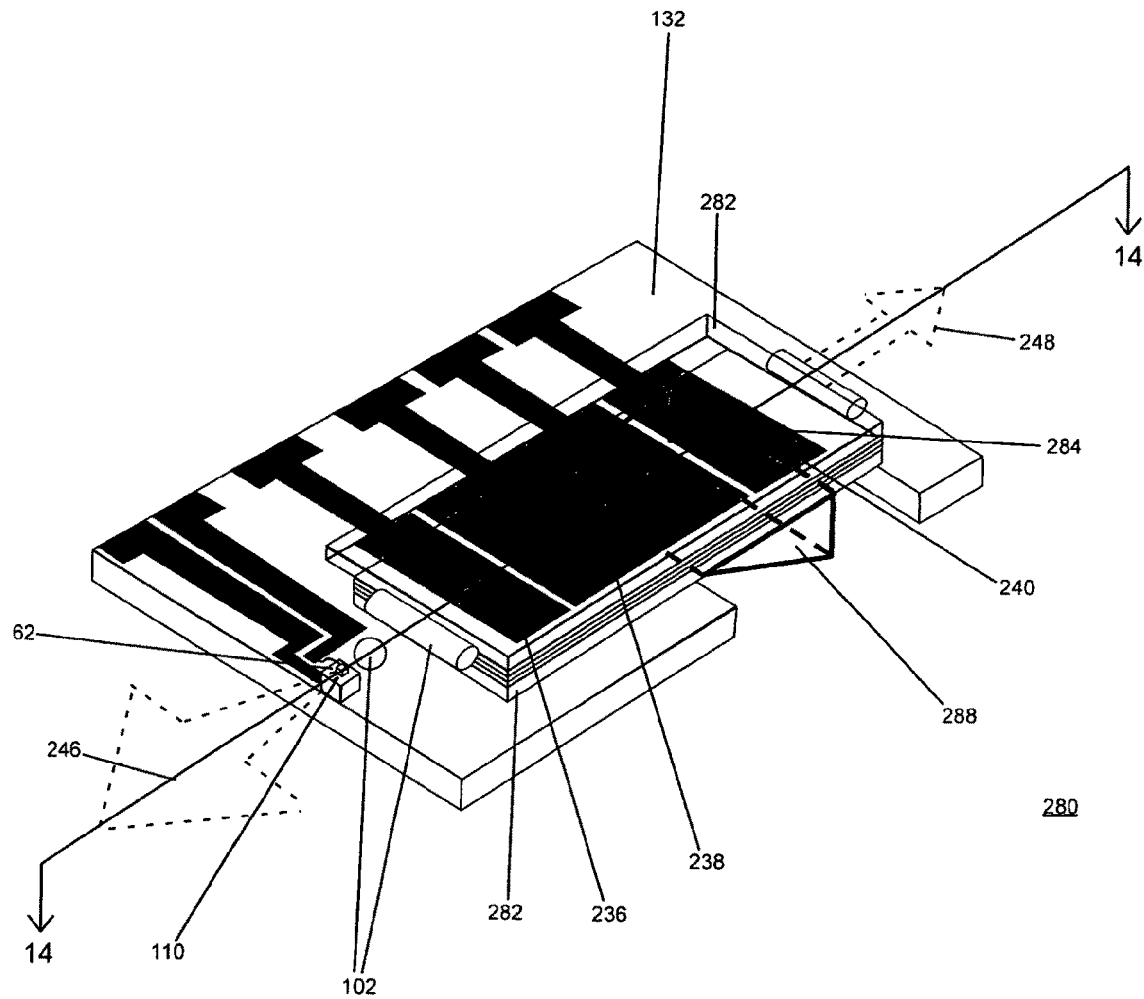
FIG. 13 illustrates another example of a tunable laser having an out-coupling grating and a prism, in accordance with one embodiment of the present invention.
Figure 14:
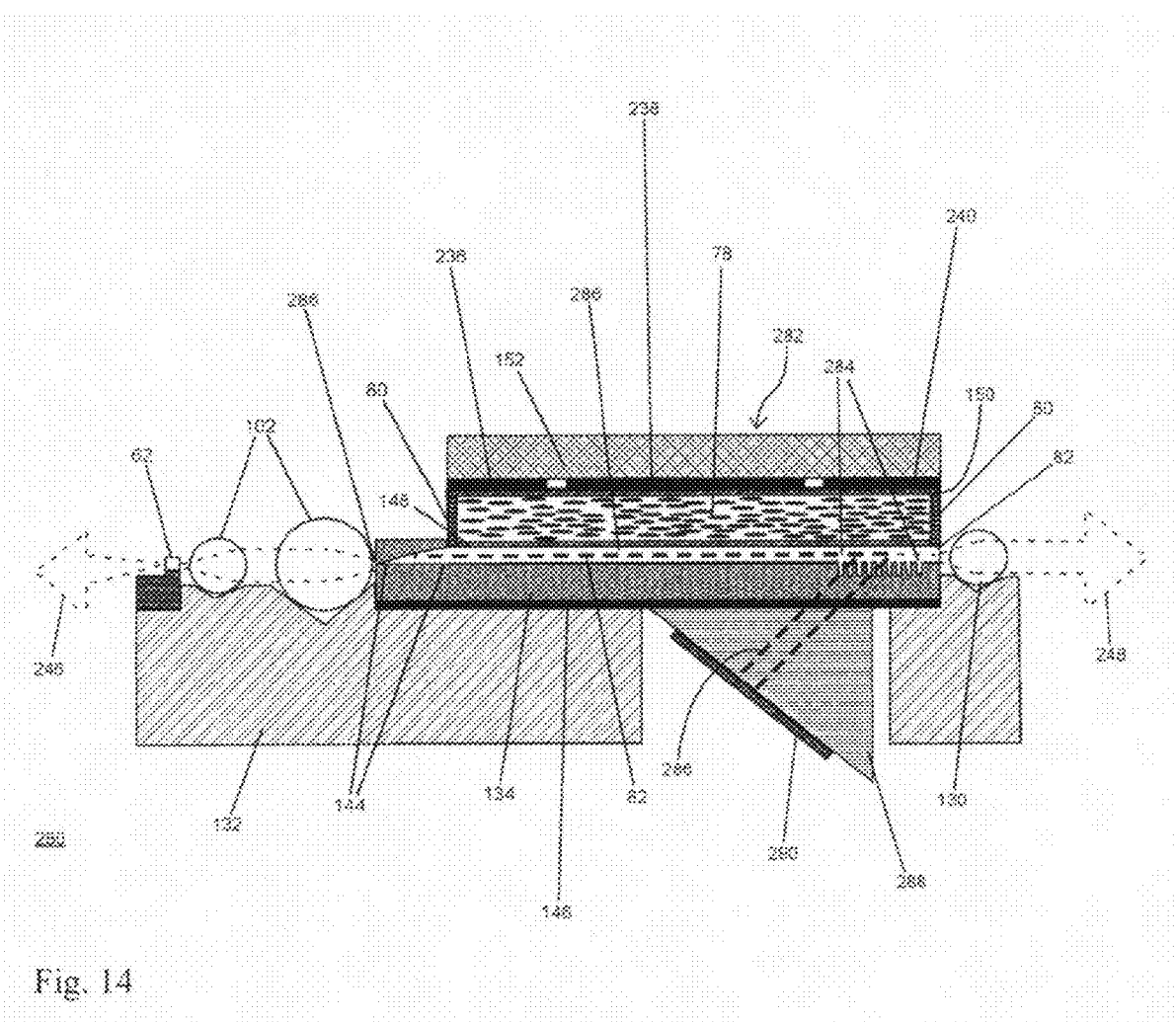
FIG. 14 illustrates a sectional view of the tunable laser of FIG. 13 taken along section line 14-14, in accordance with one embodiment of the present invention.

FIGS. 13-14 illustrate another embodiment of a tunable laser 280 wherein a Littman-Metcalf laser configuration is shown. In this example, the waveguide 282 with an embedded out-coupling grating 284 may be implemented in a similar manner as disclosed in FIGS. 9-10.

In the example of FIGS. 13-14, the grating 284 is configured so that, instead of reflecting or diffracting light back into the laser diode 62, the grating 284 is implemented as an out-coupling and in-coupling grating which transmits the light 286 (FIG. 14) out of the plane of the grating. This may be achieved by altering the pitch of the index variations in the grating 284. By choosing the relative indices of refraction of the upper and lower cladding proximate the grating, light 286 may be selectively coupled outwardly through only the lower cladding.

In one example, a prism 288 is attached and optically coupled with the bottom surface of the waveguide 282 and a reflector 290 is attached to the prism 288 as shown in FIGS. 13-14. In one example, the lower cladding 134 and lower electrode 146 of the waveguide 282 are optically transparent, for instance, the lower electrode 146 may be implemented using ITO material, or for infrared light, P-doped silicon. As described above, the reflector 290 only reflects light that impinges upon the reflector 290 at a normal or perpendicular angle of incidence, and this light is reflected back into the grating 284, which re-couples light into the waveguide 282 and back to the laser diode 62. The extent of the laser cavity is therefore defined by the exterior facet 110 of the laser diode 62 through the grating 284 to the surface of the reflector 290. As with embodiments described above, this reflector 290 may be any conventional or other reflector, including a reflective coating or attached mirror coupled to the prism 288.

By applying different voltages to the electrode 240 above the out-coupling grating 284, the wavelength components that strike the reflector 290 at normal or perpendicular incidence may be selected, thereby selectively tuning the wavelength of the laser.

One potential manufacturing complexity presented by the configuration of FIGS. 7-8 is that the alignment layers for the first electrode and the second electrode may be at different orientations. In contrast, FIGS. 13-14 may utilize a single uniform alignment layer orientation on alignment layers 148, 150 while still realizing the benefits of a Littman-Metcalf laser configuration.

Figure 15:
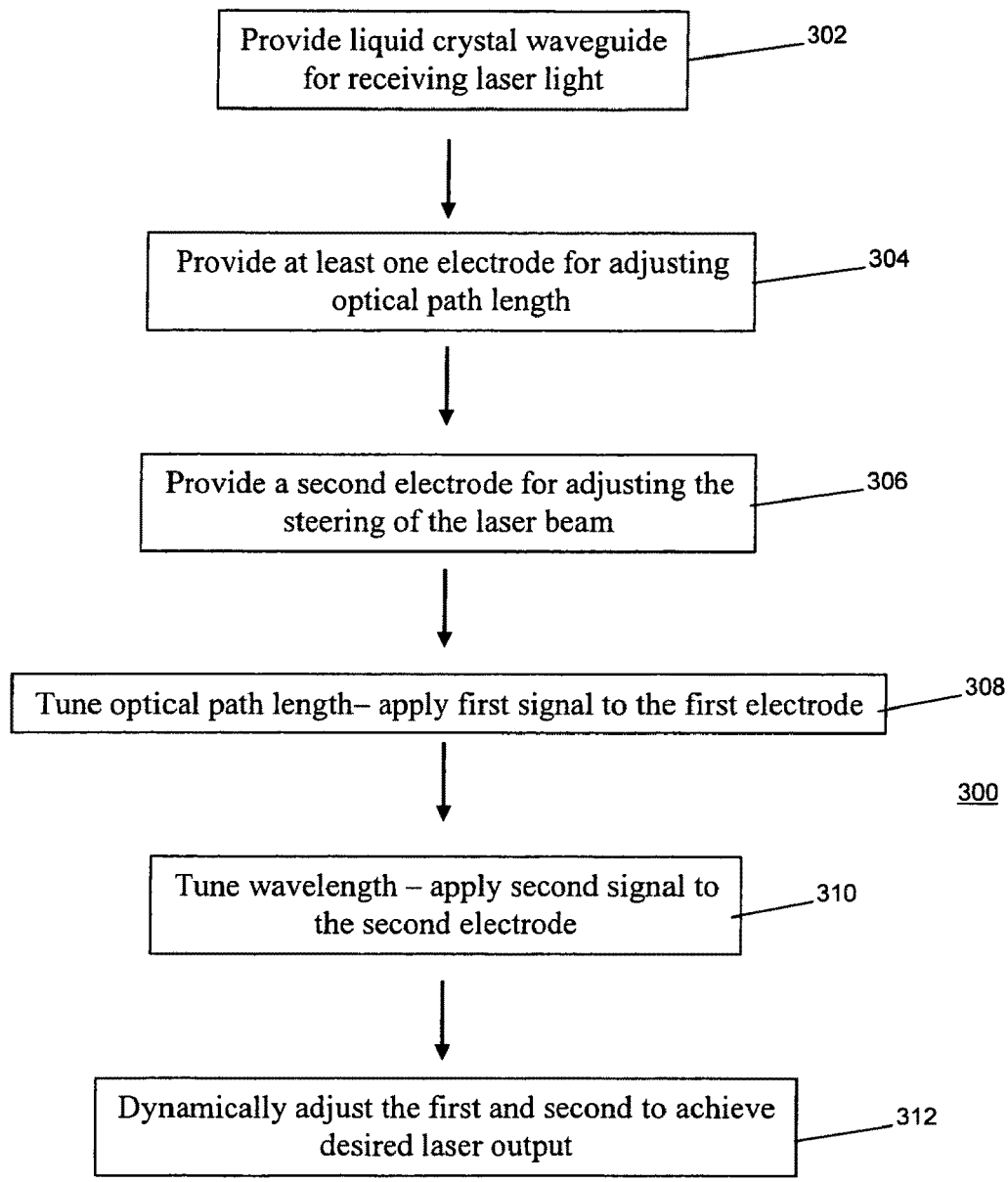
FIG. 15 illustrates an example of the operations for operating a tunable laser, in accordance with one embodiment of the present invention.

FIG. 15 illustrates an example of operations 300 for tuning a laser, in accordance with one embodiment of the present invention. At operation 302, a liquid crystal waveguide is provided for receiving and manipulating laser light as the light travels in the core of the waveguide. In one example, the tunable laser is an external cavity laser wherein the gain medium is optically coupled with the liquid crystal waveguide. Reflectors and/or diffraction gratings may also be optically coupled with various facets of the liquid crystal waveguide, and/or a wavelength selective element may be incorporated within the liquid crystal waveguide. Operation 304 provides at least one electrode within the waveguide for adjusting the effective optical path length of the laser cavity. In one example, this first electrode is generally rectangular or square in shape. Operation 304 may provide a plurality of electrodes for providing a coarse adjustment and a fine adjustment, if desired.

Operation 306 provides a second electrode for steering or adjusting the direction of propagation of the laser beam. Operation 306 may provide, in another example, a plurality of electrodes for steering the laser beam, including electrodes for providing a coarse steering adjustment and a fine steering adjustment, if desired. Operations 304-306, in one example, may be positioned within the waveguide so as to provide an electric field to control the operation of LC material in a cladding adjacent the core.

At operation 308, the phase or optical path length of the laser beam may be adjusted by applying a first electrical signal to the first electrode of operation 304. In one example, this first electrical signal may be a voltage applied across the first electrode and a ground plane of the liquid crystal waveguide or other ground plane. The amount or value of the applied voltage will control the amount of phase delay or optical path delay introduced by inducing the liquid crystal material adjacent to a portion of the waveguide core and adjacent to the first electrode to exhibit a particular index of refraction and this index of refraction can be dynamically controlled by operation 312, described below. As light travels through this portion of the core, the liquid crystal material alters the optical path delay of light.

At operation 310, the wavelength of the output laser beam can be selected by applying a second electrical signal to the second electrode. In one example, the second electrical signal is a voltage applied across the second electrode of operation 306 and a ground plane or other point of the liquid crystal waveguide. In one example, the amount or value of the second electrical signal is selected so as to induce the laser beam to be steered or directed to a particular propagation angle within the cavity of the laser. In one example, the laser beam is steered so that it strikes a tuning grating or other wavelength selective element at a particular location so that desired frequencies of light are diffracted from the tuning grating within the laser cavity into the optical laser path, thereby tuning the output laser beam.

At operation 312, the first and second electrical signals are dynamically adjusted in order to provide a laser beam output signal having the desired frequency. For instance, if it is desired to alter the frequency content/wavelength of the output laser beam, then the second electrical signal applied at operation 310 to the electrode of operation 306 can be adjusted appropriately. For mode-hop free tuning, both the optical path length and the wavelength are synchronously adjusted, hence voltage adjustment may be simultaneously made to the first and second electrodes.

Figure 16:
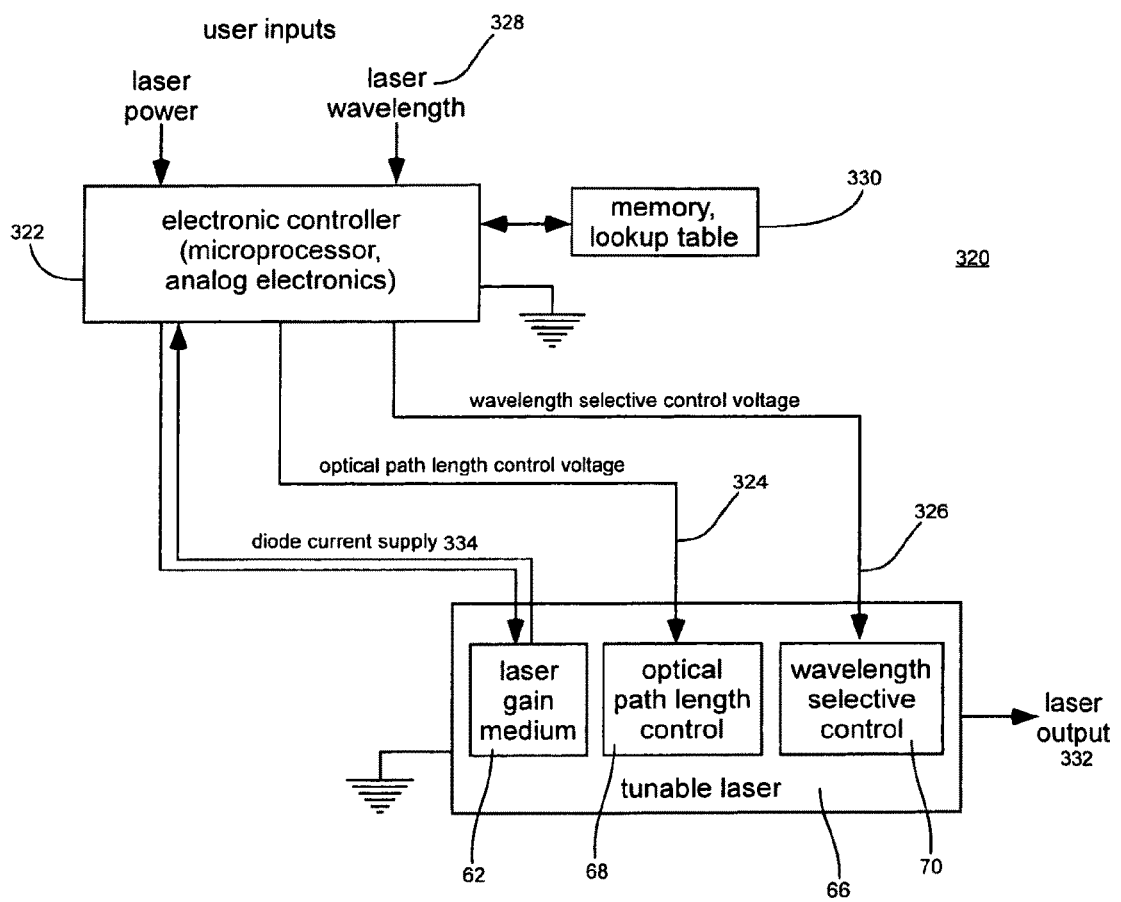
FIG. 16 illustrates a block diagram of a tunable laser system, in accordance with one embodiment of the present invention.

FIG. 16 illustrates a block diagram of a tunable laser system 320, in accordance with one embodiment of the present invention. Embodiments of a tunable laser 66 may be utilized with various conventional elements such as microprocessors, logic, microcontrollers, programmable logic 322, and the like, for providing the control voltages 334, 326 to the tunable laser (e.g., the control voltage 324 for the optical path length control and/or the control voltage 326 for the wavelength selective control).

In FIG. 16, an electronic controller 322, such as a microprocessor (or other logic), receives inputs 328 such as a signal representative of a desired laser wavelength. The electronic controller 322, having a memory or lookup table 330 associated therewith, converts the laser wavelength input signal 328 into an appropriate set of output voltage signals 324, 326 to be provided to the tunable laser. In one example, for instance, the electronic controller 322 receives an analog wavelength signal as an input 328 and converts the analog signal into a digital value. The electronic controller 322 then accesses a table or other data structure in memory 330 to determine a corresponding output control voltage value or values 324, 326 that should be provided to the tunable laser 66 in order to achieve the desired laser wavelength of the laser output 332. For example, the memory 330 may contain a functional relationship between voltages applied to the optical path length control element 68 and the wavelength selective element 70. This functional relationship may permit synchronous adjustment of both optical path length and laser wavelength so as to enable continuous single mode laser frequency tuning. The electronic controller 322 then generates the appropriate output control voltages, for instance through a digital to analog converter or through other conventional means, and the output voltage or voltages 324, 326 are provided to the tunable laser 66 in order to set or adjust the optical path length of the laser cavity and/or to set or adjust the wavelength selective control elements of the tunable laser 66.

The electronic controller 322 may also include analog electronics, such as power supplies, voltage regulators, current sources, and other conventional analog electronics for selectively applying a diode current supply 334 to the laser gain medium 62 of the tunable laser 66.

It is understood that a semiconductor may be formed with one or more of the components shown in FIG. 16. For example, a semiconductor may include a microprocessor 322 coupled with a memory 330, the microprocessor having one or more inputs 328 which contain data corresponding to a desired wavelength of the laser output of the tunable laser. The semiconductor may also include one or more components of the tunable laser as disclosed herein. The microprocessor could include one or more modules for converting the data into voltage values for an optical path length control voltage and/or a wavelength selective control voltage to be applied to the tunable laser 66.

Accordingly, it can be seen that by utilizing one or more features of embodiments of the present invention disclosed herein, a tunable laser may be formed without the need for moving mechanical parts.

While embodiments of the present invention have been described using waveguides having liquid crystal materials 78 therein, it is understood that generally other electro-optic materials can be substituted for liquid crystal materials within the scope of this invention.

In one example, the waveguides disclosed herein operate as single mode waveguides. The light emitted from the laser diode may be coupled into either a single TE mode of the waveguide or a single TM mode of the waveguide. For example, the light emitted from the laser diodes is TE polarized, and the light emitted from the diode laser can be coupled into the waveguide as TE polarized light and processed within the waveguide as TE polarized light. Alternatively, the TE polarized light provided by the diode laser can be converted into TM polarized light through a number of conventional techniques and the waveguide can be designed to process TM polarized light. The conversion of TE to TM polarized light may be achieved by, for example but not limited to, rotating the orientation of laser diode with respect to the waveguide, or alternatively introducing a polarization optic such as a half wave plate which converts TE polarized light to TM polarized light. The half wave plate may be designed to provide sufficient achromatic characteristics to provide suitable polarization over the entire tuning range of the laser. Furthermore, the half wave plate may have anti-reflection coatings applied to minimize both intra cavity laser loss and unwanted optical feedback.

Of course, if desired, one or more features of the present invention may be used with conventional tunable lasers. For instance, an optical path length control element 68 as disclosed herein may be used with conventional mechanical wavelength selective element; or a conventional mechanical optical path length control may be used with a wavelength selective element 70 as disclosed herein.

Formation of a waveguide will now be described. Various electrode shapes are possible and are shown in the attached figures. Further, various techniques may be applied for forming the waveguide, including using one or more patterned or shaped electrodes that alter the effective index of refraction of the waveguide or induce formation of refractive shapes of liquid crystal material. Alternatively, an alignment layer may have one or more regions that define such rectangular or refractive shapes in order to alter the effective index of refraction of the waveguide or to induce formation of refractive shapes of the liquid crystal material. In another example, a cladding may be patterned or shaped to define a region or cavity to contain liquid crystal material in which the liquid crystal materials may interact with the evanescent light so to alter the effective index of refraction of the waveguide or to induce formation of refractive shapes of liquid crystal material therein.

It is understood that FIGS. 17-51 illustrate how liquid crystal waveguides can be formed. While the examples below show and describe prism or wedge shapes for the electrodes or induced liquid crystal shapes, it is understood that the same techniques could be utilized to form rectangular or square shaped electrodes or induced liquid crystal shapes. It is also understood that the dynamic control of effective index of refraction may be utilized for both control of refraction and for control of optical path delay.

Generally and in accordance with an embodiment of the present invention, liquid crystal materials may be disposed within a waveguide in a cladding proximate or adjacent to a core layer of the waveguide. Portions of the liquid crystal material in the cladding can be induced to form refractive shapes in the cladding so as to permit electronic control of the refraction/bending of light as it travels through the waveguide. As disclosed herein, a waveguide may be formed using one or more patterned or shaped electrodes that induce the liquid crystal material in the cladding to form such refractive shapes (see FIGS. 17-36); an alignment layer may have one or more regions that define such refractive shapes and induce the liquid crystal material in the cladding to form (see FIGS. 37-42); or a cladding may have a cavity, region or area defining a refractive shape with liquid crystal material therein in which the liquid crystal material interacts with the guided light may be (see FIGS. 43-48). Various embodiments of a waveguide are described herein.

Figure 17:
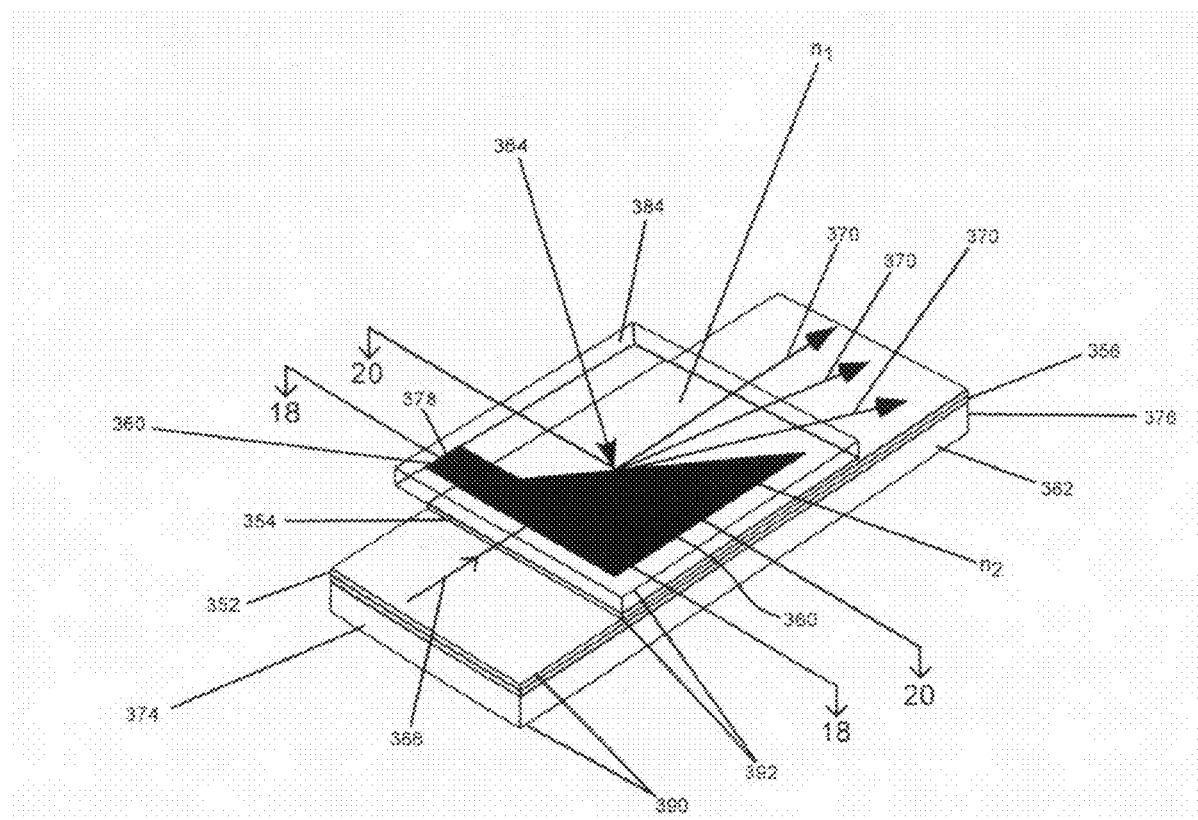
FIG. 17 illustrates an example of a waveguide having a patterned electrode for providing active control of light propagation, in accordance with an embodiment of the present invention.

As shown in FIG. 17, in one example, a waveguide 350 may include a core 352, a pair of claddings 354, 356 surrounding the core 352 wherein one of the claddings (e.g., the upper cladding 354) contains liquid crystal material 358 therein. In one example, one or more electrodes or an electrode layer 360 is positioned above the upper cladding 354 that has the liquid crystal material 358 therein, and a lower electrode or electrode layer or plane 362 is positioned below the lower cladding 356 and acts as a ground plane.

The one or more upper electrodes 360 define one or more shapes. As discussed below, the one or more shapes defined by the upper electrode(s) 360 may be used to controllably refract or bend light as light passes through the core 352 and upper and lower claddings 354, 356 of the waveguide. The upper electrodes 360, also referred to herein as patterned electrodes, may be shaped or patterned in various manners, including generally triangular or wedge shaped for steering light that passes through the waveguide 350.

In general and as discussed below, at least two indices of refraction can be realized within a waveguide made according to embodiments of the present invention. The liquid crystal material 358 which is not beneath the patterned electrodes(s) 360 may be characterized as having a first index of refraction n1, and n1 is generally unaffected by the application of a voltage 368 to the patterned electrodes 360.

The liquid crystal material 358 beneath the patterned electrode(s) 360 can be characterized as having a tunable and dynamic index of refraction n2. In one example, when no voltage 368 is applied to the upper electrode 360, n2 equals n1 and no refraction occurs. As voltage 368 is applied and increased between the upper patterned electrode(s) 360 and the lower electrode plane 362, the index of refraction n2 of the liquid crystal material under the upper patterned electrode(s) 360 is controllably changed as a function of the applied voltage 368. Depending upon the implementation, the applied voltage 368 can be a DC voltage, or an AC voltage, for instance, at low frequencies to high frequencies such as 50 KHz or higher.

Hence, as the difference between n2 and n1 increases, the amount of refraction or bending of light passing through the waveguide 350 can be increased as well. Hence, the amount of bending or refraction of light as it passes through the waveguide 350 can be controlled electronically and without any moving parts. In FIG. 17, the input light beam is shown as 366, and the output light beam is shown as 370, with the output angle of 370 a function of the applied voltage 368, among other things.

As shown in FIG. 17, the waveguide 350 may be generally rectangular in shape and may include a core 352 having a generally rectangular cross-section or defining a parallel piped between walls 372. On the front end 374 of the waveguide 350, light 366 is introduced into the waveguide core 354 and propagates along the length of the waveguide 350 to the distal end 376 of the waveguide 350. As shown in FIG. 17, the direction of propagation of light 366 through the waveguide 350 is generally along the length of the waveguide 350, and use of embodiments of the present invention permit the output propagation direction or angle 370 to be controllably altered depending, in part, on the shapes of the upper electrodes 360 and the voltages 368 applied between the upper electrodes 360 and the lower electrode or plane 362. Although the waveguide 350 in FIG. 17 is shown as generally rectangular, it is understood that a waveguide made according to one or more embodiments of the present invention could have other shapes such as square, trapezoid, parallelogram, any polygon, or even be diced or scribed so as to have rounded edges producing elliptical, circular, or any curved shape.

In one example, the patterned electrode(s) 360 may include a tab or extension therefrom 378 which permits the patterned electrode(s) to be electrically connected to other electrical elements, such as a voltage source 368 coupled between the patterned electrode 360 and the lower electrode or plane 362. Alternatively, electrical traces, conductors, vias or other conventional connection types may be utilized instead of or with tab 378 to electrically couple a patterned electrode 60 to other electrical elements.

Figure 18:
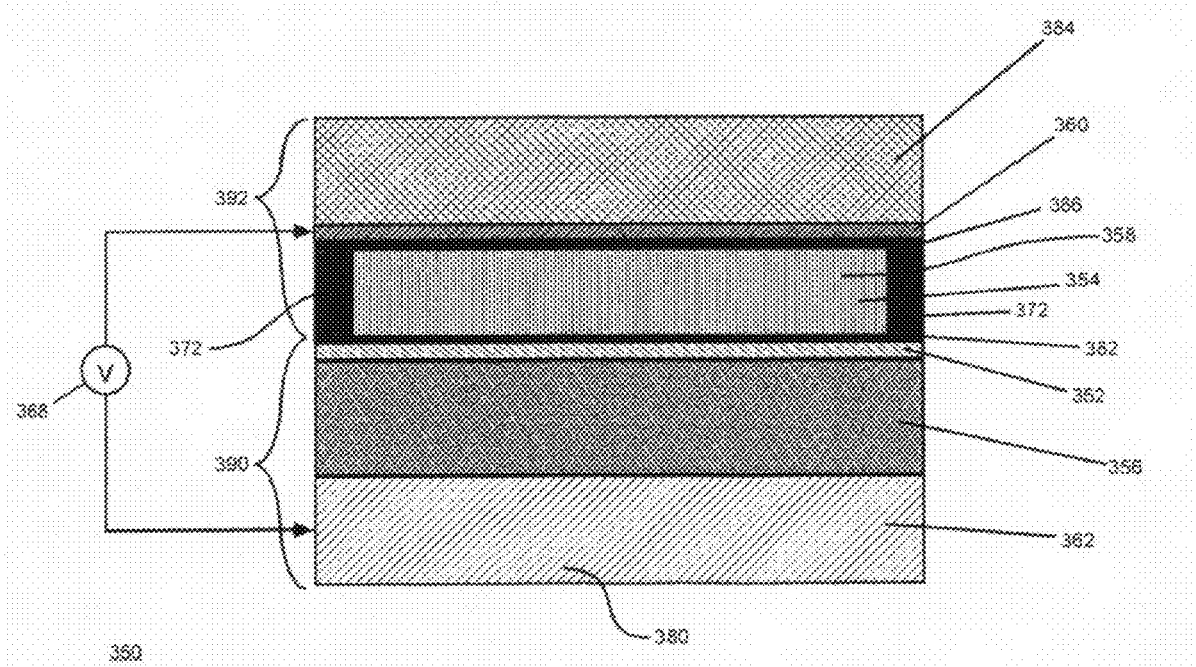
FIG. 18 illustrates a sectional view taken along section lines 18-18 of FIG. 17, illustrating an example of an embodiment of the present invention.

FIG. 18 illustrates a sectional view of a waveguide 350 in accordance with one embodiment of the present invention. As shown in FIG. 18, in one example, a waveguide 350 may include a substrate 380 such as a P-doped silicon substrate or any other conductive material, which provides structural support for the waveguide 350 and also acts as a lower electrode or ground plane 362 to which a voltage 368 may be applied. The substrate 380 may also be formed from any metal, such as silver, copper, aluminum, gold, titanium, etc. Alternatively, the substrate 380 can be nonconductive, such as a glass or crystal, and a conductive coating or electrical ground plane can be applied to the top of the substrate surface, between the substrate 380 and lower cladding 356. This conductive coating can be ITO, Au, Ag, Al, Cu, or any other of a number of conductive coatings. If the substrate 380 is constructed from Si, then circuitry can be directly integrated into the substrate 380 if desired. The conductive substrate 380 is also referred to herein as the lower electrode 362.

A lower cladding layer 356 is provided on the substrate 380 and is preferably made of any dielectric material with low absorption whose index of refraction is less than the index of refraction of the core. Suitable materials include Silicon OxyNitride, Silicon-Rich Nitride, Silicon Nitride, Tantalum Pentoxide, Titanium Oxide, Aluminum Oxide, Niobium, Polymers, Pure Silicon, Ion exchange glass on substances such as Lithium Niobate, Sol-Gel, thermally oxidized silicon, glass. In one example, the interface between the lower cladding 356 and the core layer 352 is transparent so that light can penetrate the lower cladding 356 as it propagates through the core 352.

On top of the lower cladding 356, a waveguide core or core material 352 is provided. In one embodiment, the core 352 does not include any liquid crystal material 58 therein. The core 352 may be made of materials such as any dielectric materials with low absorptions whose index of refraction is greater than the index of refraction of the upper and lower claddings 354, 356. Suitable materials include, but are not limited to, Silicon OxyNitride, Silicon Rich Nitride, Silicon Nitride, Tantalum Pentoxide, Titanium Oxide, Aluminum Oxide, Niobium, Polymers, Pure Silicon, Ion exchange glass on substances such as Lithium Niobate, Sol-Gel, thermally oxidized silicon, glass. In one example, the core 354 has a thickness that is tapered or includes a channel. Furthermore, a core 354 may have a constant index of refraction along the length of the waveguide 350, or alternatively have an index of refraction that varies across or along the device.

On top of the core layer 352, an alignment layer 382 (shown as the lower alignment layer 382 in this example) is provided which is used to initially align or bias the orientation of liquid crystal material 358 that is proximate to or adjacent to the alignment layer 382 and the core 352. Alignment can be achieved, for example, by buffed polyimide, nylon, or other polymer coating applied to the core 352 and or the cover plate 384, photo-aligned polyimide, polymer or other photo-aligned material, angle deposited SiO, SiO2 or other angle deposited material, microgrooves etched or directly e-beam written into the core 352 and or cover plate 384, ion-buffed surfaces on the core or lower cladding, a dispersed polymer matrix that is photoaligned, or direct buffing of either surface.

In one example the alignment layer 382 may be a coating or layer that induces a homeotropic alignment in the liquid crystal 358. In one example, the lower alignment layer 382 is generally transparent.

On top of the lower alignment layer 382, the upper cladding 354 is provided having liquid crystal material therein 358. In one example, the interface between the lower alignment layer 382 and the upper cladding 354 is transparent. The liquid crystal material 358 may include, but is not limited to, any nematic liquid crystal, with either a positive dielectric constant or a negative dielectric constant or a mixture of each, polymer dispersed liquid crystal material, Smectic A* and C* liquid crystal material, cholesteric liquid crystal material such as ferroelectrics and surface stabilized ferroelectrics, or dual-frequency liquid crystal material, for example. While the various figures herein show the liquid crystal material 358 as being nematic liquid crystal, it is understood that embodiments of the present invention may utilize other types of liquid crystal material.

In one example, the upper cladding 354 is formed using spacer material to define a region or volume wherein liquid crystal material 358 may be contained therein, and optically transparent glue such as Norland 68 may be used to create transparent boundary walls 372 to contain the liquid crystal 358.

On top of the upper cladding 354, an upper alignment layer 386 may be provided to initially align or bias the orientation of liquid crystal material 358 that is adjacent to or proximate to the upper alignment layer 386. As with the lower alignment layer 382, alignment can be achieved, for example, by buffed polyimide coating, photo-aligned polyimide, angle deposited SiO and or SiO2, microgrooves etched or otherwise formed, ion-buffed surfaces, a dispersed polymer matrix that is photoaligned, or direct buffing. In one example, the upper alignment layer 386 is generally transparent.

The alignment of the liquid crystal 358 between the lower and upper alignment layers 382, 386 can be anti-parallel, parallel, twisted, or hybrid between twisted and parallel or anti-parallel. The direction of liquid crystal alignment can be at any angle with respect to the direction of light propagation 366. Described below are examples of where the alignment of the liquid crystal materials 358 is adapted to provide for refraction of TE or TM polarized light as it passes through a waveguide made according to embodiments of the present invention.

On top of the upper alignment layer 386 and below the glass cover 384, a patterned electrode layer 360 or portions of the patterned electrode layer 360 are present. In one embodiment, the patterned electrode layer 360 includes one or more electrodes having non-normal interfaces 364 relative to the orientation of light 366 traveling through the waveguide 350. In one example, the patterned electrode layer 360 is a conductive coating applied to the bottom surface of the glass cover 384. The conductive coating can include, but is not limited to, ITO, Au, Ag, Al, Cu, or any other conductive coating. In another example, the patterned electrode 360 can be p-doped silicon or any metal, such as silver, copper, aluminum, gold, titanium, alloys, or other conductive material, etc. In one example, the glass cover 384 may be made of materials such as, but not limited to, standard float glass such as Corning 1737, fused silica, or any flat surface. Since the evanescent portion of the light preferably does not pass through the cover plate 384, the cover plate 384 can be made from non-transparent materials such as silicon wafers, ceramics, or polished metal surfaces. In another embodiment, the cover plate 384 may be a metal or any other conductive material and serve as the upper electrode.

Using the structure of FIGS. 17-18 or variations thereof, various different waveguides 350 can be formed to selectively and controllably refract light 366 as it passes through the waveguide 350. When a voltage 368 is applied between the patterned electrode(s) 360 and the substrate 380, an electric field is formed between the patterned electrode 360 and the substrate 380 which induces movement of the liquid crystals 358 in the upper cladding 354 that are subject to the applied electric field. As the liquid crystals 358 move or change their orientation based on the applied voltage, the index of refraction of the affected portion of the upper cladding 354 is changed relative to the index of refraction of the non-affected portions of the liquid crystal material 358 in the upper cladding 354. As shown in FIG. 17, the portion of the waveguide 350 which is not affected by the electric field created between the patterned electrode 360 and the substrate 380 can be characterized as having a first index of refraction (shown as n1), while the portion of the waveguide 350 affected by the electric field created between the patterned electrode 360 and the substrate 380 may be characterized as having a second index of refraction (shown as n2). Under Snell's Law, light refracts when crossing an interface 364 between two different indices of refraction if the interface 364 is oriented in a non-normal relation to the direction of propagation of light 366. In FIG. 17, the patterned electrode 360 has a non-normal interface 364 on its distal trailing edge, so that as light 366 propagates through the waveguide 350 from the front end 374 to the distal end 376 of the waveguide 350, light 366 is refracted or steered (shown as 370) in a controlled manner depending upon the amount of voltage 368 applied between the patterned electrode 360 and the substrate 380.

Preferably, the core layer 352 is surrounded by an upper and lower cladding 354, 356, wherein the interfaces between the lower cladding 356 and the core layer 352 and between the upper cladding 354 and the core layer 352 are transparent. As light 366 enters the core layer 352 and propagates through the core 352 along the length of the waveguide 350, the evanescent portion of the propagating light 366 waves penetrates into both the upper and lower cladding 354, 356. Preferably, the core layer 352 has a fixed index of refraction, and the lower cladding also has a fixed index of refraction. By providing liquid crystal material 358 within the upper cladding 354, a portion of which is controllably subjected to an electric field between the patterned electrode 360 and the substrate 380, the index of refraction (n2) of the upper cladding layer 354 can be controllably altered. Stated differently, the average index of refraction (also referred to herein as the effective index of refraction, or index of refraction) of the upper cladding 354, core 352, and lower cladding 356 as experienced by a single TM or TE mode of light in the waveguides can be controllably altered by altering the index of refraction (n2) of the upper cladding 354. Hence, as light 366 passes through the waveguide core 352 and upper and lower cladding 354, 356, the light 366 can be controllably refracted, steered, or delayed (370) through the use of the upper electrode 360. Because the liquid crystal material 358 is disposed within the upper cladding 354 and interacts primarily with the evanescent portion of the light wave 366 and the fundamental portion of the light wave 366 passes through the core material 352, there is no significant attenuation of the intensity of the light 366 as the light 366 passes through the waveguide 350. This permits the length of the waveguide 350 to be beneficially long so that numerous electrodes 360 can be utilized in a cascade or series arrangement if desired, for example as in FIGS. 32-34.

Furthermore, in one example, the evanescent portion of the light 366 is only interacting with the liquid crystal molecules 358 that are close to the alignment layer 382. These molecules 358 are more highly ordered than liquid crystal molecules 358 further away from the alignment layer 382 and therefore scatter less light. In one example, the losses are sufficiently low (e.g., less than 0.5 dB/cm) that the waveguide 350 length can be lengthy (e.g., 4 inches or greater).

In one embodiment of the invention, a waveguide 350 may be formed having a first and second assembly 390, 392, wherein the first and second assemblies 390, 392 are attached to one another in order to form the overall waveguide 350. As shown in FIG. 18, the first assembly 390 may include the substrate 380, the lower cladding 356, the core 352, and the lower alignment layer 382; and the second assembly 392 may include the glass cover 384, the patterned electrode(s) 360, the upper alignment layer 396 and upper cladding 354 with liquid crystal material 358 therein. One method for forming a waveguide is illustrated below in FIGS. 19 and 30.

While FIGS. 17-18 show a particular arrangement of layers of a waveguide according to one embodiment of the present invention, it is understood that the present invention contemplates variations of this arrangement. For instance, the patterned electrode(s) 360 may be positioned in a different layer than as shown in FIG. 17-18, such as proximate the lower portion of the waveguide 350 (see FIG. 28 as an example). The conductive lower electrode 362 may also be positioned at different layers within the waveguide if desired. Further, while two alignment layers 382, 386 are shown, the invention may include a single alignment layer. While the liquid crystal material 358 is shown as disposed within the upper cladding 354, it is understood that the liquid crystal material 358 may be disposed in the lower cladding 356 if desired.

Figure 19:
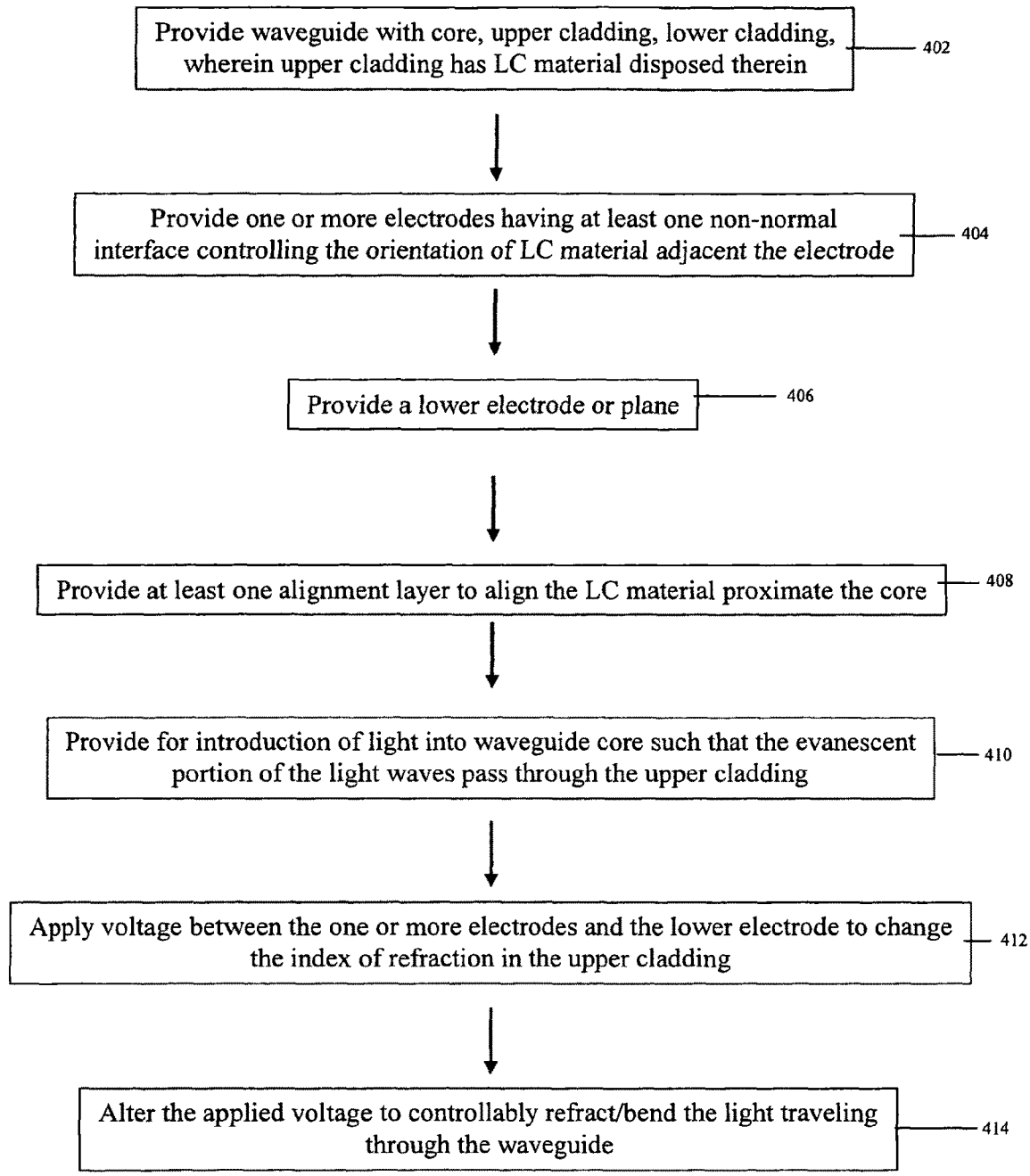
FIG. 19 illustrates an example of operations for forming a waveguide having patterned electrodes for controlling light, in accordance with an embodiment of the present invention.

FIG. 19 illustrates an example of operations 400 for controlling the refraction of light through a waveguide, in accordance with one embodiment of the present invention. At operation 402, the waveguide is provided with a core, an upper cladding, and a lower cladding where in one example the upper cladding has liquid crystal material disposed therein. Alternatively, liquid crystal material may be disposed within the lower cladding if desired. At operation 404, one or more electrodes are provided for controlling the orientation of the liquid crystal material proximate the one or more electrodes, wherein the one or more electrodes have at least one non-normal interface relative to the direction of propagation of light through the waveguide. As discussed above, the non-normal interface results in refraction, steering, or bending of light as light exits the non-normal interface. At operation 406, a second electrode or ground plane is provided. In one example, a substrate material of the waveguide is electrically conductive and acts as a lower electrode or ground plane so that a controlled voltage can be applied between the patterned electrode and the substrate to create an electric field therebetween.

At operation 408, at least one alignment layer is provided to align the liquid crystal material proximate the core. For instance, a lower alignment layer (such as 382 in FIG. 18) can be provided to initially align or bias the liquid crystals within the upper cladding and adjacent to the lower alignment layer. By providing the alignment layer, the liquid crystal material responds to an applied voltage in a faster and more orderly and predictable manner. Further, when no voltage is applied to the liquid crystal material, the alignment layer provides sufficient liquid crystal ordering to minimize scattering of the light propagating through the waveguide because the evanescent portion of the light interacts primarily with the highly ordered liquid crystal molecules along the alignment layer.

At operation 410, the introduction of light is provided into the waveguide core such that as the primary or fundamental portion of the light input into the waveguide travels through the core, and the evanescent portion of the light passes through the upper and lower claddings of the waveguide. In one example, operation 410 is achieved by prism coupling, grating coupling, end-fire coupling, butt coupling, or other conventional coupling techniques. In another embodiment, polarized light (such as TE or TM polarized light) is introduced into the waveguide and operation 408 provides a liquid crystal orientation that is adapted to controllably refract or steer the polarized light.

At operation 412, a voltage is applied between the one or more electrodes and the lower electrode in order to change the effective index of refraction of the materials between the one or more electrodes and the lower electrode. By altering the refraction of the liquid crystal material under the patterned electrodes (e.g., shown as n2 in FIG. 17), a modulation index or change in the index of refraction (referred to as $\Delta N$) is achieved. As the modulation index $\Delta N$ increases, the amount of light beam refraction also increases, which permits active, solid state control of the amount of refraction of light passing through the waveguide. At operation 414, the amount of applied voltage may be altered to controllably refract or bend the light traveling through the waveguide.

In one example of waveguides formed in accordance with embodiments of the present invention, various degrees of modulation index through waveguides were achieved, and are summarized in Table 1 and Table 3. Hence, it can be seen that by the operations of FIG. 19, light can be controllably refracted or steered as it passes through a waveguide.

Embodiments of the present invention can be used to selectively control the index of refraction for particular types of polarized light, such as TM polarized light and TE polarized light. Generally, TM (Transverse Magnetic) polarized light means that the magnetic field of the light wave is traversing the plane of the waveguide, while the electric field is substantially perpendicular to the plane of the waveguide. TE (Transverse Electric) polarized light is characterized by the electric field of the light traversing the plane of the waveguide, while the magnetic field of the light is substantially perpendicular to the plane of the waveguide.

Figure 20:
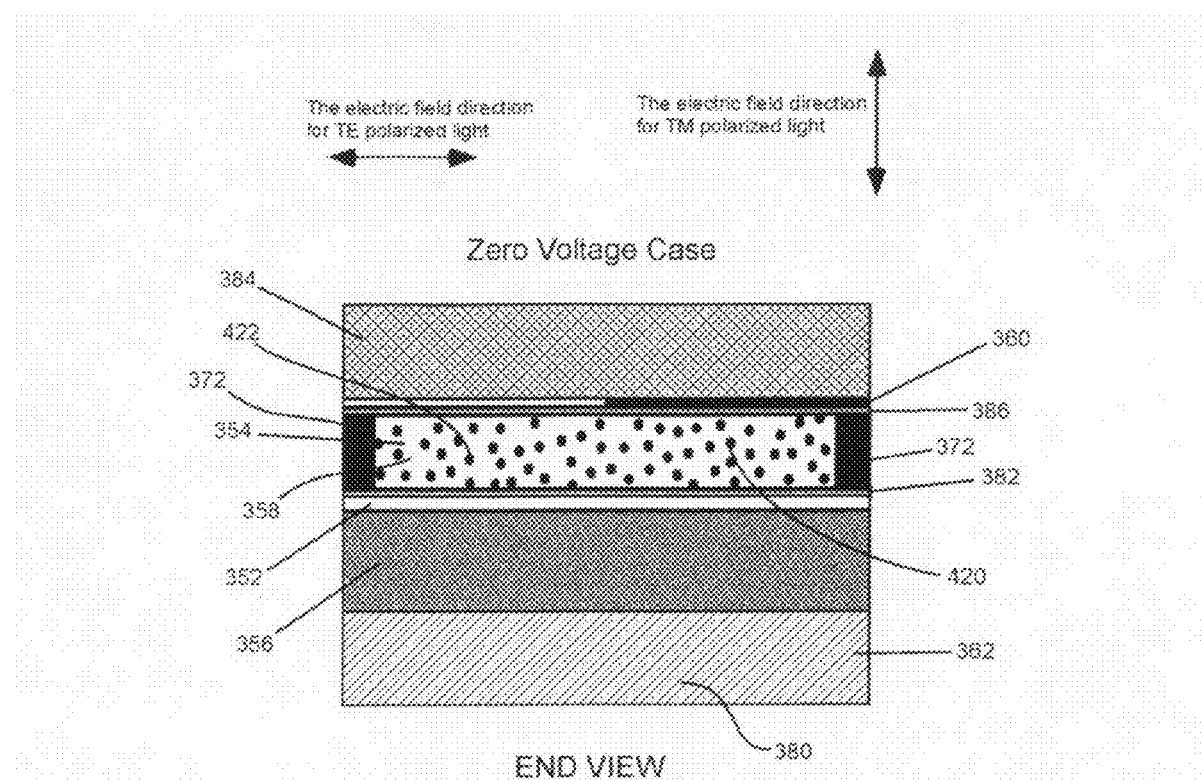
FIG. 20 illustrates a sectional view of the waveguide along section lines 20-20 of FIG. 17 where no voltage is applied to the patterned electrode, in accordance with one embodiment of the invention.
Figure 21:
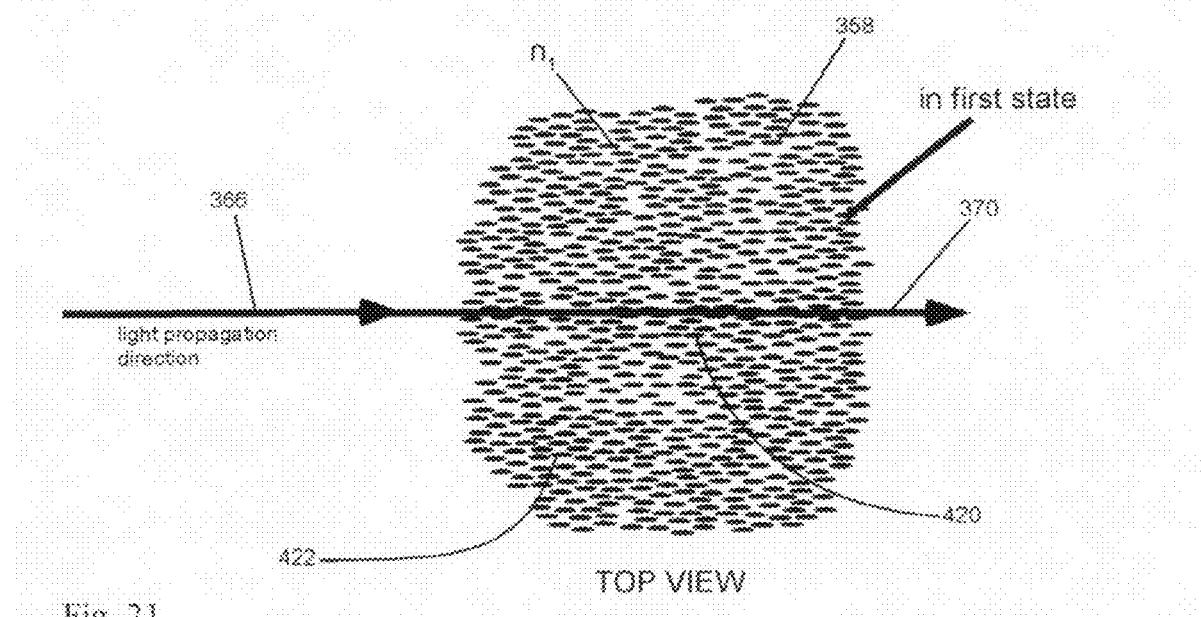
FIG. 21 illustrates a top view of the liquid crystals as oriented in the upper cladding of FIG. 21 where no voltage is applied to the patterned electrode, in accordance with one embodiment of the present invention.
Figure 22:
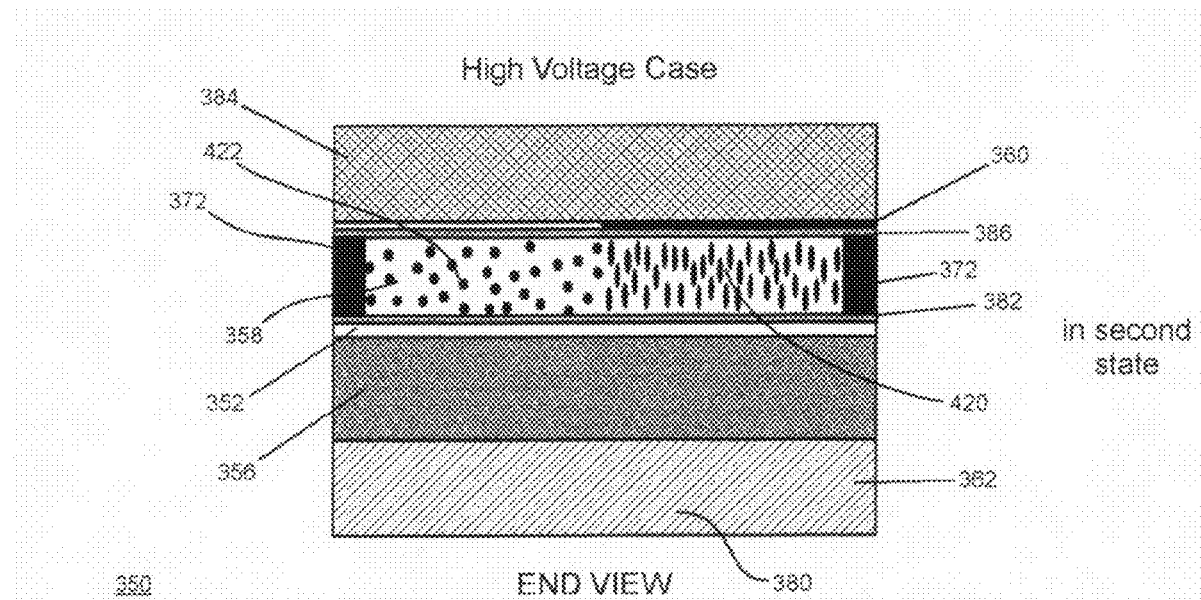
FIG. 22 illustrates a sectional view of the waveguide along section lines 20-20 of FIG. 17, wherein a voltage is applied to the patterned electrode so as to alter the orientation of the liquid crystal material under the patterned electrode, in accordance with one embodiment of the present invention.
Figure 23:
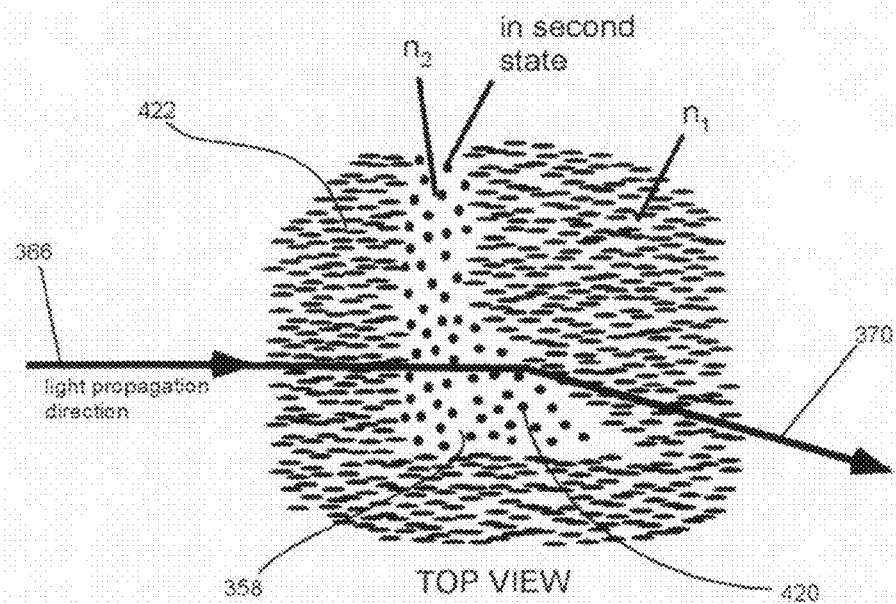
FIG. 23 illustrates a top view of the liquid crystal material in the upper cladding of FIG. 22, when a voltage is applied to the patterned electrode, in accordance with one embodiment of the present invention.

FIGS. 20-23 and 24-27 illustrate various examples of how embodiments of the present invention may be used to refract or steer light that has been polarized either as TE or TM polarization. Referring to FIGS. 20-23, if the liquid crystals 358 disposed within the upper cladding 354 are initially aligned (e.g., through the use of the lower and upper alignment layers 382, 386) in such a way that the long axis of the liquid crystals 358 are aligned in parallel with the direction of light propagation 366 through the waveguide 350 (FIGS. 20-21 show this situation when no voltage 368 is applied to the electrodes 360, 362), then when voltage 368 is applied to the electrodes 360, 362, the liquid crystals 420 beneath the patterned electrode 360 respond by rotating upwardly in a plane containing the applied electric field vector and the propagation vector of the light 366. The liquid crystals 422 that are not beneath the electrode 360 generally maintain their orientation. When the long axis of the affected liquid crystals 420 are perpendicular to the direction of propagation of light 366 through the waveguide 350, or the long axis of the affected liquid crystals 420 are at intermediate stages such that they are not parallel to the propagation vector 366 (see FIGS. 22-23), then light 366 which is TM polarized experiences a higher index of refraction within the volume of liquid crystals 420 beneath the patterned electrode 360. This is because the E field of the propagating light 366 interacts more strongly with the LC molecules 420 when the LC molecules 420 are perpendicular to the direction of propagation of TM polarized light. Accordingly, as seen in FIGS. 20-23, a waveguide 350 can be formed that can controllably refract, steer, or slow light which is TM polarized. In one example, the light 366 is TM polarized before it enters into the waveguide (FIG. 23).

In FIGS. 20-23, light 366 which enters the waveguide 350 with a TE polarization would not be affected, refracted, or have it's index altered by the movement of the affected liquid crystals 420 into the second state because the electric field of TE polarized light experiences the same interaction with the liquid crystals 420 in both the first state and the second state. In other words, in one example, the electric field of the TE polarized light is perpendicular to the long axis of the molecules.

Figure 24:
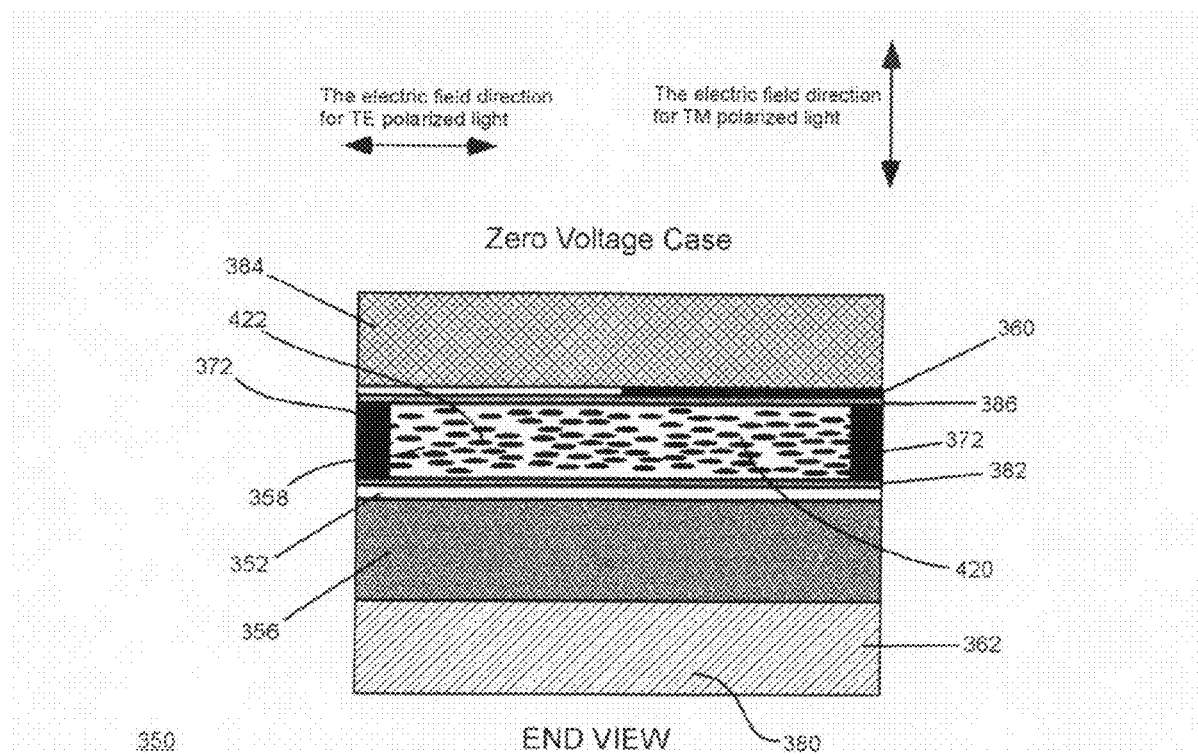
FIG. 24 illustrates a sectional view of the waveguide along section lines 20-20 of FIG. 17 where no voltage is applied to the patterned electrode, in accordance with one embodiment of the present invention.
Figure 25:
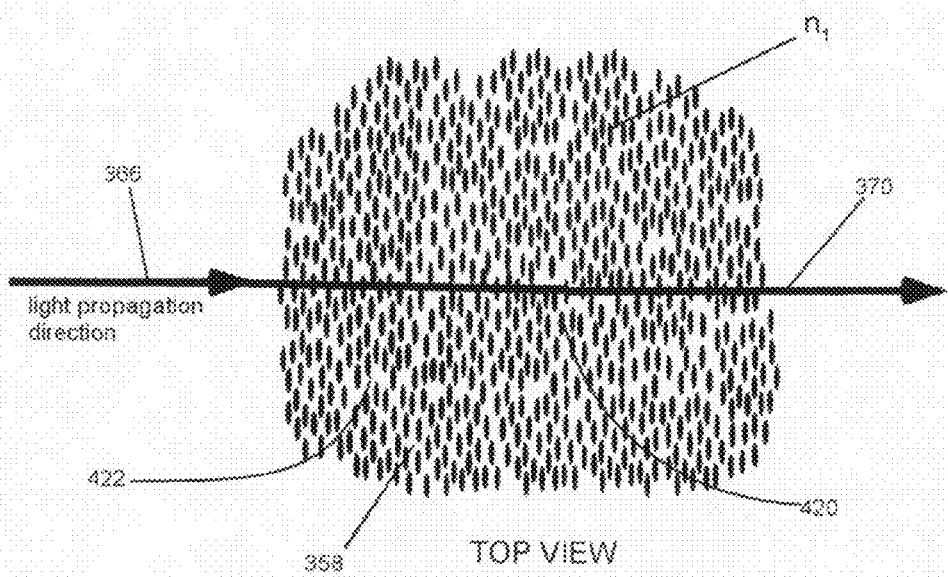
FIG. 25 illustrates a top view of the liquid crystal material within the upper cladding of the waveguide of FIG. 24 where no voltage is applied to the upper electrode, in accordance with one embodiment of the present invention.
Figure 26:
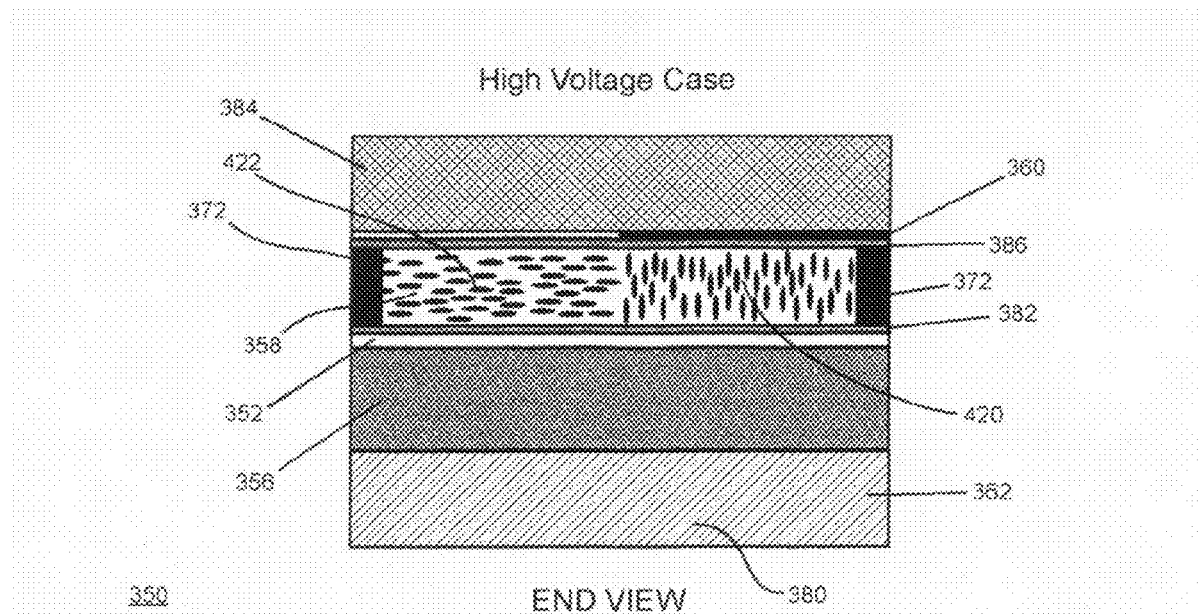
FIG. 26 illustrates a sectional view of the waveguide of FIG. 17 taken along section lines 20-20, when a voltage is applied to the patterned electrode so as to change the orientation of the liquid crystal material under the patterned electrode, in accordance with one embodiment of the present invention.
Figure 27:
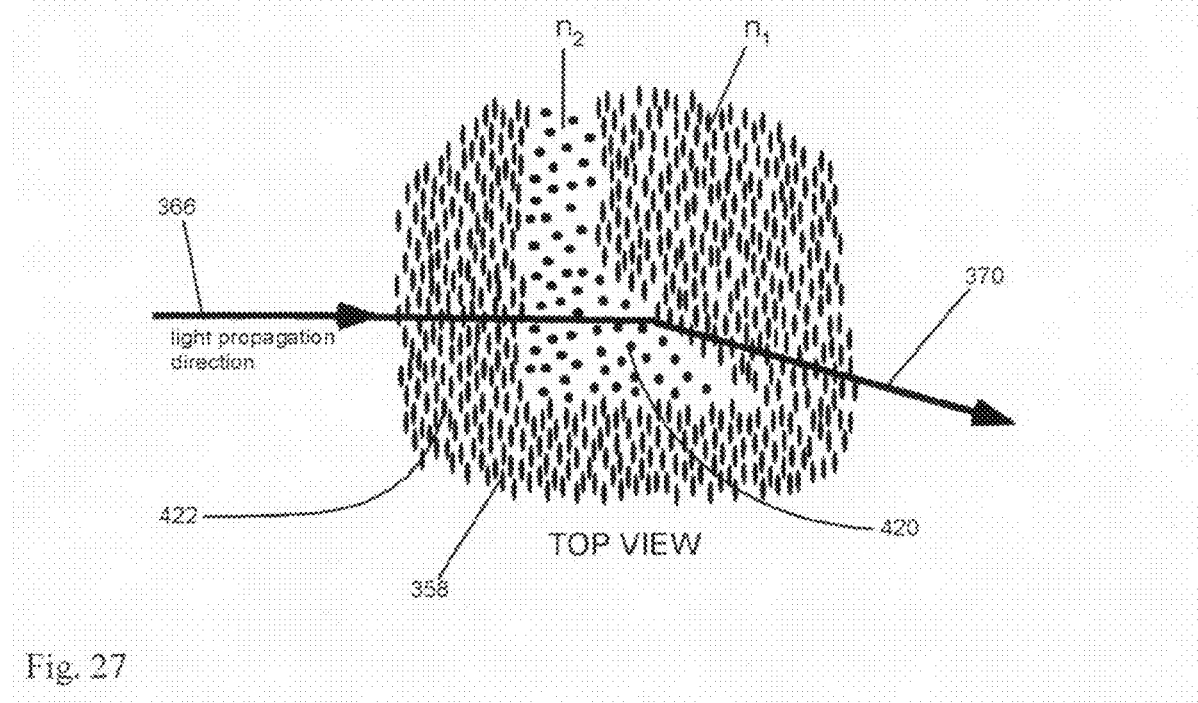
FIG. 27 illustrates a top view of the liquid crystal material within the upper cladding of FIG. 26 when a voltage is applied to the patterned electrode, in accordance with one embodiment of the present invention.

With regard to FIGS. 24-27, these figures illustrate an embodiment of the present invention wherein the liquid crystals 358 disposed within the upper cladding 354 are aligned with their long axis perpendicular to the direction of propagation 366 of light through the waveguide 350. Again, the alignment of the liquid crystals 358 can be biased or initially aligned through the use of the upper and lower alignment layers 386, 382. In this embodiment, light which is TE polarized can be refracted, steered, or have it's index altered as it travels through the waveguide 350, and further, light which is TM polarized that enters the waveguide 350 can also be refracted, steered, or have it's index of refraction altered as it travels through the waveguide 350. FIGS. 24-25 show the liquid crystals 358 in their initial, first, or zero voltage state, where the liquid crystals 358 have been aligned with their long axis perpendicular to the propagation 366 of light traveling through the waveguide 350. For light that is TE polarized prior to entry into the waveguide 350, the orientation of the liquid crystals 358 in the initial or first state provides a larger index of refraction than when the liquid crystals 358 are oriented vertically upward in the second state (FIGS. 26-27). Accordingly, TE polarized light can be refracted, steered, or have it's index of refraction altered through the use of this embodiment of the present invention. Likewise, TM polarized light can be refracted as well. For TE polarized light, in the second state where the voltage is on, n1 is greater than n2. For TM polarized light, in the second state where voltage is on, n2 is greater than n1.

Figure 28:
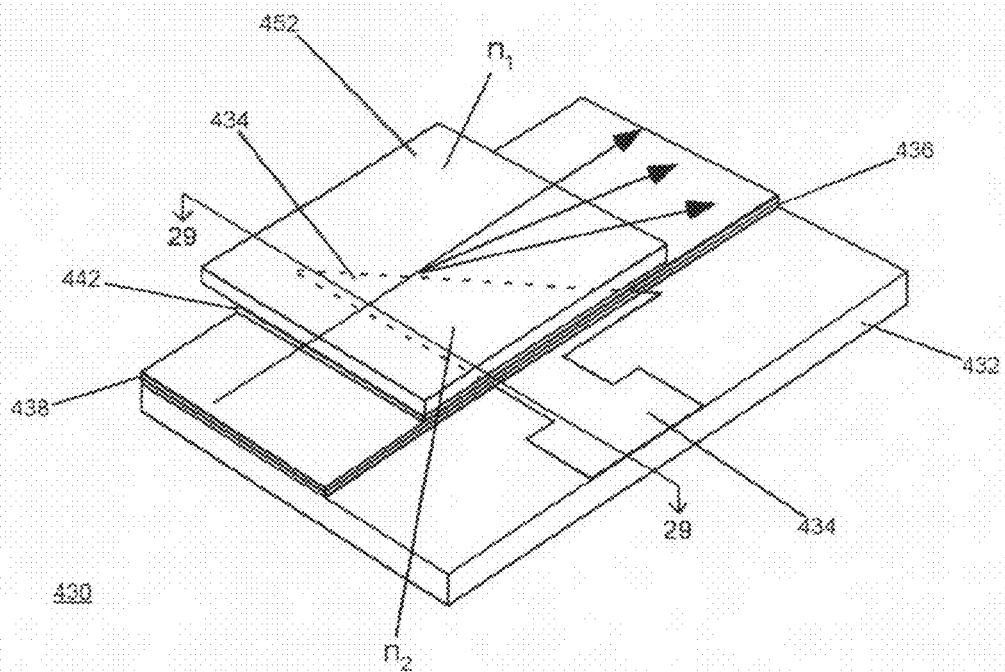
FIG. 28 illustrates an alternative embodiment of the present invention wherein a patterned electrode is positioned between the substrate and the lower cladding of a waveguide, in accordance with one embodiment of the present invention.
Figure 29:
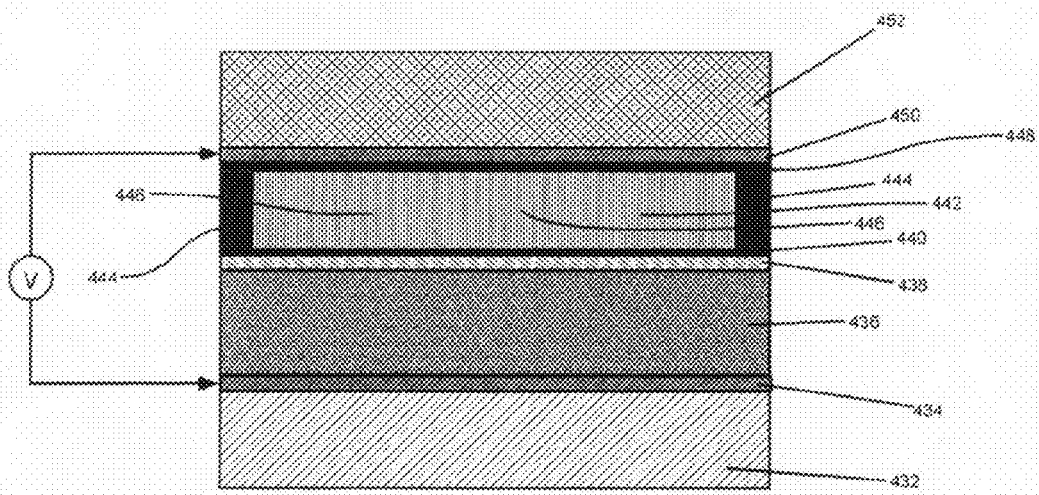
FIG. 29 is a sectional view of a waveguide taken along section 29-29 of FIG. 28, in accordance with one embodiment of the present invention.

While FIGS. 17-27 illustrate one example of the present invention, it is understood that the principles of the present invention could be employed in other arrangements of liquid crystal waveguides, and one such example is illustrated in FIG. 28. In FIG. 28, an alternative embodiment of a waveguide 430 is illustrated in accordance with the present invention. In this example, the ordering of the layers of the waveguide 430 are changed when compared with FIGS. 17-18. In FIG. 28, a substrate 432 defines the lower portion of the waveguide 430 and a patterned electrode 434 is placed on top of the substrate 432 (see also FIG. 29). As shown in FIG. 29, a lower cladding 436 made of non-electro-optic material may be placed on top of the electrode layer 434. The core 438 layer may be placed on top of the lower cladding 436, and a lower alignment 440 layer may be placed on top of the core layer 438. An upper cladding 442 having walls 444 with liquid crystal materials 446 therein may be placed on top of the lower alignment layer 440, and an upper alignment layer 448 may be placed on top of the upper cladding 442. A conductive layer or plane 450 may be placed on top of the upper alignment layer 448, and a cover plate 452 may be placed on top of the conductive layer 450. In this embodiment, the liquid crystals 446 are disposed within the upper cladding 442. It is understood that the liquid crystals 446 could be disposed within the lower cladding 436 if desired, and the alignment layers 440, 448 could be placed on the upper and lower surfaces of the lower cladding 436 having the liquid crystal material 446 therein.

Figure 30:
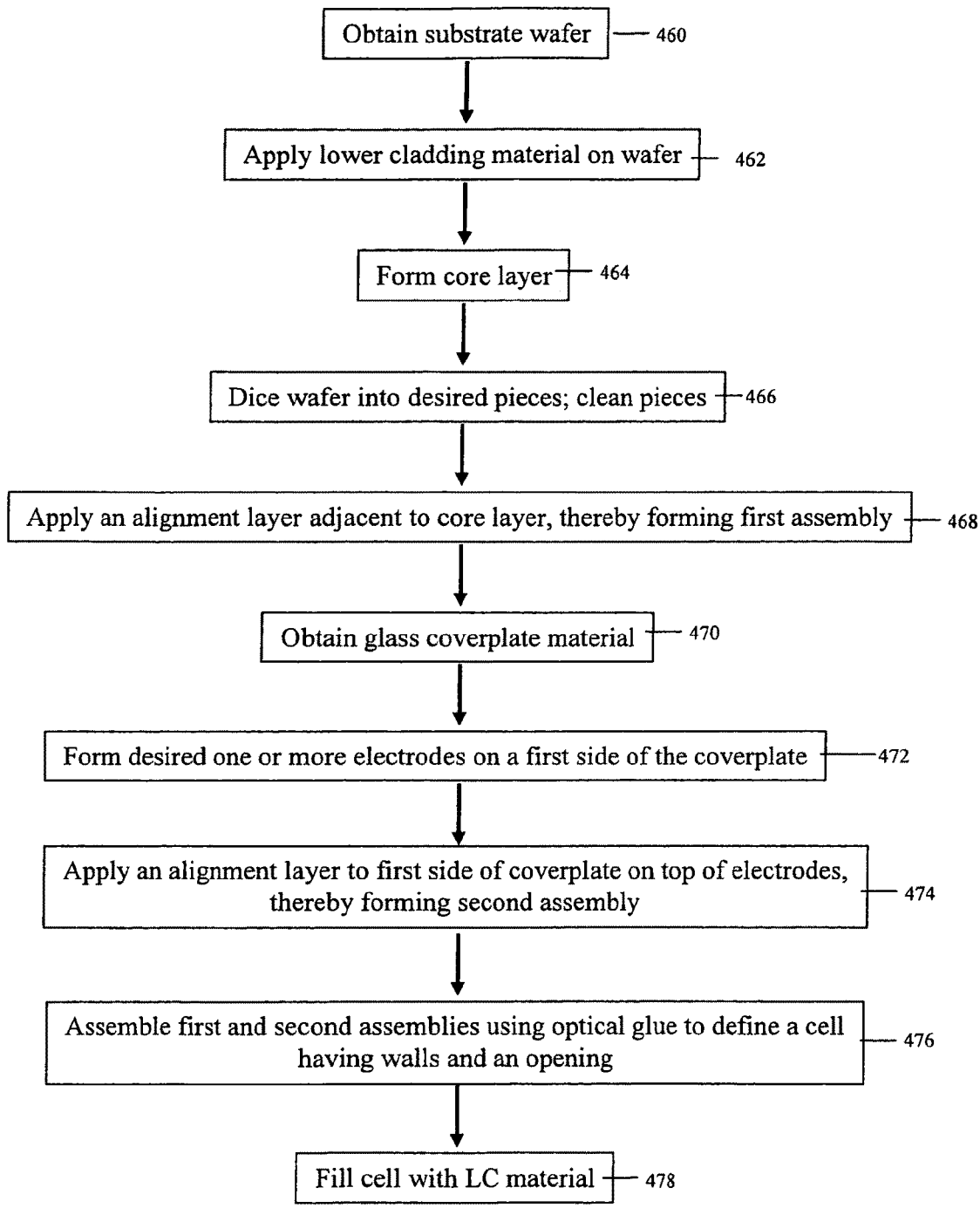
FIG. 30 illustrates an example of operations for forming a waveguide having one or more patterned electrodes for controlling the propagation of light through the waveguide, in accordance with one embodiment of the present invention.

FIG. 30 illustrates an example of operations that may be used for making one example of a waveguide in accordance with one embodiment of the present invention. In making a waveguide, the materials described with reference to FIGS. 17-18 or as described otherwise herein may be used and conventional materials may be used. At operation 460 of FIG. 30, a substrate wafer is obtained for forming the base of the waveguide. In one example, the substrate wafer is a P-doped, polished silicon substrate wafer such that the substrate can act as the lower electrode, for example as in the embodiment of FIGS. 17-18. At operation 462, a lower cladding material is applied onto the substrate wafer. At operation 464, the core layer is formed on top of the lower cladding material, in one example. At operation 466, in one example, the wafer is diced into desired pieces, wherein each piece will form a separate waveguide, and be cleaned if desired. A conventional dicing saw for semiconductor substrates may be used. Cleaning may include cleaning in an ultrasonic cleaner with a mild soap or solvent, or cleaning with methanol wipes. Also, stresses from the coating process under which the waveguides are made may induce warp and bow, which can be removed via optically contacting the waveguide to an optical flat or stiffener plate. In another example, using wafers polished on both sides and applying thermally grown SiO2 on both sides, to a thickness of about 2 microns, can reduce the warp and bow. This thermally grown $SiO_2$ layer may serve as the lower waveguide cladding.

At operation 468, for each piece, an alignment layer is applied adjacent to the core layer, and this combination may form a first assembly. There are several methods of applying the alignment layer, most of which are standard for liquid crystal cells. These include: i) spin coat a polyimide layer, which is then buffed with a cloth (to provide directionality); ii) buff the waveguide directly; iii) oblique deposition of an SiO or SiO2 layer; iv) photo-align a spin-coated polyimide or other polymer layer via exposure to polarized light (see FIGS. 37-41 below); v) microgrooves (see FIGS. 37-41 below); and vi) angled ion buffing; vii) spin coat a polymer layer such as polystyrene, isotactic polystyrene, nylon, or other polymer, which is then buffed with a cloth.

A second assembly may be formed by operations 470, 472, 474. At operation 470, a piece of glass cover plate material is obtained, and at operation 472, one or more electrodes are formed on a first side of the glass cover plate material, wherein at least one of said one or more electrodes has a non-normal edge or interface relative to the axis or direction that light will propagate relative to the cover plate. Operation 472 may be implemented by applying a coating such as an indium tin oxide (ITO) layer or any conductive layer, e.g., gold, aluminum. After this coating is applied it can be patterned via standard photo-lithographic processes.

At operation 474, an alignment layer may be applied to the first side of the cover plate on top of the electrodes, thereby forming a second assembly. This can be achieved in the same manner as operation 468. At operation 476 the first and second assemblies are joined together, preferably using optical glue to define a cell having three walls and an opening along the fourth wall. At operation 478, the cell is filled with liquid crystal material, and this filled structure may form the upper cladding in the example of FIGS. 17-18. Operation 478 may be implemented by establishing the cell thickness by mixing spacer balls (typically 3-10 microns) into the glue that attaches the cover plate to the waveguide. The cover plate is glued around the edges, but not in the middle, leaving a cavity.

A small hole is left in the glue seal, which is used to fill the cavity with liquid crystal material. The cell created by the waveguide and cover plate is then filled with liquid crystal. A small drop of liquid crystal material, placed at the opening or hole in the glue seal, will wick into the cell. This can be done with only one opening or hole under vacuum, or with two holes at standard air pressure. The cell and liquid crystal may be held at an elevated temperature during the fill process. For example, the temperature may be chosen so that the liquid crystal is in the isotropic phase, which may provide a more uniform liquid crystal alignment. After the cell is filled, the opening/hole in the glue seal is covered with more glue.

It is understood that FIG. 30 is provided for illustrative purposes only, and that these operations could be interchanged, subdivided, regrouped, or reordered depending upon the particular implementation and the particular waveguide being made. For instance, the operations could be re-ordered so as to form the waveguide 430 of FIGS. 28-29, or other waveguide structures.

Figure 31:
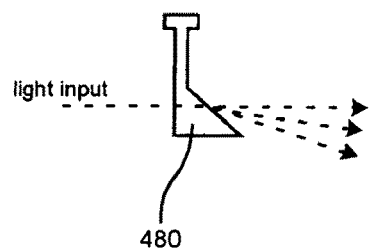
FIG. 31 illustrates an example of a patterned electrode for controlling light propagating through a waveguide, in accordance with an embodiment of the present invention.
Figure 32:
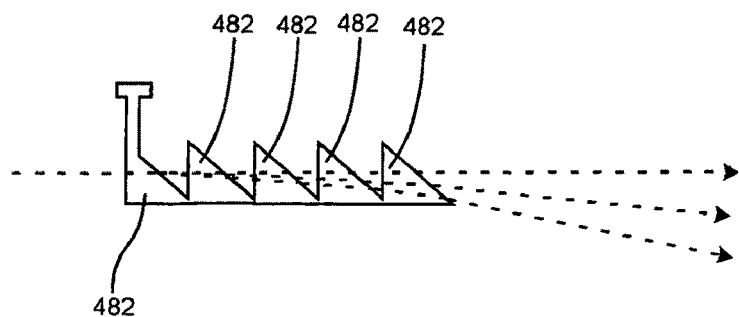
FIG. 32 illustrates another example of a patterned electrode for controlling light propagating through a waveguide, in accordance with an embodiment of the present invention.
Figure 33:
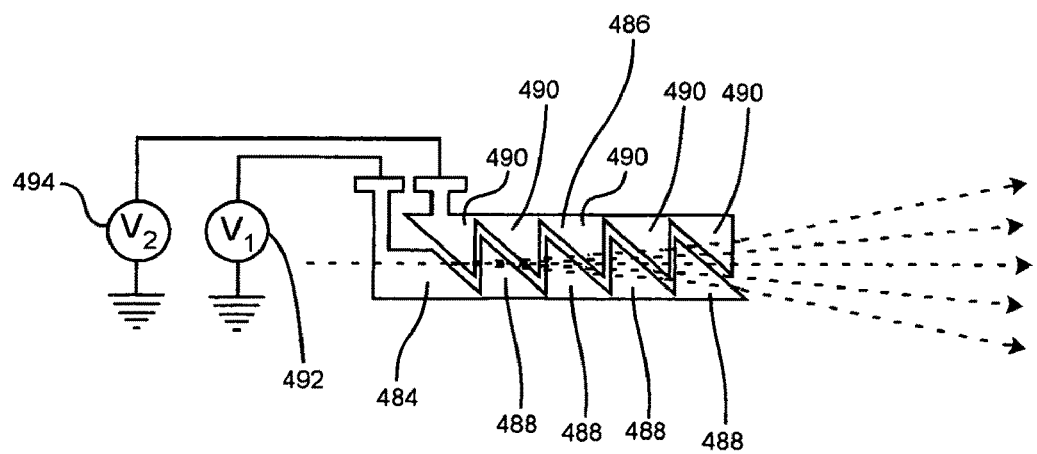
FIG. 33 illustrates an example of a pair of patterned electrodes for controlling light propagating through a waveguide, in accordance with an embodiment of the present invention.

In accordance with embodiments of the present invention, a patterned electrode 360, 434 may take various shapes depending upon the particular application. FIGS. 31-35 illustrate various examples of shapes for electrodes, such as electrodes 360, 434. If it is desired to refract or steer light over a small angle, then a simple wedge shape 480 as shown in FIG. 31 may be used for an electrode. If a larger amount of refraction is desired, then an electrode can include multiple wedge shapes 482 cascaded together and electrically coupled together so that each successive wedge 482 provides a greater amount of refraction of the light received from the preceding wedge, as shown in FIG. 32. In FIG. 33, an electrode can include a first and second electrode 484, 486 wherein the first and second electrode 484, 486 are electrically isolated. The first electrode 484 may provide a plurality of wedge shapes 488 in series for refracting or steering light in a downward direction, while the second electrode 486 provides a series of cascaded wedges 490 that refracts light upwardly. Hence, the embodiment of FIG. 33 can provide refraction over large angles. In use, a first voltage 492 could be applied to the first electrode 484 and as the first voltage 492 increases, the amount of deflection downwardly increases. As the amount of the first voltage 492 decreases, the amount of deflection decreases until the point where no voltage is applied to either the first or second electrode and the light propagates through the waveguide in a straight line. When a second voltage 494 is applied to the second electrode 486 (but not the first electrode), then the light passing through the waveguide begins to refract upwardly as the voltage 494 increases, and as the voltage 494 decreases, the amount of refraction decreases until the point where the light passes through the waveguide is a straight line.

Figure 34:
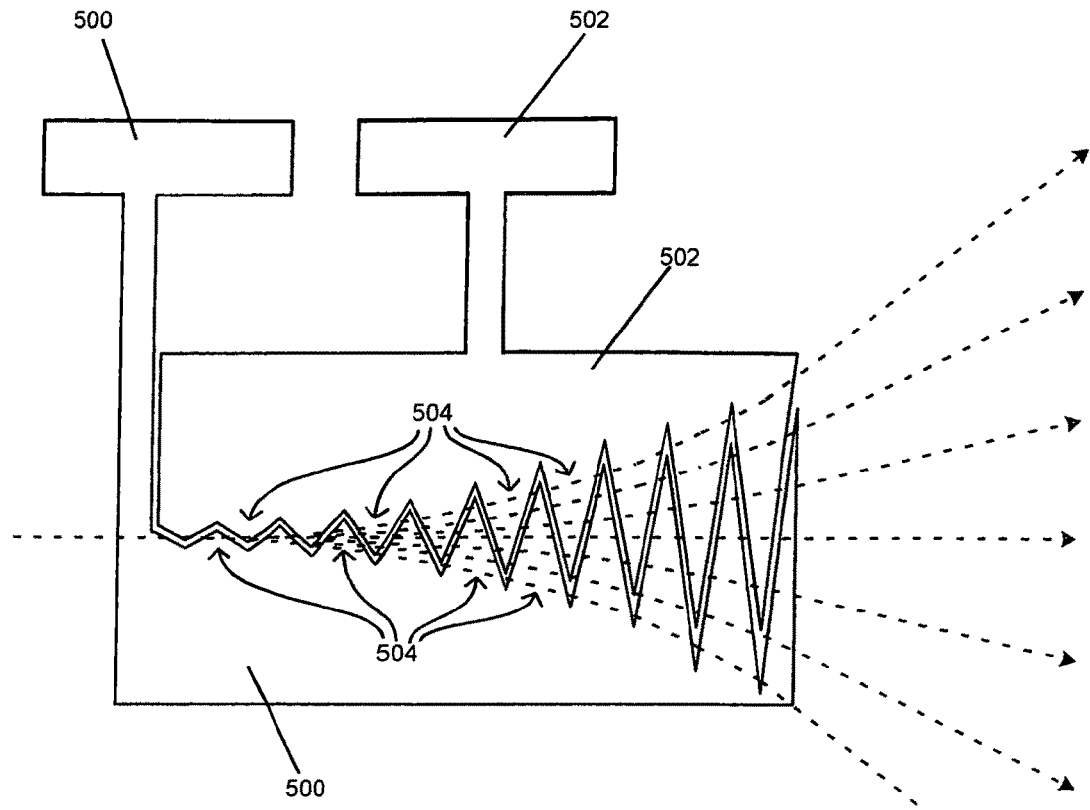
FIG. 34 illustrates another example of a pair of patterned electrodes for controlling light propagating through a waveguide, in accordance with an embodiment of the present invention.

The angular tuning range of beamsteerer electrodes such as 484, 486 shown in FIG. 33 can be limited because with successive refraction at each prism/wedge 488, 490, the beam can be deflected sufficiently so as to exit the electrodes, and therefore no longer be steered by the remaining prisms/wedges 488, 490. In other words, the output aperture eclipses the beam, thus unnecessarily limiting the angular range. This can be alleviated by: i) forming the prism array into a horn shape so that the output aperture encompasses the full deflection range of the beamsteerers, and ii) forming the input aperture to match to the size of the beam being deflected. This can increase the steering range and is generally discussed in: Y. Chiu, K. J. Zou, D. D. Stancil, T. E. Schelsigner, *Shape-Optimized Electrooptic Beam Scanners: Analysis, Design, and Simulation*, J. of Lightwave Tech., Vol. 17, p 108 (1999); and D. A. Scrymgeour, Y. Barad, V. Gopalan, K T. Gahagan, Q. Jia, T. E. Mitchell, and J. M. Robinson, *Large-Angle Electro-Optic Laser Scanner on LiTaO3 Fabricated by in Situ Monitoring of Ferroelectric-Domain Micropatterning*, App. Opt. Vol. 40, p. 6236 (2001), the disclosures of which are incorporated by reference in their entirety. As applied to embodiments of the present invention, the outer envelope of a prism array, which defines the maximally refracted or steered beam, may be characterized by $$\frac{d^2 x}{dz^2} = \frac{\Delta n}{n} \frac{1}{W(z)}, \text{ where} \qquad \text{Eq. 1}$$

$$W(z) = x(z) + \omega_0 \left\{ 1 + \left[\frac{\lambda z}{\pi n \omega_0^2}\right]^2 \right\},$$

and $\Delta n$ is the maximum modulation index of the waveguide, n is the average effective index of the guided mode, $\lambda$ is the wavelength of light, and $\omega$ is the Gaussian beam waist of the input beam. In one example as shown in FIG. 34, within this envelope, electrodes 500, 502 can be formed with prisms 504, 506 formed by dividing the length of each electrode 500, 202 into N prisms 504, 506 of equal base length. The differential equation describing the envelope may be solved using numerical methods, and an electrode pattern may be constructed. An example of such an electrode pattern is shown in FIG. 34, wherein a first electrode 500 defines a plurality of successive prisms 504, and a second electrode 502 defines a second plurality of prisms 506 opposing the first set of prisms 504.

In a manner analogous to the two electrode beamsteerer of FIG. 33, selective application of voltage to one or the other electrode 500, 502 of FIG. 34 can be used to selectively steer the beam either to one side or the other.

Figure 35:
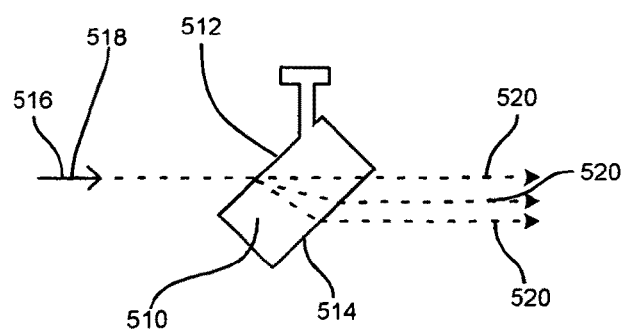
FIG. 35 illustrates another example of a patterned electrode for controlling light propagating through a waveguide, in accordance with an embodiment of the present invention.

FIG. 35 shows an example with an electrode 510 having a parallelogram shape wherein two parallel surfaces 512, 514 are both non-normal to the propagation direction 516 of the light input 518. In this embodiment, as the voltage applied to electrode 516 increases, the light beam output 520 passing through the waveguide can be moved to one side or another. As the voltage increases, the distance between the input beam 518 and the active output beam 520 grows, while as the voltage decreases, the distance between the input beam 518 and the active output beam 520 decreases.

Figure 36:
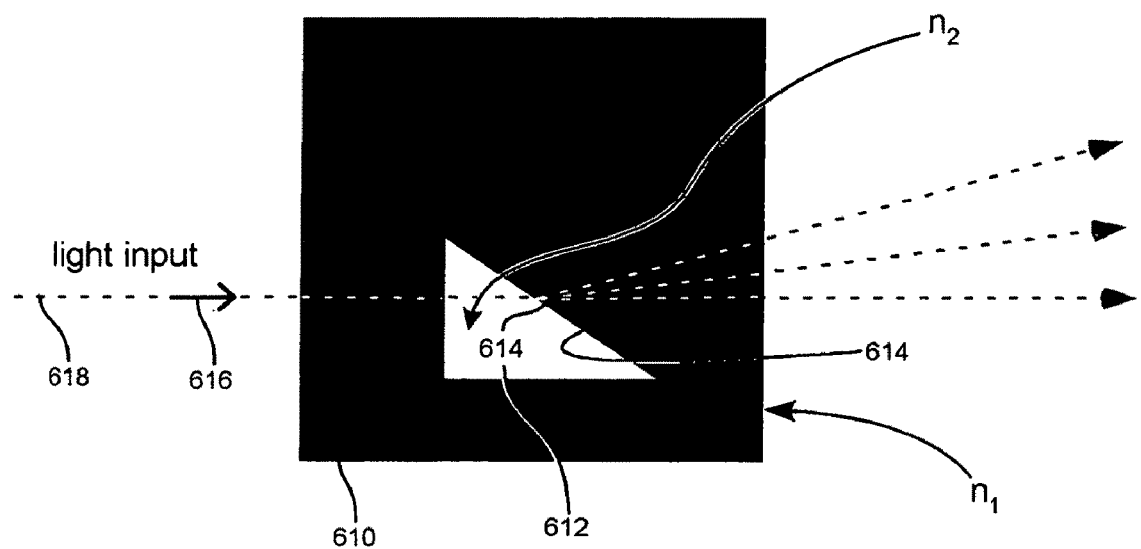
FIG. 36 illustrates another example of an electrode for controlling light propagating through the waveguide, in accordance with one embodiment of the present invention.

FIG. 36 illustrates another example of an electrode 610 for controlling the propagation of light through the waveguide, in accordance with one embodiment of the present invention. In this embodiment, the electrode 610 includes an opening or hole region 612 that defines at least one non-normal interface 614 relative to the direction 616 of propagation of light 618 traveling through the waveguide. While in this example the opening 612 defines a single wedge/prism shape, it is understood that other shapes could be used as well. In this case, when no voltage is applied to electrode 610, the index of refraction n2 of the region adjacent the opening 612 is approximately equal to the index of refraction of the region adjacent the electrode; and as voltage is applied to the electrode 610, the index of refraction n1 of the region adjacent or proximate the electrode 610 changes.

Figure 37:
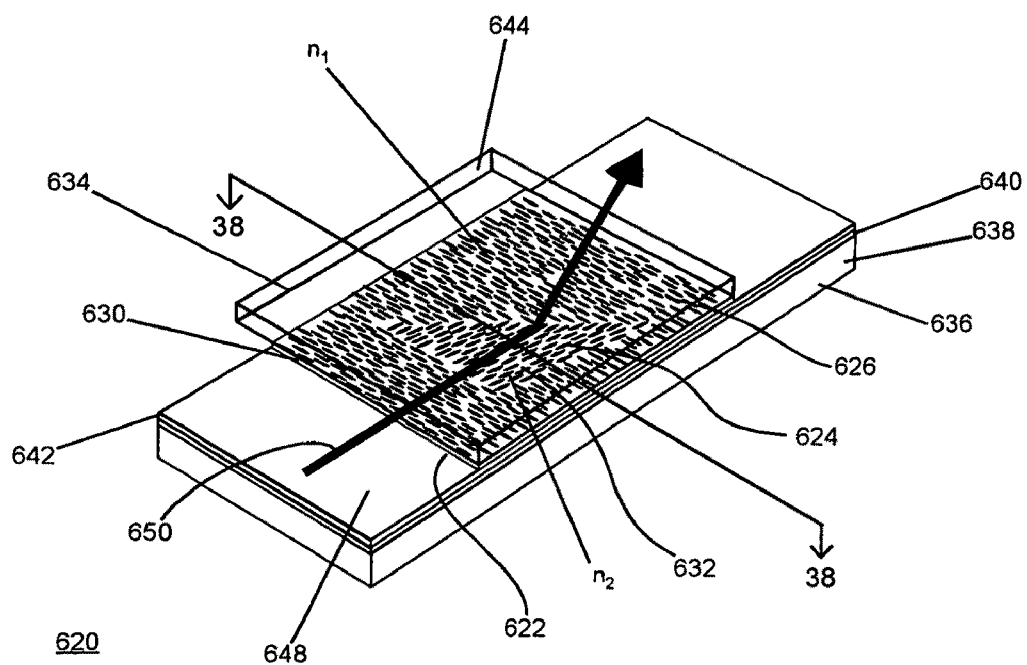
FIG. 37 illustrates an alternative embodiment wherein the waveguide utilizes an alignment layer having two or more areas or regions having different orientations that align the liquid crystal material in the adjacent cladding so as to form refractive shapes within the liquid crystal material in the cladding for controlling light propagating through a waveguide, in accordance with one embodiment of the present invention.

FIG. 37 illustrates an alternative embodiment wherein a waveguide 620 utilizes an alignment layer 622 having two or more areas or regions 624, 626 having different orientations that align the liquid crystal material 628 in the adjacent cladding 630 so as to form refractive shapes 632 within the liquid crystal material 628 for controlling light propagating through a waveguide 620, in accordance with one embodiment of the present invention. In one example and referring to FIGS. 37-39, the waveguide 620 can be constructed in a manner similar to the embodiments described above except that in place of one or more patterned electrodes, the embodiments of FIGS. 37-39 have an alignment layer 622 with regions 624, 626 of patterned alignments and a pair of electrode layers 634, 636 or planes. Hence, the waveguide 620 of the example of FIG. 37-39 may include a substrate 638 acting as a lower electrode plane 636, a lower cladding 640, a core layer 642, an alignment layer 622 having the one or more regions 624, 626 defining various shapes, an upper cladding 630 with liquid crystal material 628 therein, an upper electrode plane 634, and a glass cover 644. The substrate 638, lower cladding 640, core 642, upper cladding 630 with liquid crystal material 628 therein, and the glass cover 644 can all be made as described above with reference to FIGS. 17-30. The upper electrode 634 can be implemented as a conductive coating or conductive layer as described above with reference to FIGS. 17-30.

On the alignment layer 622, the one or more areas or regions 624, 626 can define various shapes 632 in order to induce the liquid crystal material 628 in the adjacent upper cladding 630 to form various shapes when no voltage 646 is applied, such as shapes 632 having non-normal interfaces (such as one or more of the shapes shown in FIGS. 17-18 and 31-35).

In the example of FIG. 37, the alignment layer 622 of the waveguide includes a first region 624 and a second region 626. In this example, the second region 626 aligns the liquid crystal materials 628 in the upper cladding with their long axis perpendicularly orientated relative to the propagation direction 648 of light 650 traveling through the waveguide 620; and the first region 624 defines a wedge or prism shape 632, wherein within the first region 624, the liquid crystal materials 628 in the upper cladding 630 are aligned with their long axis orientated in parallel relative to the propagation direction 648 of light 650 traveling through the waveguide 620 (see FIGS. 38, 40).

Figure 38:
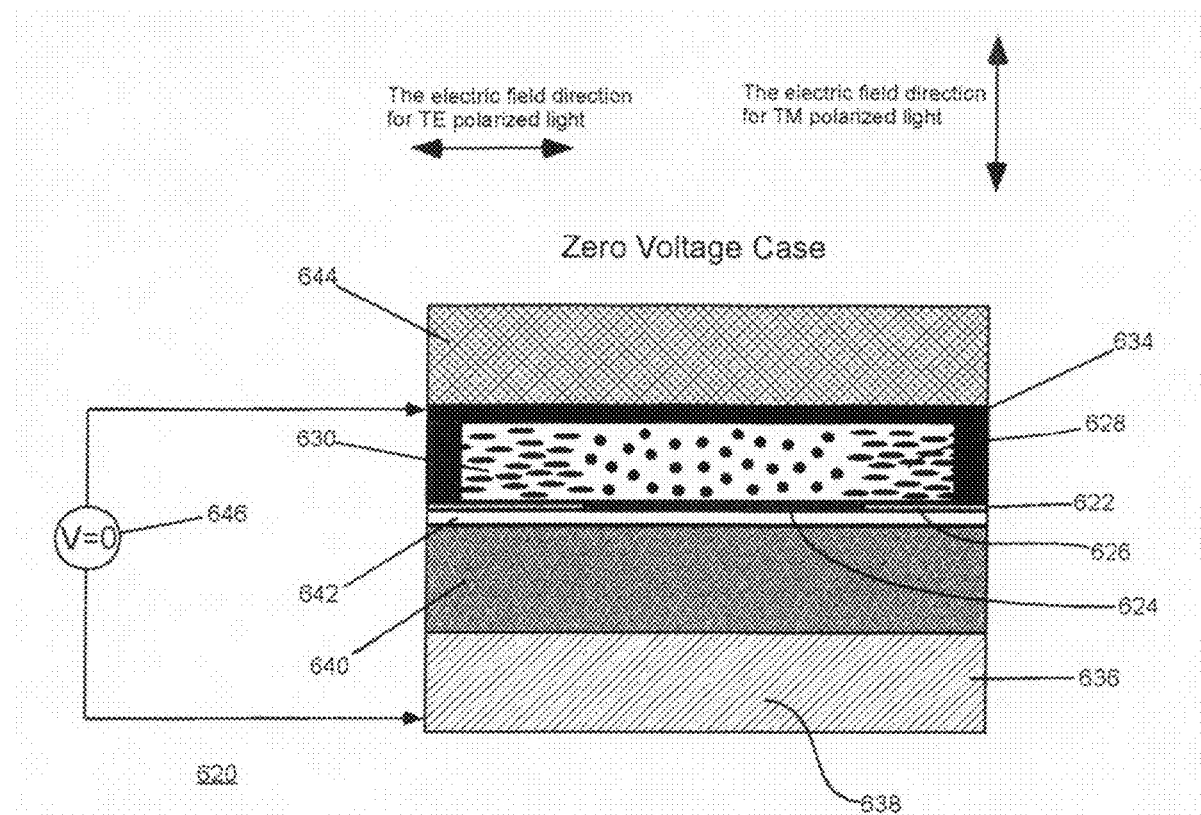
FIG. 38 illustrates a sectional view of the waveguide of FIG. 37 taken along section lines 38-38 with no voltage applied, in accordance with one embodiment of the present invention.
Figure 39:
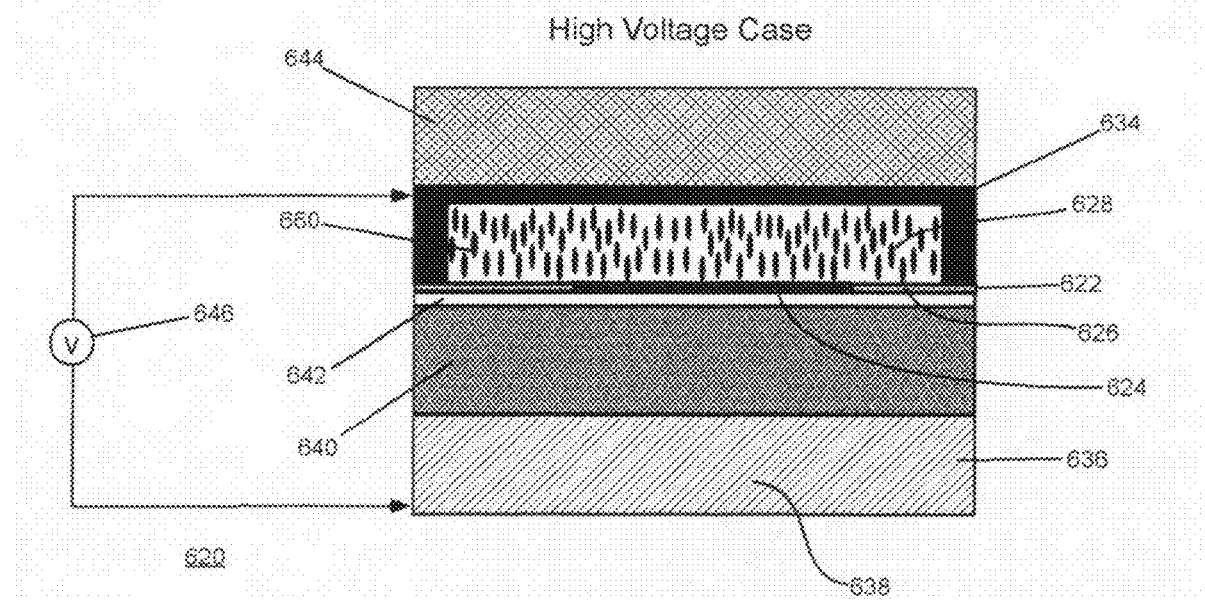
FIG. 39 illustrates a sectional view of the waveguide of FIG. 37 taken along section lines 38-38 with a voltage applied, in accordance with one embodiment of the present invention.
Figure 40:
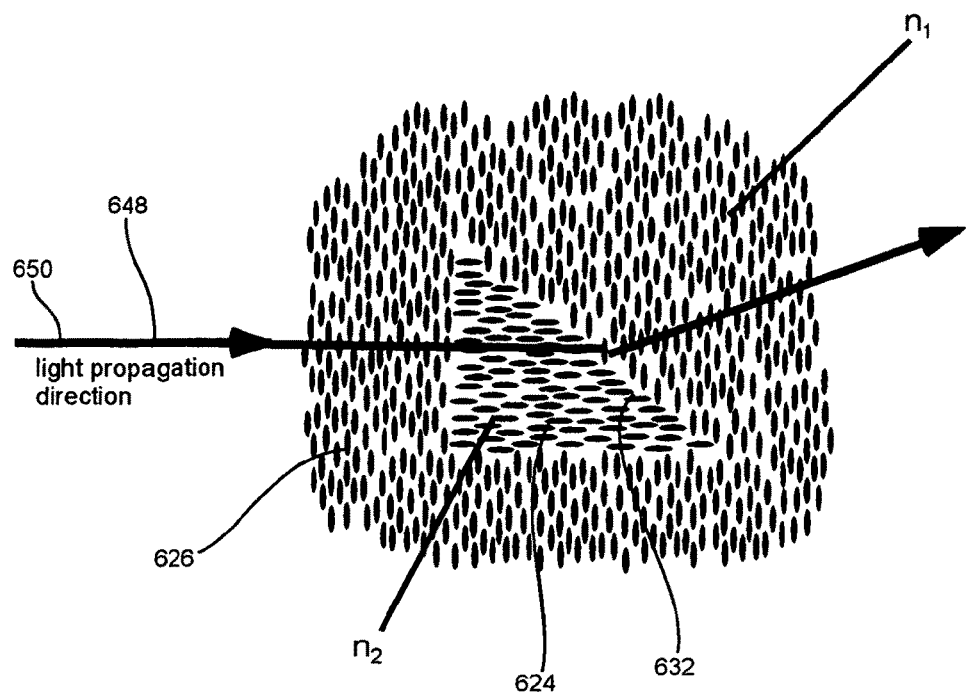
FIG. 40 illustrates a top view of the liquid crystals within the upper cladding of the waveguide of FIG. 37 when no voltage is applied, in accordance with one embodiment of the present invention.
Figure 41:
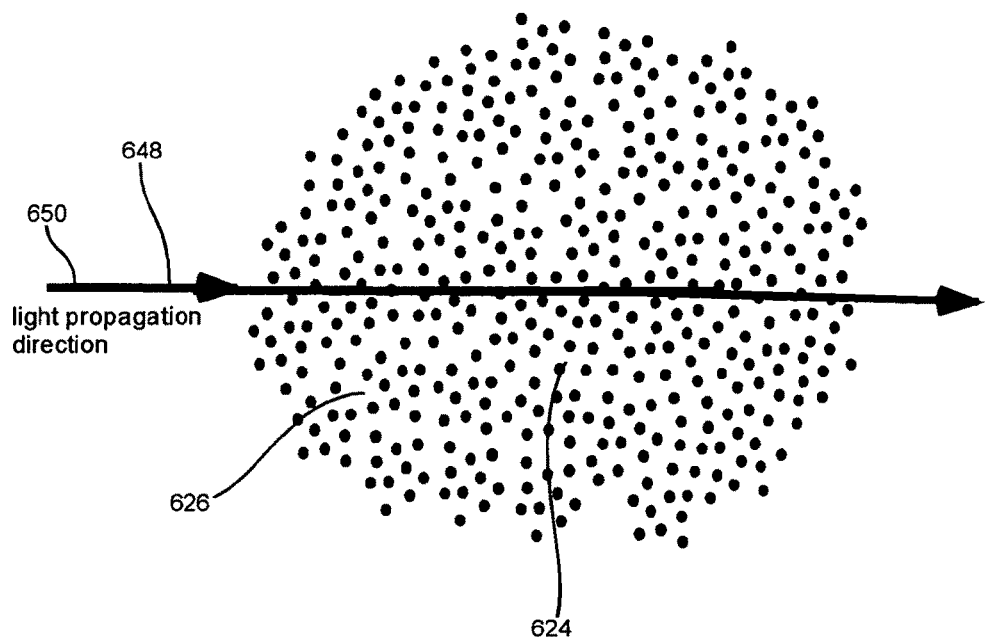
FIG. 41 is a top view of the liquid crystal material within the upper cladding of the waveguide of FIG. 37 when a high voltage is applied so as to re-orient the liquid crystal material therein, in accordance with one embodiment of the present invention.

In operation, when no voltage 646 is applied between the upper electrode 634 and the lower electrode/substrate 636, the index of refraction n1 of the second region 626 is greater than the index of refraction n2 of the first region 624 for TE polarized light traveling through the waveguide 620 (see FIGS. 38, 40). As a voltage 646 is applied between the upper electrode 634 and the lower electrode/substrate 636, the electric field of the applied voltage 646 induces the liquid crystals 620 within the upper cladding 630 to orient vertically (see FIGS. 39, 41), and therefore for TE polarized light traveling through the waveguide 620, the index of refraction n1 of the second region 626 is approximately equal to the index of refraction n2 of the first region 326, and no refraction or light bending occurs.

As with the other embodiments disclosed herein that use patterned electrodes to induce portions of the liquid crystal materials to form various refractive shapes, the embodiments of FIGS. 37-41 can be made using different arrangements, liquid crystal alignments, or orders of layers as desired.

Figure 42:
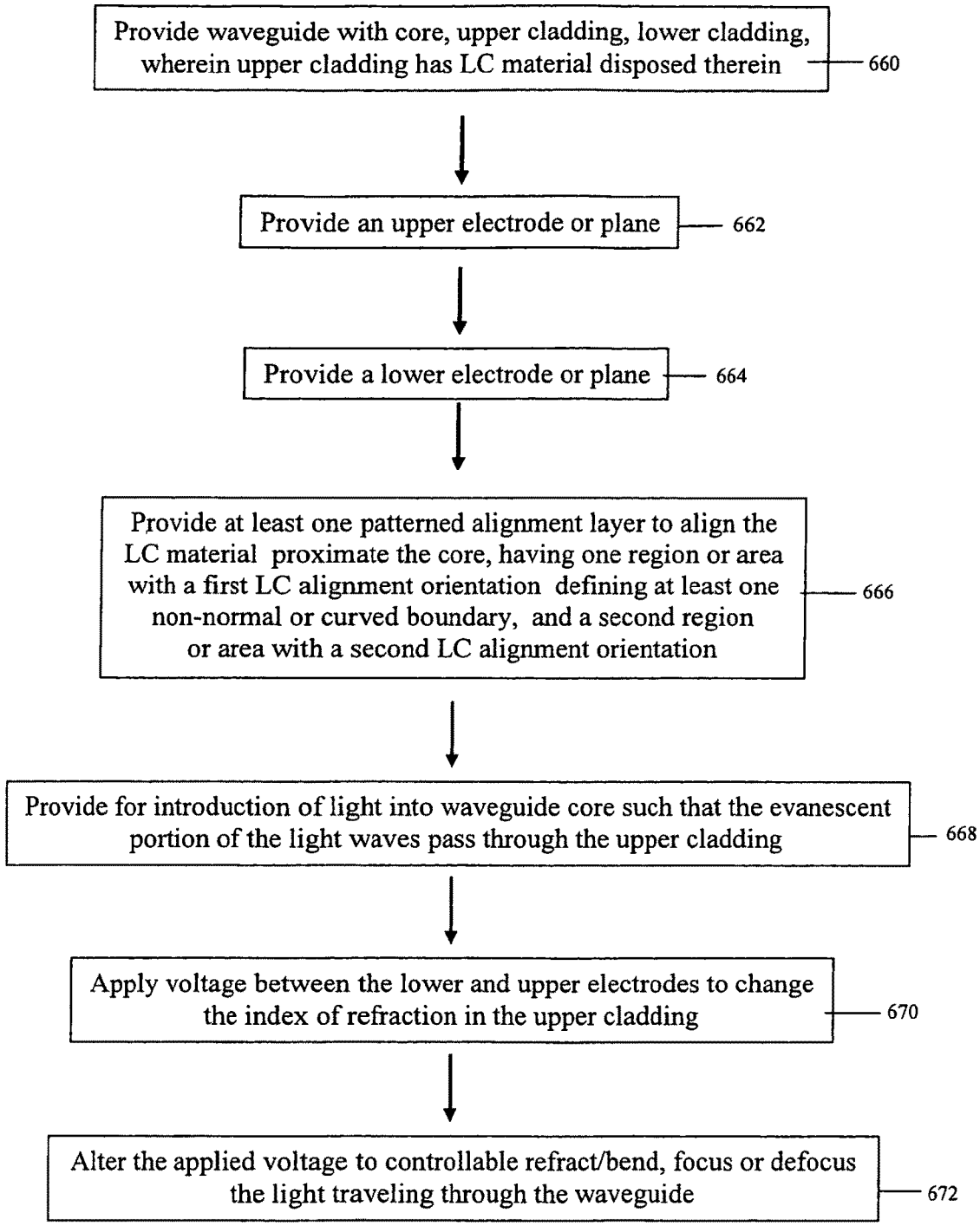
FIG. 42 illustrates an example of operations for forming a waveguide having two or more areas or regions having different orientations that align the liquid crystal material in the adjacent cladding so as to form refractive shapes within the liquid crystal material for controlling light propagating through a waveguide, in accordance with one embodiment of the present invention.

FIG. 42 illustrates an example of operations for forming a waveguide having an alignment layer with two or more areas or regions having different orientations that induce or align the liquid crystal material in the adjacent cladding to form refractive shapes within the liquid crystal material for controlling light propagating through a waveguide, in accordance with one embodiment of the present invention. The shapes of the regions can include shapes with non-normal interfaces.

In FIG. 42 at operation 660, a waveguide is provided with a core, upper cladding, and lower cladding, wherein liquid crystal material is disposed within one of the claddings. As described above, the liquid crystal material may be disposed within the upper or lower cladding, and for purposes of this example, the liquid crystal material will be described as being disposed within the upper cladding. At operation 662, an upper electrode or plane is provided, and at operation 664, a lower electrode or plane is provided within the waveguide. In one example, the upper electrode is formed as a conductive coating on the glass cover or as a layer of conductive material. In one example, a conductive substrate layer or other conductive layer is provided in the waveguide to act as the lower electrode or ground plane.

At operation 666, at least one alignment layer is provided to align the liquid crystal material in the upper cladding proximate the core. In one example, the alignment layer has two or more regions with differing alignments so that the liquid crystal material adjacent the alignment layer is biased or oriented in a desired orientation when no voltage is applied between the upper electrode and the lower electrode. The shapes of the regions can include, for instance, shapes with non-normal interfaces, refractive shapes, prisms, rectangles, wedges, or shapes such as those described above.

As with the above described embodiments, the non-normal interfaces, refractive shapes of regions of the alignment layer induce the liquid crystal material in the adjacent cladding to form a corresponding shape wherein the index of refraction of the formed shape is controllably dependent upon the amount of voltage applied to the electrodes.

As to operation 666, one example of how a region or area of the alignment layer can be patterned or made is by utilizing regions of photo-aligned polyimide, such as by companies such as Elsicon Inc., or other photo-aligned polymers or other general photoalignable materials. Liquid crystal molecules in the adjacent cladding will generally align according to the orientation of these regions of polymer.

Specifically, the polymer may be spin-coated directly onto the surface of the waveguide core, and such application may occur in the same manner as how normal polymer would be applied to the core. Polarized ultraviolet light may be applied to selected regions of the polymer to create alignments within such regions. The direction of polarization of the ultraviolet light determines the director, or liquid crystal orientation or direction, i.e., the alignment.

In order to create regions of patterned alignment, a first mask can be created which would be placed directly above the polymer to cover the polymer during exposure to ultraviolet light. Patterns of opaque regions on the mask would cast shadows onto the polymer, and therefore these dark regions would not be aligned. The ultraviolet light source would then be turned off and the mask removed.

A second mask that is a negative or inverse of the first mask could then be placed directly above the polymer to cover the polymer during a second exposure to ultraviolet light. For the second exposure, the direction of polarization of the ultraviolet light, with respect to the waveguide, is then rotated ninety degrees. When the ultraviolet light is turned on during the second exposure, the regions that were previously not exposed (and therefore not aligned) are now aligned. Since the direction of polarization of the ultraviolet light (with respect to the waveguide) has been rotated ninety degrees, the alignment in these regions will be rotated ninety degrees with respect to the alignment outside of these regions. Using this method, various regions on the alignment layer can be formed having different alignments so that the polymer induces the liquid crystal material in the adjacent cladding to align according to the polymer patterns of the alignment layer.

Alternatively, in another example, a polymer can be applied and uniformly buffed. A photoresist can then be applied and exposed in the desired pattern. The photoresist is then removed in the area of the pattern and the polyimide is buffed in a different or orthogonal direction. The remaining photoresist is then removed.

Another example of operation 666 to form a patterned or aligned region or area is via etching microgrooves directly into the top of the waveguide core. The width and distance between adjacent microgrooves is chosen to be sufficiently small so that it does not effect the propagation of the light in the core. Liquid crystal molecules in the adjacent cladding will generally align according to the orientation of these microgrooves.

To create microgrooves, in one example photo-resist may be applied to the core and then cured using an interference pattern between two short-wavelength beams. This creates a pattern of closely spaced lines of photo-resist on the core. Standard etching techniques are then used to remove a small amount of the core in the regions that are not covered by the lines of photo-resist. The photo-resist is removed, and a microgrooved pattern is left on the core.

Two or more regions of microgrooves can be formed on the alignment layer (or on the surface of the core), wherein each region has a set of aligned microgrooves, and the alignment of a first region differs from the alignment of a second region. This can be done by masking techniques. Specifically, a patterned mask can be inserted prior to exposing the photo-resist to the short wavelength interference pattern. The photoresist will not be cured in the regions that are shadowed by the mask. The short wavelength light is turned off and the mask is removed. A negative of the first mask is then inserted. The interference pattern created by the short wavelength light is then rotated ninety degrees with respect to the waveguide. The short wavelength light is then turned on, and the exposed regions of the photo-resist are cured in closely spaced lines, but these lines are now rotated ninety degrees with respect to the previously cured lines. The waveguide is then etched using standard techniques. The net result is two regions, both with microgrooves, but the directions of the microgrooves in one region is rotated ninety degrees with respect to the direction of the microgrooves in the other region. Using this technique, various regions on the alignment layer can be formed having different alignments so that the microgrooves induce the liquid crystal material in the adjacent cladding to align according to the regions of microgroove patterns of the alignment layer.

As another example, nano-imprint lithography techniques can be used to create regions of patterned alignment. In this technique, a pattern, such as the microgroove pattern described above, can be used to imprint the pattern onto a softer substrate.

At operation 668, in one example, it is provided that light may be introduced into the waveguide core such that the evanescent portion of the light wave passes through the cladding, which contains the liquid crystal material (e.g., the upper cladding, in one example). In one embodiment, for instance, a prism coupler, grating coupler, or butt-coupling or end-fire coupling technique or other conventional method or device may be used to introduce light into the waveguide.

At operation 670, a voltage is applied between the upper and lower electrodes of operations 662-664 in order to change the index of refraction of the upper cladding, which in this example contains the liquid crystal material. As voltage is applied between the upper and lower electrodes, an electric field is formed between the upper and lower electrodes in order to control the orientation of the liquid crystal material therebetween.

In operation 670, the liquid crystal material between the upper electrode and the lower electrode is controllably reoriented depending upon the amount of voltage applied, and such application of voltage alters the index of refraction of such liquid crystal material relative to light propagating through the waveguide. As such, through the application of voltage between the upper and lower electrodes, one or more shapes can be formed within the liquid crystal material which in effect operate as prisms, rectangles, or refractive elements, to alter the index of refraction, or direct light under the control of the applied voltage. At operation 672, the applied voltage may be varied so as to controllably refract/bend, or alter the index of refraction of light as it travels through the waveguide and the evanescent portion of the light passes through the liquid crystal material experiencing the influence of the electric field of the applied voltage.

Figure 43:
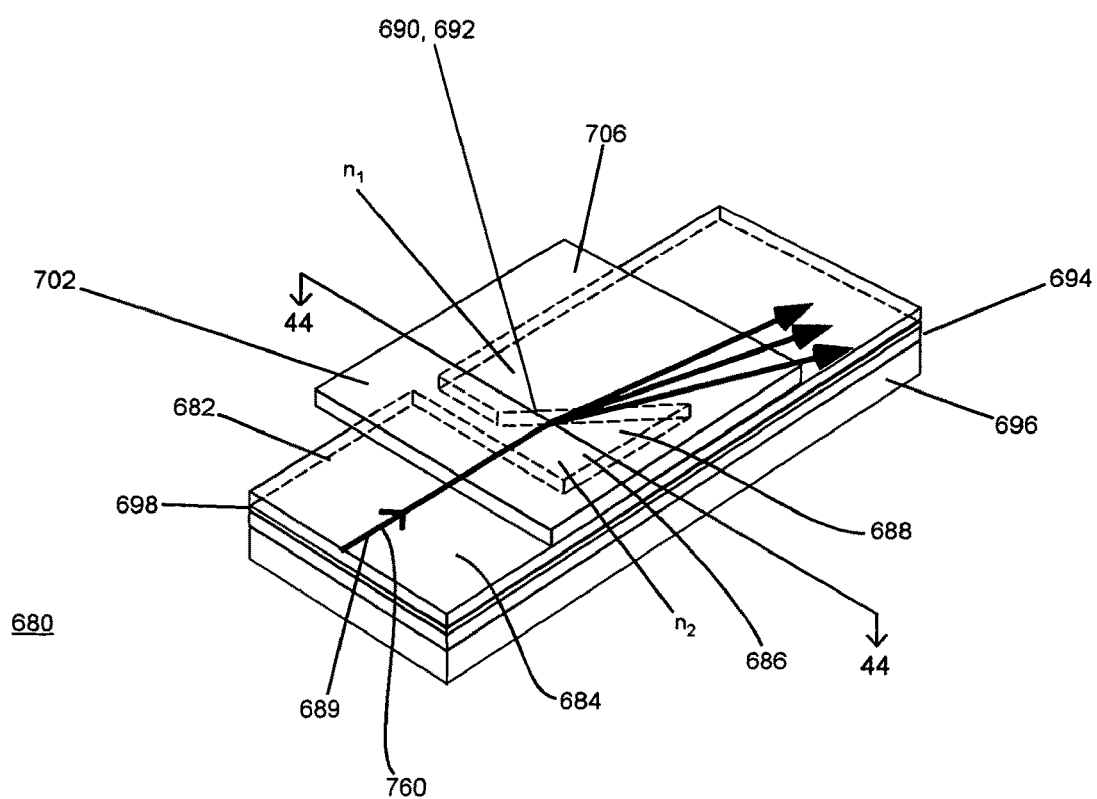
FIG. 43 illustrates an alternative embodiment wherein the waveguide utilizes an upper cladding layer having a first region and a second region, the second region including a cavity having liquid crystal material therein, the cavity defining one or more refractive shapes for controlling light propagating through a waveguide, in accordance with one embodiment of the present invention.

FIG. 43 illustrates an alternative embodiment wherein a waveguide 680 utilizes a cladding 682 that includes at least two regions 684, 686: a region 684 without liquid crystal material 688 and a region 686 with liquid crystal material 688. In one example, the first region 684 may include a non-liquid crystal material, such as but not limited to any of the materials that can be used to create the lower cladding as discussed previously with respect to FIGS. 17-30. In one example, this first region 684 is generally not electro-optic, i.e., the index of refraction does not change with respect to an applied electric field. The second region 686 may comprise areas or refractive shapes or cavities 690 where the non-liquid crystal material of the first region is not present or is reduced in thickness so as to create cavities or chambers 690 into which liquid crystal material 688 is placed and the evanescent wave of the guided light 689 will penetrate. In this manner, dynamically voltage tunable refractive shapes 692 are constructed by controlling the shape or area 690 in which the liquid crystal 688 may interact with the guided light 689 via the evanescent wave. Of course, the cladding 682 with the cavity 390 with liquid crystal material 688 therein could be the upper cladding 682 or the lower cladding 694, depending on the implementation.

Figure 44:
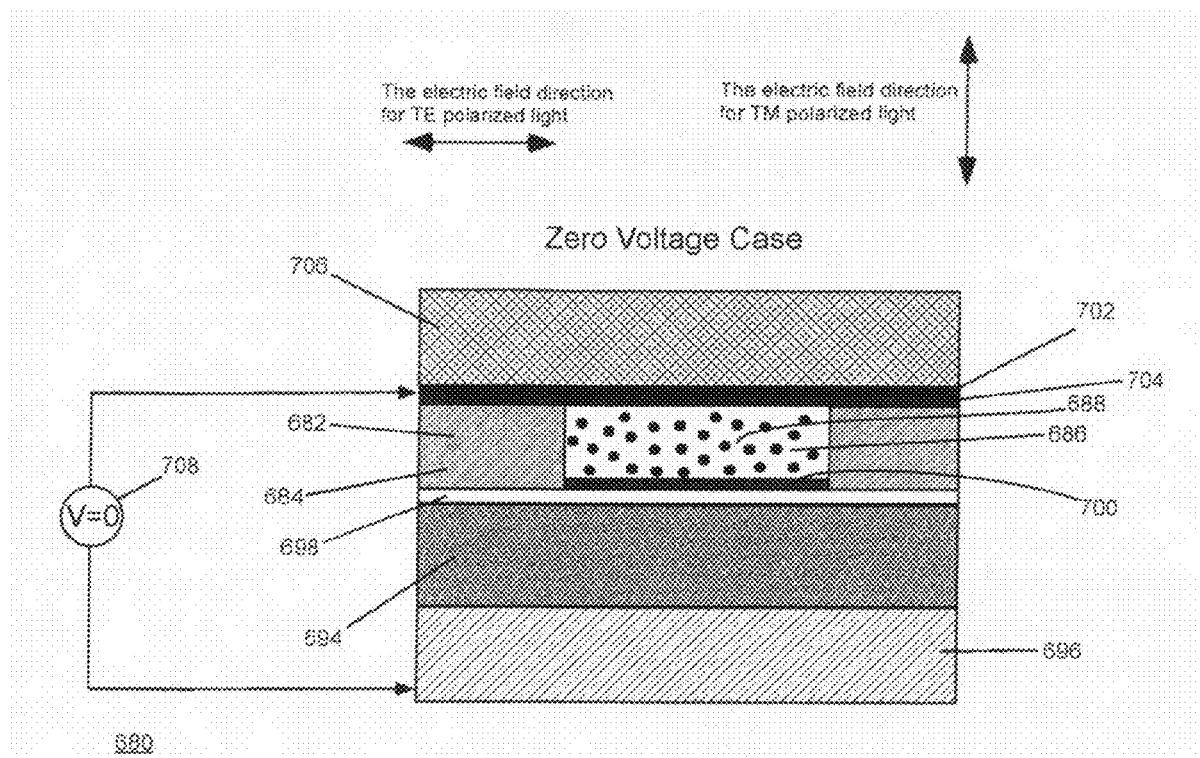
FIG. 44 illustrates a sectional view of the waveguide of FIG. 43 taken along section lines 44-44 with no voltage applied, in accordance with one embodiment of the present invention.
Figure 45:
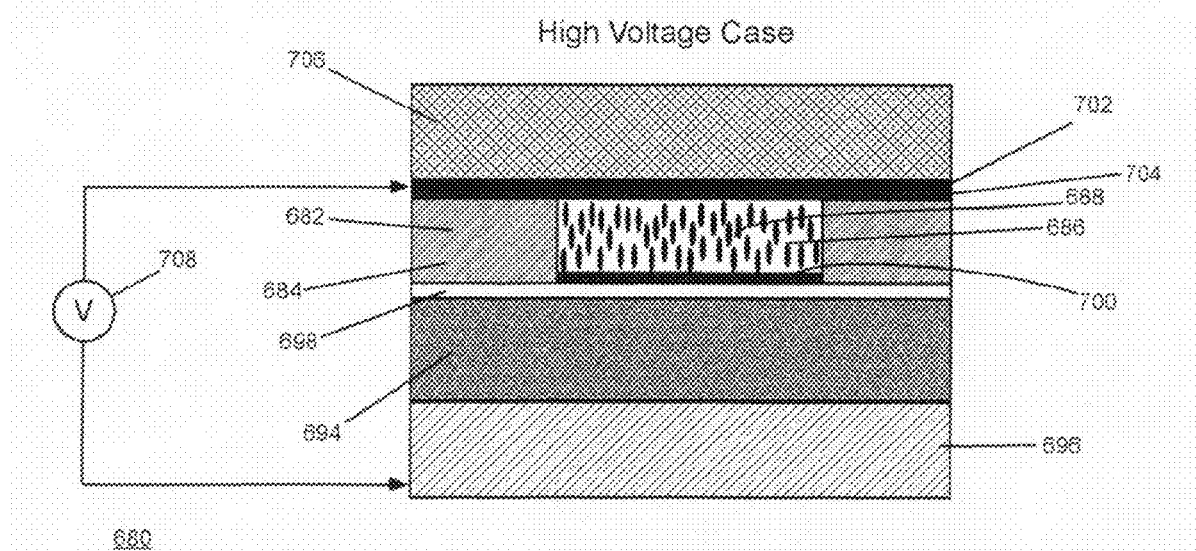
FIG. 45 illustrates a sectional view of the waveguide of FIG. 43 taken along section lines 44-44 with a voltage applied, in accordance with one embodiment of the present invention.

In one example and referring to FIGS. 43-45, a waveguide 680 can be constructed in a manner similar to the embodiments described above except that in place of one or more patterned electrodes, the embodiments of FIGS. 43-45 have an upper cladding 682 in which only regions or areas 686 contain liquid crystal material. Hence, the waveguide 680 of the example of FIG. 43-45 may include a substrate 696 acting as a lower electrode plane, a lower cladding 694, a core layer 698, an alignment layer 700, an upper cladding 682 with a region or area 686 with liquid crystal material 688 therein and a region 684 with non-liquid crystal material therein, and an upper electrode plane 702. A second alignment layer 704 may be provided between the upper electrode 702 and the upper cladding 682, if desired. A glass cover 706 may also be used if desired. The substrate 696, lower cladding 694, core 698, upper cladding region 686 with liquid crystal material 688 therein, and the glass cover 706 can all be made as described above with reference to FIGS. 17-30. The upper electrode or plane 702 can be implemented as a conductive coating or conductive layer as described above with reference to FIGS. 17-30.

On the upper cladding 682, the one or more areas or regions 686 in which liquid crystal material 688 interacts with the guided light 689 can define various shapes 692, such as refractive shapes having non-normal interfaces (such as one or more of the shapes shown in FIGS. 17-18 and 31-35).

In the example of FIG. 43, the second region 686 may comprise a wedge shape where the non-electro-optic material of the upper cladding 682 is absent and the core layer 698 is therefore exposed. In this second area 686, an alignment layer 700 and liquid crystal material 688 are disposed therein and may operate in a fashion analogous to that previously discussed in reference to FIGS. 17-31. In this particular example, the long axes of the liquid crystal molecules 688 in the second region 686 are aligned so that at low or zero voltage 708 their alignment direction is predominantly parallel to the direction 710 of light 689 propagating through the waveguide 680 (see FIG. 44), although other orientations are possible.

Figure 46:
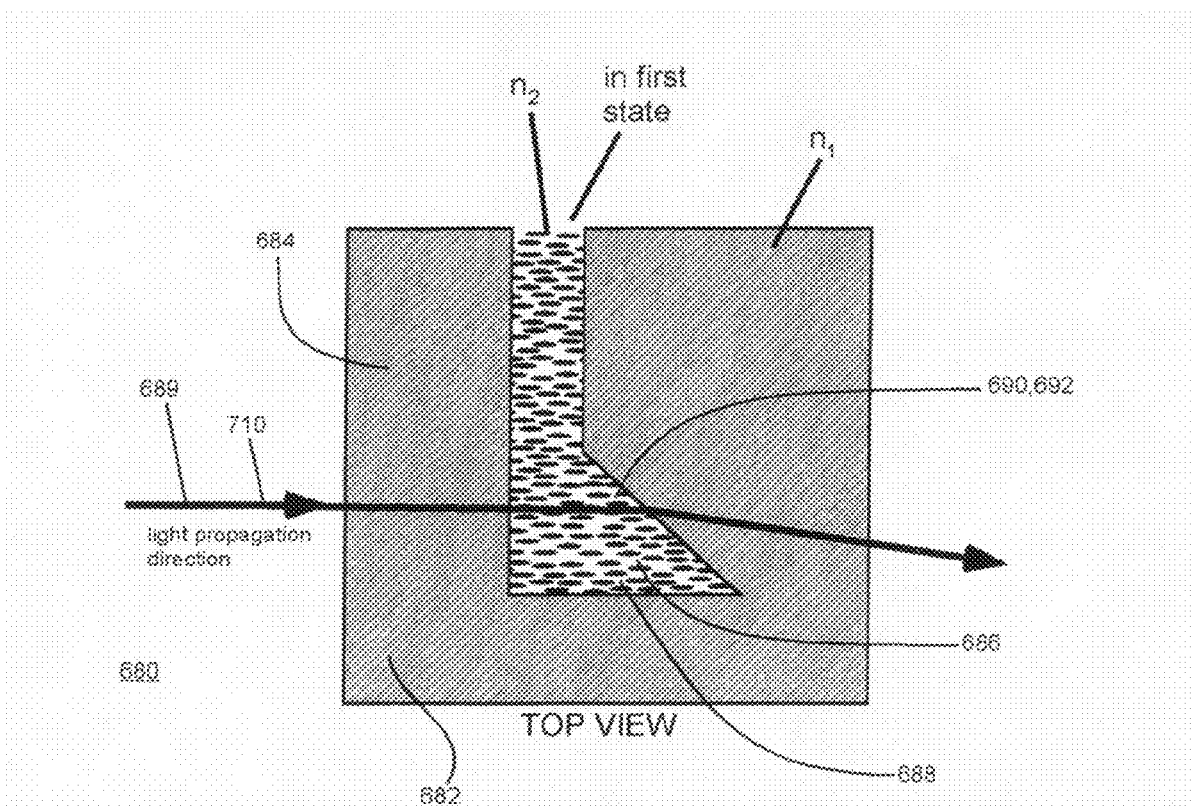
FIG. 46 illustrates a top section view of the upper waveguide cladding of the waveguide of FIG. 43, which contains a first region without liquid crystals and a second region with liquid crystals, when no voltage is applied, in accordance with one embodiment of the present invention.
Figure 47:
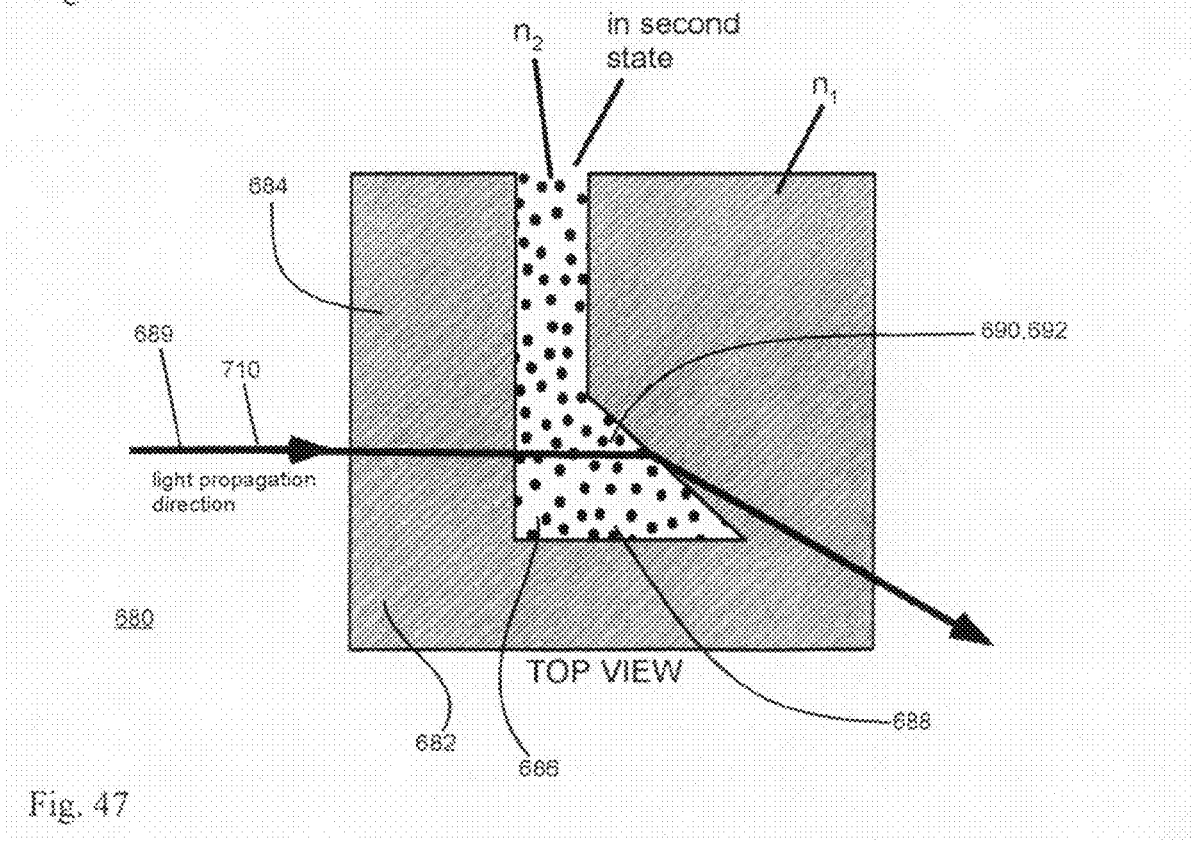
FIG. 47 illustrates a top section view of the upper waveguide cladding of the waveguide of FIG. 43, which contains a first region without liquid crystals and a second region with liquid crystals, when a high voltage is applied, in accordance with one embodiment of the present invention.

In operation and referring to FIGS. 43-47, when no voltage 708 is applied between the upper electrode 702 and the lower electrode/substrate 696, the index of refraction n1 of the first region 684 is different than the index of refraction n2 of the second region 686 for TM polarized light traveling through the waveguide (see FIGS. 44, 46). As a voltage 708 is applied between the upper electrode 702 and the lower electrode/substrate 696, the electric field of the applied voltage 708 induces the liquid crystals 688 within the second region 686 of the upper cladding 682 to orient vertically (see FIGS. 45, 47), and therefore for TM polarized light traveling through the waveguide 680, the difference between the index of refraction n1 of the first region 684 and the index of refraction n2 of the second region 686 is changed. Depending on the index of refraction of the first region 684 (which in this example is constant and not voltage tunable, but can be chosen from a range of values), the degree or amount of refraction of the waveguide 680 will change. In other words, since the difference between n1 and n2 can be voltage tuned, the degree of refraction can also therefore be voltage tuned. However, unlike the embodiments using shaped electrodes, the refraction at zero voltage will not generally be zero, unless the fixed index of region 684 is deliberately chosen to equal the index of the liquid crystal 688 at zero volts.

As with the other embodiments disclosed herein that use patterned electrodes to induce portions of the liquid crystal materials to form various refractive or rectangular shapes, the embodiments of FIGS. 43-47 can be made using different arrangements of layers, different liquid crystal alignments, or different orders of layers as desired. Depending on the implementation, refraction of TE or TM polarized light (or both) can be achieved.

Figure 48:
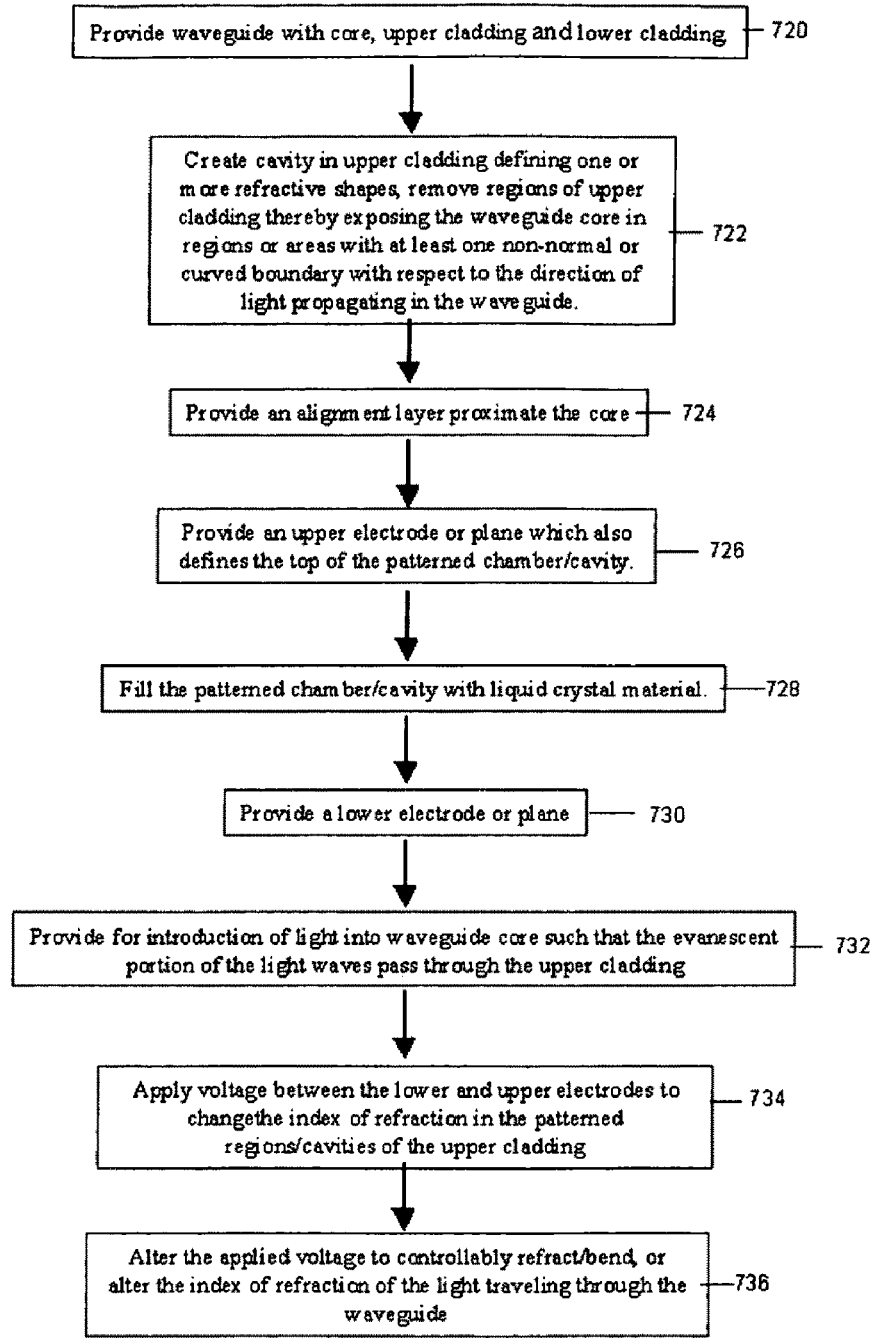
FIG. 48 illustrates an example of operations for forming a waveguide having a cladding with at least a first and second region, the second region having a cavity with liquid crystal material therein, the cavity defining one or more refractive shapes within the upper cladding for controlling light propagating through a waveguide, in accordance with one embodiment of the present invention.

FIG. 48 illustrates an example of operations for forming a waveguide having a cladding layer with two or more areas or regions, the first region having non-liquid crystal material and the second region having liquid crystal material to form refractive shapes within the cladding for controlling light propagating through a waveguide, in accordance with one embodiment of the present invention. The shapes of the regions can include refractive shapes with non-normal interfaces, for example wedge or prism shapes or rectangular shapes for controlling the total optical path delay. In the example of FIG. 48, a cavity or region with liquid crystal material is provided in the upper cladding, although it could be provided in the lower cladding.

In FIG. 48 at operation 720, a waveguide is provided with a core, an upper cladding, and a lower cladding. At operation 722, in one example, regions or areas of the upper cladding are removed thereby forming shapes or areas in which the core layer may be exposed. This may be achieved with standard photolithographic techniques. For example, a photomask may be used to cure a patterned photoresist on top of the upper cladding layer. Etching techniques are then used to remove portions of the upper cladding in regions where the photoresist has not been cured. The upper cladding may be etched with a chemical process that only removes the upper cladding material and not the core, which will prevent the core from being etched into or etched through (etching through the core would destroy the waveguide). Alternatively, the upper cladding can be etched for a sufficient time to significantly reduce the thickness of that region of upper cladding, but not completely remove the non-liquid crystal cladding. Such a technique can create regions into which the evanescent wave will penetrate. As another alternative, a chemical stop layer may be applied between the core and upper cladding layer. This chemical stop layer will prevent etching into the core, and can be made sufficiently thin so as to not adversely affect the optical properties of the waveguide. Finally, the etched cavity region can be constructed so as to provide an opening at the edge of the waveguide. This can facilitate filling the chamber or cavity of the cladding with liquid crystal material.

At operation 724, an alignment layer is provided for biasing the liquid crystal material that will be disposed within the etched cavity regions of the upper cladding. This can be accomplished by the alignment techniques previously mentioned. However, since the upper surface is no longer of uniform height (regions have been etched away), application of an alignment layer can become more challenging. For example, spin coating techniques (for application of a polyimide or polymer layer) will tend to planarize the surface and therefore be undesirably thick in the etched regions. One technique to avoid this problem is to create the etched regions or cavities such that they extend to the edge of the waveguide. The waveguide can then be placed on a spin coater off-center, and oriented so that excess material will have a path to be removed via centrifugal forces of the spin coat process. Alternatively, oblique deposition of SiO and/or SiO2 can provide an alignment layer, with only minimal shadows created by the edges of the etched regions. As another alternative, prior to applying the non-liquid crystal upper cladding material, a microgroove alignment layer may be created along the entire waveguide core via holographic lithography or nano-imprint techniques. The non-liquid crystal upper cladding would then be applied, and after etching away regions or cavity areas to expose the core, the alignment layer would already be present there.

At operation 726, an upper electrode or plane is provided. This upper electrode or plane may also form the ceiling of the chamber or cavity to be filled with liquid crystal. In one example, the upper electrode is formed as a conductive coating on the glass cover or as a layer of conductive material.

At operation 728, the chamber or cavity in the upper cladding may be filled with liquid crystal material. With only one opening, as depicted in the example of FIG. 43, this process may be conducted under a vacuum. A drop of liquid crystal material placed adjacent to the opening will wick into the chamber or cavity. This chamber may be plugged with a standard glue after filling.

At operation 730, a lower electrode or plane is provided. In one example, a conductive substrate layer or other conductive layer is provided in the waveguide to act as the lower electrode or ground plane.

At operation 732, in one example, light may be introduced into the waveguide core such that the evanescent portion of the light wave passes through the cladding that contains both the regions with and without the liquid crystal material (e.g., the upper cladding, in one example). In one embodiment, for instance, a prism coupler or butt-coupling or endfire coupling technique or other conventional method or device may be used to introduce light into the waveguide.

At operation 734, a voltage is applied between the upper and lower electrodes of operations 726-730 in order to change the index of refraction of the sections or cavity areas of the upper cladding which contain the liquid crystal material. As voltage is applied between the upper and lower electrodes, an electric field is formed between the upper and lower electrodes in order to control the orientation of the liquid crystal material therebetween.

In operation 736, the liquid crystal material in the shaped cavities between the upper electrode and the lower electrode is controllably reoriented depending upon the amount of voltage applied, and such application of voltage alters the index of refraction of such refractive shapes of liquid crystal material relative to light propagating through the waveguide. Such shapes that contain the liquid crystal material in effect operate as prisms, or other refractive elements, or as rectangular regions to control the optical path delay of the light, under the control of the applied voltage. At operation 736, the applied voltage may be varied so as to controllably refract/bend, of alter the index of refraction of light as it travels through the waveguide and the evanescent portion of the light passes through the liquid crystal material experiencing the influence of the electric field of the applied voltage.

Figure 49:
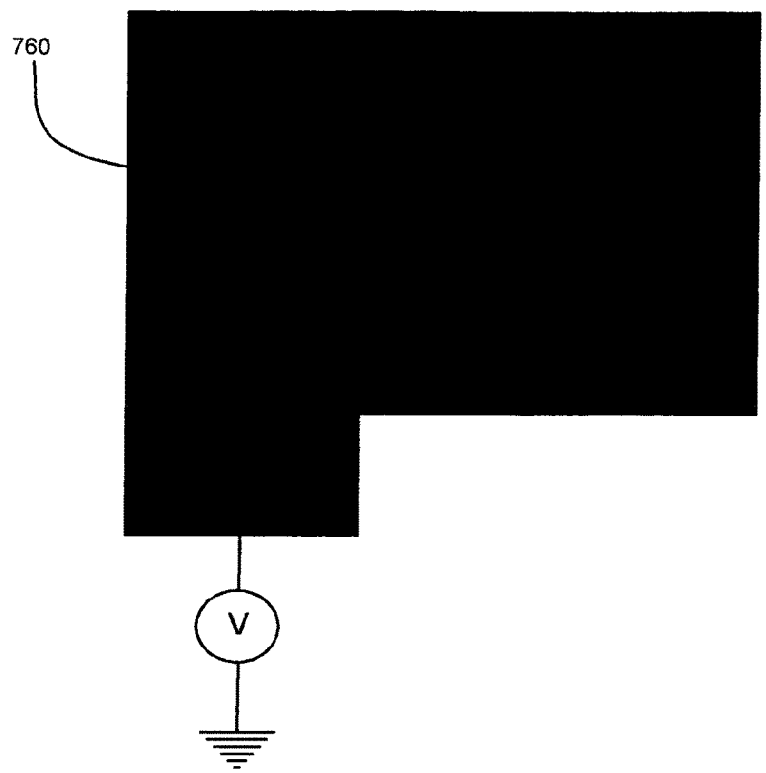
FIG. 49 illustrates an example of a patterned electrode for controlling light propagating through a waveguide, in accordance with an embodiment of the present invention.

FIG. 49 illustrates another example of an electrode 760 for controlling the propagation of light through a waveguide, in accordance with one embodiment of the present invention. In this embodiment, the electrode includes predominantly rectangular components. Such an electrode may be utilized for controlling the total optical path delay of light passing through the waveguide. For example, the total number of optical wavelengths contained within a laser cavity may be altered with such an electrode. In other words, the total optical path length of the cavity may be adjusted, in a manner that is completely free of moving components.

Figure 50:
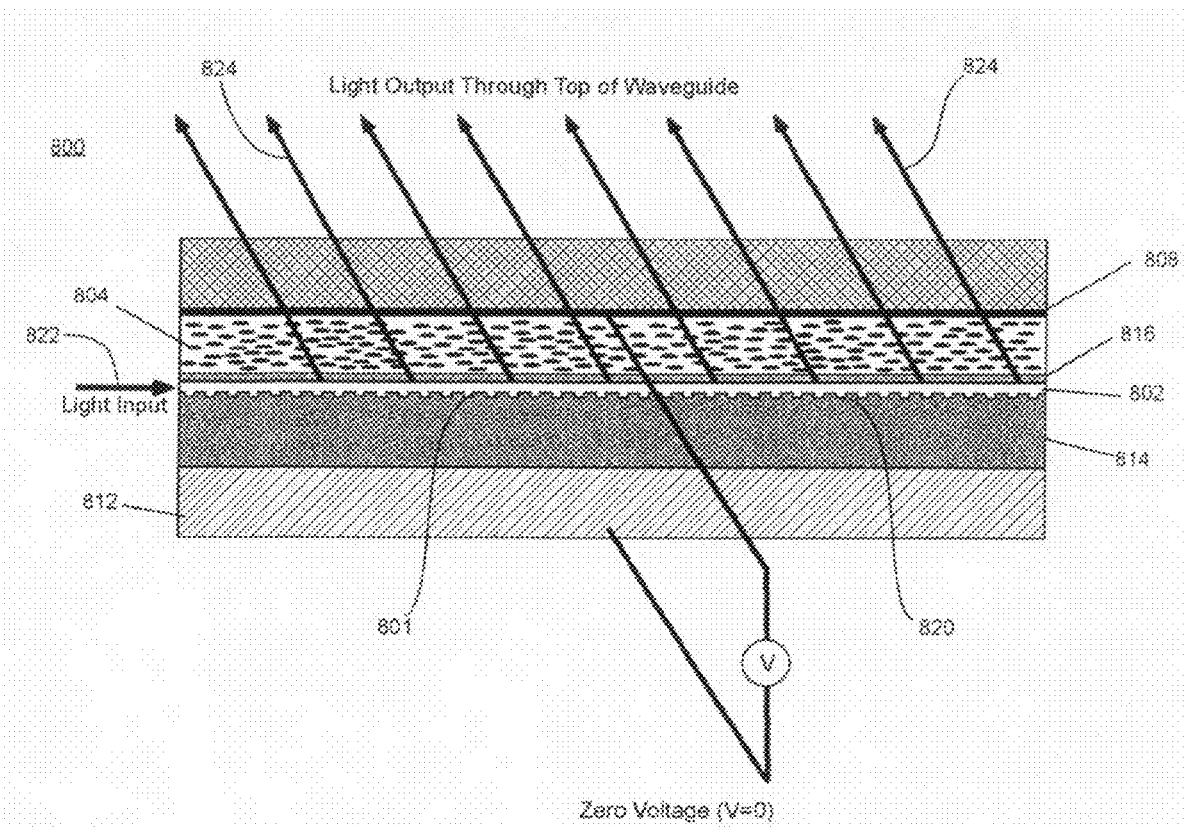
FIG. 50 illustrates a sectional view of the waveguide with the electrode of FIG. 49, when no voltage is applied to the electrode, in accordance with one embodiment of the present invention.
Figure 51:
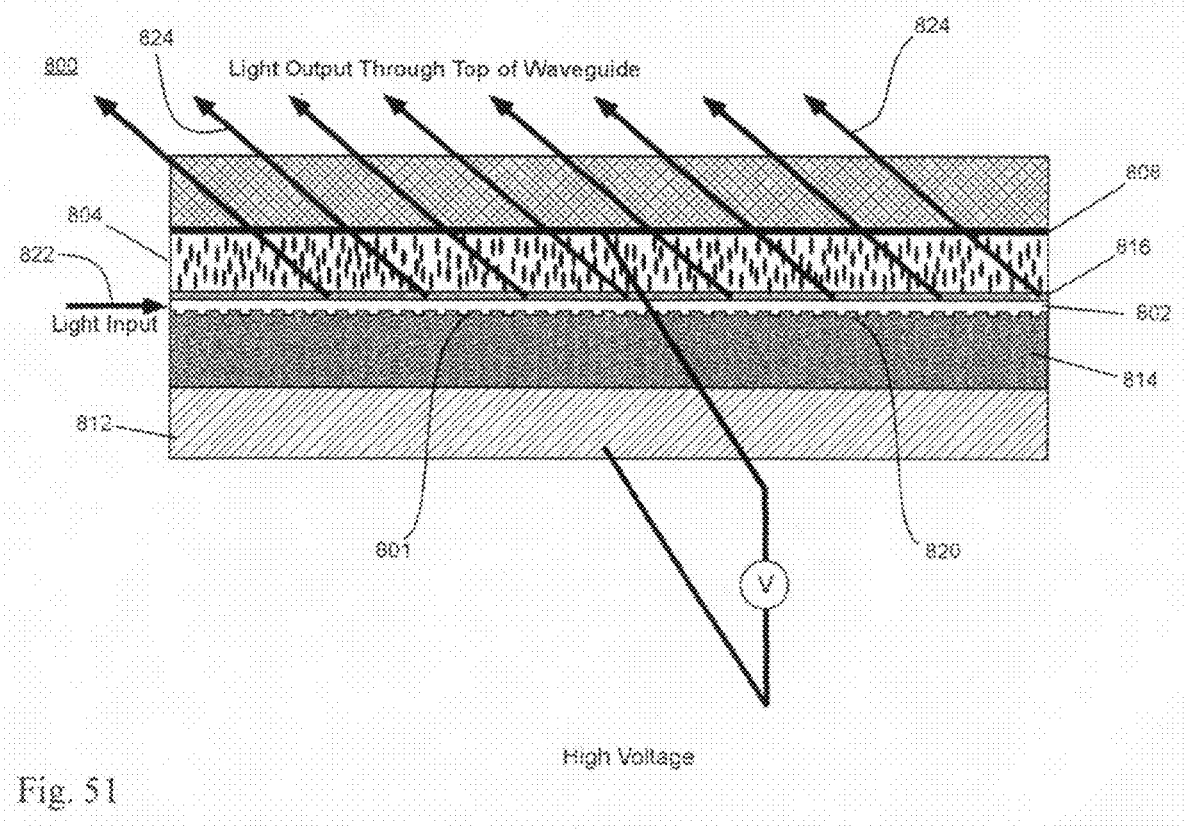
FIG. 51 illustrates a sectional view of the waveguide with the electrode of FIG. 49, when a voltage is applied to the electrode so as to change the orientation of the liquid crystal material under the electrode, in accordance with one embodiment of the present invention.

A waveguide may be formed utilizing any of the structures previously discussed, wherein an out-coupling grating is included in the waveguide. Out-coupling gratings can be constructed by deliberately creating a periodic variation in the index of refraction within a waveguide. This may be done, for example, by providing a core layer with periodic variations in its thickness, as is shown in FIGS. 50-51. Alternatively, either the core or one of the claddings may be constructed so as to have a periodically varying index of refraction (e.g., the core layer may be doped with materials having different indexes of refraction. The spacing or pitch between index variations may be chosen so that light will be directed out of the waveguide. In one example, the angle at which the light is out-coupled, (e.g., the angle of propagation of the light that leaves the waveguide) is dependent in part on the pitch or spacing of the out-coupling grating. As recognized by the present inventors, by dynamically changing this pitch, a waveguide can be formed so that the angle at which the light leaves the waveguide can be dynamically changed.

In one example, an out-coupling grating can be combined with an electrode of FIG. 49 to control the angle at which light leaves a waveguide. For example, in FIGS. 50-51, a waveguide 800 may include an out-coupling grating 801 formed by a core 802 having a periodically varying thickness. A cladding 804 having liquid crystal material and a predominantly rectangular electrode 808 may be placed on top of the cladding 804. A lower substrate 812 provides both structural support for the waveguide 800 and the electrical ground for all voltages applied between the connection points and the substrate 812. The sub-cladding 814 (e.g., lower cladding), core 802, liquid crystal upper cladding 804, and alignment layers 816 can be constructed as discussed previously.

In order to construct an out-coupling grating 801, in one example a pattern of grooves 820 can be created in the lower cladding 814 prior to application or formation of the core layer 802. This groove pattern 820 may be constructed with photo-lithographic techniques. After the core layer 802 is applied, a chemical-mechanical polishing step can be used to smooth out the top surface of the core layer 802. Also, the depth and spacing of the out-coupling grating can be tapered from one side (e.g., entrance) to the other (e.g., distal) of the waveguide 800. Such tapering techniques can be utilized to alter or condition the shape of the out-coupled light beam.

Light 822 is input into the waveguide 800, and the light output 824 leaves the waveguide 800 due to the out-coupling grating 801. The angle at which output light 824 leaves the waveguide 800 depends in part on the voltages V applied to the electrode 808.

Referring to FIG. 50, if no voltage is applied to the patterned electrode 808 (e.g., V=0), then the index of refraction for the liquid crystal material 806 underneath the electrode 808 will be uniform. The out-coupling grating 801 formed by the core 802 will then direct the light 824 out of the waveguide 800 at an angle that is determined by the pitch of the out-coupling grating 801. As shown in FIG. 50, this angle will be constant along the length of the grating 801. When light 822 first enters the core 802 with out-coupling region 801, it will begin to leave the waveguide 800 at an angle that is determined by the pitch of the grating 801 and the wavelength of the light. As the light 822 propagates along the length of the out-coupling grating 801, the light beam 824 will exit the waveguide 500 until all of the light 824 has been out-coupled or the out-coupling grating 801 ends.

Shown in FIG. 51 is the case where a high-voltage has been applied to electrode 800. In this case, the index of refraction of the liquid crystal material 806 in cladding 804 will be different than the index of refraction that corresponds to zero voltage in FIG. 50. The change in the index of refraction of the upper cladding 804 will alter the index of refraction for the guided light, as has been discussed previously, and change the effective pitch of the out-coupling grating 801. Since this pitch is effectively different, the angle at which light 824 exits or is out-coupled from the waveguide 800 will therefore also be different. In this way the angle at which light 824 exits the waveguide 800 may be controlled by controlling the voltage applied to the patterned electrode 808. In the example of FIGS. 50-51, the light 822 is assumed to be TM polarized, in which case higher voltage will direct the light 824 out of the waveguide 800 at a steeper angle relative to the waveguide normal. For lower voltage and TM polarized light, the output angle of light 824 with respect to the waveguide normal will be smaller. In this way, one may dynamically control the angle of light 824 leaving the waveguide 800 by controlling the magnitude of applied voltage.

ELECTRODE EXAMPLE ONE

Described below is one example of a liquid crystal waveguide in which the waveguide provides for an increased modulation index and therefore an increased control of optical path delay (OPD), and this is described as an example only. It is understood that this example is provided for illustrative purposes only, and does not limit the scope of embodiments of the present invention. In this example, a waveguide device may be formed utilizing a heavily p-doped silicon wafer, with both sides polished, as the lower electrode. Upon the p-doped silicon wafer, a thermally oxidized lower cladding can be grown with a thickness of approximately 2 microns. The lower cladding refractive index at a wavelength of 1550 nanometers was approximately 1.45. A SiOxNy guide layer or core was applied over the lower cladding by plasma enhanced chemical vapor deposition to a thickness of 651 nanometers. The ratio of Ox to Ny in SiOxNy was adjusted during the deposition process to create a core with a refractive index of approximately 1.9 at a wavelength of 633 nanometers. Identical coatings were applied to both sides of the wafer in order to balance stresses, and therefore mitigate warping or bending of the wafer. These stresses are a result of the plasma enhanced chemical vapor deposition process.

Once complete, the wafer was diced into smaller 10 millimeter by 25 millimeter parts. Each diced part was then coated with an alignment film. The alignment film was used to create the homogeneous orientation of the liquid crystal upper cladding. The film was produced by spin coating a solution of atatic polystyrene dissolved in toluene. The alignment layer applied to the lower side of the cover glass was produced by spin coating an 8:1 mixture of Nissan polyimide varnish solvent # 26 to Nissan polyimide type 1211 filtered at 0.2 microns at 2500 rpm. The cover plate was made of 0.7 millimeter thick 1737 corning float glass coated on one side with an indium tin oxide (ITO) film to produce the 100 ohms/square conductive layer used for the upper electrode.

Once the cover glass was coated, the polyimide was imidized by baking in an oven at 200 degrees Celsius for approximately 1 hour. The polystyrene coating was baked for one hour at 100 degrees Celsius to remove any residual toluene. Both the polyimide coating and the polystyrene coating were mechanically buffed with a dense piled cloth to induce preferential alignment along the light wave propagation direction of the waveguide. For the polystyrene it is understood that the buffing direction is oriented 90 degrees with respect to the LC alignment direction. The liquid crystal upper cladding layer was formed by spacing the ground plane 1737 glass window from the diced wafer parts with 2-micron borosilicate glass spacers immersed in an ultra-violet curing adhesive Norland 68. Approximately 1-millimeter dots of the spacing mixture were placed at the four corners that created the cell gap for the liquid crystal to be disposed therein. The cover plate was attached to the rest of the waveguide so as to create an antiparallel alignment layer on the waveguide core. The cell gap was then exposed to 365 nanometer light until fully cured. Straight Norland 68 was used to backfill via capillary action the remaining exposed edges making up the cell gap. Two 1-millimeter openings were left, one on each opposite side on the edges 90 degrees to the buff direction. MLC-6621 liquid crystal, obtained from Merck Co., was then introduced to one of the two edge openings and allowed to fill the cell gap via capillary force. Once filled, the holes were plugged by using Norland UVS-91 visible-uv curing adhesive. Wires were then attached to the upper electrode and lower electrode using conductive epoxy.

In this example, operation of the waveguide included coupling light into the waveguide by means of a rutile prism. Equal amounts of TE and TM light were introduced into the TE0 and TM0 modes of the waveguide. Since the rutile prism is birefringent, the coupling angle for the two different polarizations is therefore different and this needed to be accounted for in the optical set up. Amplitude modulated 5 KHz squarewave drive voltages were applied to change the TM phase relationship to TE. To measure this change in phase relationship, a 45-degree polarizer was used to interfere the TE and TM light, which exited through an end facet of the waveguide.

Table 1 shows the modulation index, which is the difference between n2 and n1, as different voltages were applied to a waveguide made according to this example, with a wavelength of light of 1440 nm. The data were recorded in waves of optical path difference between the TE and TM polarized light. The applied voltage modulated only the TM light. The TE light was not affected. As the OPD between TE and TM light went from one half to one wave the interference pattern created by the 45 degree polarizer went from a minimum to a maximum. By counting minima and or maxima the total OPD in waves of 1440 nm light was measured. Multiplying the OPD in waves by the wavelength in microns provides the OPD in microns. This is shown in the right hand column of Table I. The interaction length was 10 mm, and therefore the modulation index could be calculated ($\Delta n$=OPD/interaction length). This is shown in the middle column of Table I.

TABLE I

OPD as a function of Voltage

| Volts (RMS) | Modulation Index($\Delta n$) | OPD (microns) |
| --- | --- | --- |
| 3.75 | 0.000140 | 1.440 |
| 6.25 | 0.001728 | 17.28 |
| 7.75 | 0.002736 | 27.36 |
| 8.00 | 0.002880 | 28.8 |
| 10.3 | 0.004464 | 44.64 |
| 12.8 | 0.006192 | 61.92 |
| 17.5 | 0.008928 | 89.28 |
| 19.5 | 0.009936 | 99.36 |
| 24.8 | 0.0122 | 122.4 |
| 29.5 | 0.0140 | 139.7 |
| 45.0 | 0.0176 | 175.7 |
| 59.0 | 0.0194 | 194.4 |
| 78.0 | 0.0212 | 211.7 |
| 98.0 | 0.0222 | 221.8 |
| 118 | 0.0229 | 229.0 |
| 135 | 0.0233 | 233.3 |
| 185 | 0.0239 | 239.0 |
| 289 | 0.0243 | 243.4 |

ELECTRODE EXAMPLE TWO

Described below is one example of a liquid crystal waveguide in which the waveguide was designed to provide for approximately 28.7 degrees in beam steering, and this is described as an example only. It is understood that this example is provided for illustrative purposes only, and does not limit the scope of embodiments of the present invention. In one example, a waveguide beam steering device may be formed utilizing a heavily p-doped silicon wafer, with both sides polished, as the lower electrode. Upon the p-doped silicon wafer, a thermally oxidized lower cladding can be grown with a thickness of 2.16±0.05 microns. The lower cladding refractive index at a wavelength of 633 nanometers was 1.458±0.001 as measured by a broadband ellipsometer. A stoichiometric $Si_3N_4$ guide layer or core was applied over the lower cladding by low-pressure chemical vapor deposition to a thickness of 314±1 nanometers. The Si3N4 was deposited to create a core with a refractive index of 2.010±0.005 at a wavelength of 633 nanometers. The p-doped silicon wafer with the applied coating was then chemically and mechanically polished to create an average surface roughness of 4±0.8 angstroms while creating a final core thickness of 286±1 nanometers. Identical coatings were applied to both sides of the wafer in order to balance stresses, and therefore mitigate warping or bending of the wafer. These stresses are a result of the low-pressure chemical vapor deposition process.

In this example, a pair of upper electrodes were formed wherein each electrode had a plurality of refractive prism-like shapes in series, such as shown in FIG. 18. In particular for each electrode, ten (10) triangle elements were designed using an index modulation of 0.02, 125-micron beam waist, and a constant triangle base size. Each electrode was etched into the cover plate by standard photolithographic techniques.

Specifically, standard masking and chemical etching techniques were used to pattern the ITO on the glass cover plate.

Table 2 below shows the coordinates of a 20-micron wide line of demarcation defining the space between the triangular shaped electrodes for this example (see also FIG. 34).

TABLE 2

Dimensions of 2 Electrodes

| X Dimension Microns | Y Dimension Microns |
|---|---|
| 0 | 250 |
| 1000 | −261 |
| 2000 | 294 |
| 3000 | −350 |
| 4000 | 428 |
| 5000 | −528 |
| 6000 | 650 |
| 7000 | −794 |
| 8000 | 961 |
| 9000 | −1150 |
| 10000 | 1361 |
| 11000 | −1594 |
| 12000 | 1849 |
| 13000 | −2127 |
| 14000 | 2426 |
| 15000 | −2748 |
| 16000 | 3092 |
| 17000 | −3458 |
| 18000 | 3847 |
| 19000 | −4257 |
| 20000 | 4690 |

The wafer (having a conductive substrate, lower cladding, and core) was diced into smaller 20 millimeter by 40 millimeter parts. Each diced part was then coated with an alignment film approximately 120 angstroms in thickness. The alignment film was used to create the homeogeneous orientation of the liquid crystal upper cladding. The film was produced by spin coating an 8:1 mixture of Nissan polyimide varnish solvent # 21 to Nissan polyimide type 2170 filtered at 0.2 microns at 3000 revolutions per minute.

The same spin coating process was performed on the cover plate (having the two upper electrodes). The glass cover was made of 1.1 millimeter thick 1737 corning glass coated on one side with an indium tin oxide (ITO) film to produce the 100 ohms/square conductive layer used for the upper electrodes.

Once both the wafer (with the lower cladding and core) and the cover glass (with the two upper electrodes) were coated, the polyimide coatings were imidized by baking in an oven at 200 degrees Celsius for approximately 1 hour. The polyimide coatings were mechanically buffed with a dense piled cloth to induce preferential alignment along the light wave propagation direction of the waveguide.

The cell, into which the liquid crystal upper cladding may be contained, was formed by spacing the cover plate (e.g., 1737 glass window) from the diced wafer parts with 5-micron borosilicate glass spacers immersed in a ultra-violet curing adhesive Norland 68. On the bottom side of the coverplate is the patterned electrode, in this example. Approximately 500-micron dots of the spacing mixture were placed at the four corners of the wafer (having the lower cladding and core) to create the cell gap for the liquid crystal to be disposed therein. The cover plate was attached to the wafer so as to create an anti-parallel alignment layer on the waveguide core and positioned such that the cover plate distal edge corresponding to the beam steerer output was aligned over the distal output edge of the waveguide. The cell gap was then exposed to 365 nanometer light until fully cured. Straight Norland 68 was used to backfill, via capillary action, the remaining exposed edges making up the cell gap. Two 3-millimeter openings were left, one on each opposite side on the edges 90 degrees to the buff direction. MLC-6621 liquid crystal, obtained from EMD Chemicals, Inc., was then introduced to one of the two edge openings and allowed to fill the cell gap via capillary force. Once filled, the holes were plugged by using Norland UVS-91 visible-uv curing adhesive. Once fully cured the output edge of the assembled device was polished utilizing diamond impregnated polishing pads supplied by Ultratec Manufacturing, and the final polish was performed using 0.2 micron diamond.

Operation of the waveguide included coupling 780 nanometer light into the waveguide by means of a gadolinium garnet GGG 30-60-90 prism. TM light was introduced into the TM0 mode of the waveguide.

A simple switching circuit was used to selectively apply a voltage to electrode 1 or electrode 2 (see FIG. 34 and Table 3). Amplitude modulated 6 KHz square-wave drive voltages were applied to the selected electrode to change the index of refraction of the region of the waveguide under the selected electrode, To measure the beam deflection change as a function of applied voltage, a silicon CCD video camera was used to visually map the scattered propagation streak within the waveguide. The experimental results are shown in Table 3.

TABLE 3

| Voltage Electrode #1 (RMS Volts) | Voltage Electrode #2 (RMS Volts) | Deviation Angle (Deg) |
|---|---|---|
| 0 | 0 | 0 |
| 22 | 0 | 3.8 |
| 26 | 0 | 4.7 |
| 46 | 0 | 7 |
| 93 | 0 | 9.2 |
| 139 | 0 | 11.6 |
| 190 | 0 | 13 |
| 230 | 0 | 13.5 |
| 274 | 0 | 13.5 |
| 363 | 0 | 13.7 |
| 0 | 0 | 0 |
| 0 | 22 | −3.4 |
| 0 | 26 | −6.4 |
| 0 | 46 | −6.9 |
| 0 | 93 | −9.1 |
| 0 | 139 | −10 |
| 0 | 190 | −14.1 |
| 0 | 230 | −14.8 |
| 0 | 274 | −14.8 |
| 0 | 363 | −15 |

As shown in Table 3, approximately 28.7 total degrees of steering was achieved in this example with an applied voltage of 363 volts RMS. For a voltage of 22 volts RMS, 7.2 total degrees of steering were realized.

Embodiments of the present invention may experience swapping of energy between the fundamental TE and TM waveguide modes at a particular value of applied voltage. As stated previously, for liquid-crystal molecular alignment parallel to the propagation direction of light, the effective index for TM polarized light decreases as a voltage is applied and the effective index of TE polarized light is unchanged. It is possible, for certain waveguide designs, that at a particular value of the voltage the effective indices of TM and TE polarized light will become equal. In this case the two modes are phase matched and energy can swap from the TM mode into the TE mode and visa versa. For devices with molecules orthogonal to the light propagation vector, the TE index increases as the TM index decreases and phase matching at a particular voltage can also occur. In many applications it may be desired to avoid such TE and TM mode crossings.

In one example, TM/TE crossings may be avoided by increasing the index of the guide layer. For planar optical waveguides with isotropic claddings, the index for TE polarized light is preferably greater than the index for TM polarized light. Furthermore, an increase of the index of the guide layer increases the separation between the indices for TE and TM polarized light. When the separation between the indices for TE and TM polarized light becomes substantially large compared to index modulation of the LC waveguide Δn, then TE and TM crossings are avoided.

An example of an LC waveguide without TE and TM crossings is an LC waveguide with the guide layer replaced with a 0.58 micron layer of silicon nitride prepared by plasma-enhanced chemical vapor deposition. The refractive index of silicon nitride at a wavelength of 1.32 microns is about 2.0. Other suitable guide layers include stoichiometric silicon nitride prepared by low-pressure chemical vapor deposition and tantalum pentoxide. A device of this design, with the LC molecules aligned perpendicular to the propagation vector, was shown to exhibit a tunable birefringence (the difference between the TE index and the TM index) of 0.035 at a wavelength of 1.32 microns, with no evidence of TE and TM crossings. The modulation indices of TM and TE polarized light were approximately 0.02 and 0.015, respectively.

In some examples, nematic liquid crystals may be driven with a voltage source with a very low DC component, such as an AC square wave. The fast response of the liquid-crystal molecules in proximity to the guide layer can lead to temporal transients in the modulation index of the LC waveguide during the finite transition times of the square wave. In some examples transients in the modulation index may not be desired. Since the fastest response times for the LC molecules can be associated with strong molecular restoring forces and high operational voltages, one example of how to reduce the transients is to reduce the operational voltage. In Table 2, the transients operate in time scales of several 10s of microseconds for operational voltages above 50 Vrms. For many applications it is also desirable to reduce the operational voltages in order to simplify the driving electronics.

One example that may reduce the operational voltage is to reduce the polar anchoring energy of the liquid-crystal molecules to the alignment layer. Alignment layers that produce homeotropic alignment have lower polar anchoring energies than for buffed polyimides that produce planar alignment. In the electrode example given above, approximately 70% of the total device stroke occurred below 50 Vrms. Other LC alignment methods known to have lower polar anchoring energies than buffed polyimide include photo-aligned polyimides and polymers, angle-deposited SiO and SiO2, non-polar polymers, and the use of surfactant-modified liquid crystals.

A second method to reduce transients in the modulation index may be to increase the frequency of the voltage source. The use of driving frequencies above 20 kHz at 50 Vrms often is aided by the use of liquid crystal materials with very low conductivity or a large voltage-holding ratio. The liquid crystal MBBA exhibits a low conductivity as do superfluorinated liquid-crystal materials.

By combining the effects of reduced polar anchoring energy with a high drive frequency, transients in the modulation index can generally be reduced to a desired or negligible level.

A way of achieving pure TE modulation is to use smectic A* liquid-crystal materials exhibiting the electroclinic effect. These materials rotate about an axis containing the electric field vector giving pure TE modulation and leaving TM polarized light unaffected. This configuration has the benefits of low DC voltages, and completely eliminates any possibility of transients in the modulation index. However, the modulation index may be less because the directors typically switch less than 90°. Smectic A materials also tend to have more restricted temperature ranges than nematic materials and their development is less mature.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

It should be appreciated that reference throughout this specification to "one embodiment" or "an embodiment" or "one example" or "an example" means that a particular feature, structure or characteristic described in connection with the embodiment may be included, if desired, in at least one embodiment of the present invention. Therefore, it should be appreciated that two or more references to "an embodiment" or "one embodiment" or "an alternative embodiment" or "one example" or "an example" in various portions of this specification are not necessarily all referring to the same embodiment. Furthermore, the particular features, structures or characteristics may be combined as desired in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed inventions require more features than are expressly recited in each claim. Rather, as the following claims reflect, inventive aspects lie in less than all features of a single foregoing disclosed embodiment, and each embodiment described herein may contain more than one inventive feature.

While the invention has been particularly shown and described with reference to various embodiments thereof, it will be understood by those skilled in the art that various other changes in the form and details may be made without departing from the spirit and scope of the invention.

The invention claimed is:

1. A tunable laser for providing a laser beam characterized by a wavelength, the tunable laser defining a laser cavity, the tunable laser comprising:
   a gain medium for generating the laser beam;
   a substantially planar waveguide for processing the laser beam, the waveguide having a substantially planar core and at least one cladding, the at least one cladding having liquid crystal material disposed therein;
   an optical path length control element disposed within said waveguide for controlling an effective optical path length of the laser cavity, wherein the optical path length control element includes an electrode for receiving a first voltage for controlling the effective optical path length of the laser cavity, the electrode positioned adjacent the cladding in the waveguide, wherein as the first voltage is applied to the electrode, the electrode induces an electric field on the liquid crystal material proximate the electrode to alter the effective optical path length of the laser cavity; and a wavelength selective element for controlling the wavelength of the laser beam.

2. The tunable laser of claim 1, wherein the gain medium is a laser diode.

3. The tunable laser of claim 1, wherein the electrode has a generally rectangular portion.

4. The tunable laser of claim 1, wherein the electrode is formed using a conductive layer.

5. The tunable laser of claim 1, wherein the wavelength selective element includes an electrode disposed within said waveguide for receiving a second voltage for controlling the wavelength of the laser beam.

6. The tunable laser of claim 5, wherein the electrode of the wavelength selective element is positioned adjacent the cladding in the waveguide and when the second voltage is applied to the electrode, the electrode induces an electric field on the liquid crystal material proximate the electrode to steer the laser beam.

7. The tunable iaser of claim 1, wherein the waveguide has a front and rear facet, the tunable laser further comprising:

a diffraction grating coupled with a rear facet of the waveguide.

8. The tunable laser of claim 7, wherein the wavelength selective element controls an angle at which the laser beam strikes the diffraction grating.

9. The tunable laser of claim 8, wherein the tunable laser is configured as a Littrow-type external cavity diode laser.

10. The tunable laser of claim 5, wherein the first and second voltages are adjusted synchronously in order to provide mode-hop free tuning.

11. The tunable laser of claim 1, wherein the wavelength selective element has a non-normal interface.

12. The tunable laser of claim 1, further comprising coupling optics positioned between the gain medium and the waveguide.

* * * * *